(12) United States Patent
Tanaka et al.

(10) Patent No.: US 11,719,573 B2
(45) Date of Patent: Aug. 8, 2023

(54) DETECTION DEVICE

(71) Applicant: Japan Display Inc., Tokyo (JP)

(72) Inventors: Hitoshi Tanaka, Tokyo (JP); Masahiro Tada, Tokyo (JP); Takashi Nakamura, Tokyo (JP); Hiroshi Mizuhashi, Tokyo (JP); Fumitaka Gotoh, Tokyo (JP); Hirofumi Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 436 days.

(21) Appl. No.: 17/010,413

(22) Filed: Sep. 2, 2020

(65) Prior Publication Data

US 2020/0400491 A1 Dec. 24, 2020

Related U.S. Application Data

(63) Continuation of application No. PCT/JP2019/004113, filed on Feb. 5, 2019.

(30) Foreign Application Priority Data

Mar. 7, 2018 (JP) ................................. 2018-040560

(51) Int. Cl.
*G01J 1/44* (2006.01)
*H03K 17/693* (2006.01)
(Continued)

(52) U.S. Cl.
CPC .................. *G01J 1/44* (2013.01); *G01K 7/16* (2013.01); *H03K 17/6872* (2013.01);
(Continued)

(58) Field of Classification Search
CPC .............................. G01J 1/44; H03K 17/693
See application file for complete search history.

(56) References Cited

U.S. PATENT DOCUMENTS

2006/0131566 A1 6/2006 Liu et al.
2006/0262055 A1 11/2006 Takahara
(Continued)

FOREIGN PATENT DOCUMENTS

JP 2007102154 A 4/2007
JP 2008525962 A 7/2008
(Continued)

OTHER PUBLICATIONS

Chinese Office Action dated Apr. 8, 2022 in corresponding Chinese Application No. 201980016555.6.
(Continued)

*Primary Examiner* — Thanh Luu
(74) *Attorney, Agent, or Firm* — K&L Gates LLP

(57) ABSTRACT

Provided are a substrate, an organic material layer provided above the substrate at a position overlapping at least a detection region, a plurality of detection electrodes provided between the substrate and the organic material layer in a direction orthogonal to the substrate, a first switching element provided to each of the detection electrodes, a plurality of gate lines coupled with some first switching elements and extending in a first direction, a plurality of signal lines coupled with some first switching elements and extending in a second direction intersecting the first direction, and a drive circuit configured to supply gate drive signals having potentials determined for the respective gate lines based on a predetermined code to the respective first switching elements through the gate lines.

15 Claims, 37 Drawing Sheets

(51) Int. Cl.
*G01K 7/16* (2006.01)
*H03K 17/687* (2006.01)
*H03K 19/20* (2006.01)
*H01L 29/786* (2006.01)

(52) U.S. Cl.
CPC .......... *H03K 17/693* (2013.01); *H03K 19/20* (2013.01); *H01L 29/78633* (2013.01); *H01L 29/78675* (2013.01)

(56) References Cited

U.S. PATENT DOCUMENTS

2011/0284721 A1   11/2011  Iwabuchi et al.
2017/0128033 A1*  5/2017  Ofuji .................... A61B 6/4233

FOREIGN PATENT DOCUMENTS

JP       2011243894 A    12/2011
JP       2015233169 A    12/2015

OTHER PUBLICATIONS

International Search Report for Application No. PCT/JP2019/004113, dated May 7, 2019.

* cited by examiner

FIG.13

| DURA-TION | ta1 | | | | | | | ta2 | | | | | | | ta3 | | | | | | |
|---|---|---|---|---|---|---|---|---|---|---|---|---|---|---|---|---|---|---|---|---|---|
| GCL(1) | VGH | | | | | | | VGH | | | | | | | VGL | | | | | | |
| GCL(2) | VGH | | | | | | | VGL | | | | | | | VGH | | | | | | |
| GCL(3) | VGH | | | | | | | VGH | | | | | | | VGL | | | | | | |
| GCL(4) | VGH | | | | | | | VGL | | | | | | | VGH | | | | | | |
| DURA-TION | tb1 | tb2 | tb3 | tb4 | tb5 | tb6 | tb7 | tb1 | tb2 | tb3 | tb4 | tb5 | tb6 | tb7 | tb1 | tb2 | tb3 | tb4 | tb5 | tb6 | tb7 |
| SGL(1) | AFE | AFE | VR | AFE | VR | AFE | VR | AFE | VR | AFE | AFE | VR | AFE | AFE | AFE | AFE | VR | AFE | VR | AFE | VR |
| SGL(2) | AFE | VR | AFE | AFE | VR | VR | AFE | AFE | AFE | VR | AFE | VR | VR | AFE | AFE | VR | VR | AFE | VR | AFE | AFE |
| SGL(3) | AFE | AFE | AFE | VR | AFE | VR | VR | AFE | VR | VR | VR | AFE | AFE | AFE | AFE | VR | AFE | VR | AFE | VR | AFE |
| SGL(4) | AFE | VR | VR | VR | AFE | AFE | AFE | AFE | VR | AFE | VR | AFE | AFE | VR | AFE | AFE | AFE | VR | AFE | AFE | VR |

FIG. 14

| DURATION | ta4 | | | | ta5 | | | | ta6 | | | | ta7 | | | |
|---|---|---|---|---|---|---|---|---|---|---|---|---|---|---|---|---|
| GCL(1) | VGH | | | | VGL | | | | | | | | | | | |
| GCL(2) | VGH | | | | | | | | VGH | | | | | | | |
| GCL(3) | VGL | | | | VGH | | | | VGL | | | | VGH | | | |
| GCL(4) | VGL | | | | VGH | | | | VGH | | | | VGL | | | |

| DURATION | tb1 | tb2 | tb3 | tb4 | tb5 | tb6 | tb7 | tb1 | tb2 | tb3 | tb4 | tb5 | tb6 | tb7 | tb1 | tb2 | tb3 | tb4 | tb5 | tb6 | tb7 | tb1 | tb2 | tb3 | tb4 | tb5 | tb6 | tb7 |
|---|---|---|---|---|---|---|---|---|---|---|---|---|---|---|---|---|---|---|---|---|---|---|---|---|---|---|---|---|
| SGL(1) | AFE | AFE | VR | AFE | VR | VR | VR | AFE | AFE | VR | AFE | VR | AFE | VR | AFE | AFE | VR | AFE | VR | AFE | VR | AFE | AFE | VR | AFE | VR | AFE | VR |
| SGL(2) | AFE | VR | AFE | AFE | VR | VR | VR | AFE | AFE | AFE | AFE | VR | VR | AFE | AFE | AFE | AFE | AFE | VR | VR | AFE | AFE | AFE | AFE | VR | VR | VR | AFE |
| SGL(3) | AFE | AFE | VR | VR | AFE | AFE | VR | AFE | VR | VR | VR | AFE | AFE | VR | AFE | VR | VR | VR | AFE | AFE | VR | AFE | VR | AFE | VR | AFE | VR | AFE |
| SGL(4) | AFE | AFE | AFE | VR | AFE | AFE | VR | AFE | AFE | AFE | VR | AFE | AFE | VR | AFE | AFE | AFE | VR | AFE | AFE | VR | AFE | VR | AFE | VR | AFE | AFE | VR |

FIG.19

| DURA-TION | Va3 | Va2 | Va1 | Vdd | Vd1 | Vd2 | Vd3 | Vd4 | Vd5 | Vd6 | Vd7 | Vd8 |
|---|---|---|---|---|---|---|---|---|---|---|---|---|
| tc1 | 0 | 0 | 0 | 1 | 1 | 1 | 1 | 1 | 1 | 1 | 1 | 1 |
| tc2 | 1 | 0 | 0 | 1 | 1 | 1 | 1 | 1 | 0 | 0 | 0 | 0 |
| tc3 | 0 | 1 | 0 | 1 | 1 | 1 | 0 | 0 | 1 | 1 | 0 | 0 |
| tc4 | 1 | 1 | 0 | 1 | 1 | 1 | 0 | 0 | 0 | 0 | 1 | 1 |
| tc5 | 0 | 0 | 1 | 1 | 1 | 0 | 1 | 0 | 1 | 0 | 1 | 0 |
| tc6 | 1 | 0 | 1 | 1 | 1 | 0 | 1 | 0 | 0 | 1 | 0 | 1 |
| tc7 | 0 | 1 | 1 | 1 | 1 | 0 | 0 | 1 | 1 | 0 | 0 | 1 |
| tc8 | 1 | 1 | 1 | 1 | 1 | 0 | 0 | 1 | 0 | 1 | 1 | 0 |

| DURA-TION | Vs | Vb3 | Vb2 | Vb1 | Vf1 | Vf2 | Vf3 | Vf4 | Vf5 | Vf6 | Vf7 | Vf8 |
|---|---|---|---|---|---|---|---|---|---|---|---|---|
| td1 | 0 | 0 | 0 | 0 | 1 | 1 | 1 | 1 | 1 | 1 | 1 | 1 |
| td2 | 1 | 0 | 0 | 0 | 0 | 0 | 0 | 0 | 0 | 0 | 0 | 0 |
| td3 | 0 | 1 | 0 | 0 | 1 | 1 | 1 | 1 | 0 | 0 | 0 | 0 |
| td4 | 1 | 1 | 0 | 0 | 0 | 0 | 0 | 0 | 1 | 1 | 1 | 1 |
| td5 | 0 | 0 | 1 | 0 | 1 | 1 | 0 | 0 | 1 | 1 | 0 | 0 |
| td6 | 1 | 0 | 1 | 0 | 0 | 0 | 1 | 1 | 0 | 0 | 1 | 1 |
| td7 | 0 | 1 | 1 | 0 | 1 | 1 | 0 | 0 | 0 | 0 | 1 | 1 |
| td8 | 1 | 1 | 1 | 0 | 0 | 0 | 1 | 1 | 1 | 1 | 0 | 0 |
| td9 | 0 | 0 | 0 | 1 | 1 | 0 | 1 | 0 | 1 | 0 | 1 | 0 |
| td10 | 1 | 0 | 0 | 1 | 0 | 1 | 0 | 1 | 0 | 1 | 0 | 1 |
| td11 | 0 | 1 | 0 | 1 | 1 | 0 | 1 | 0 | 0 | 1 | 0 | 1 |
| td12 | 1 | 1 | 0 | 1 | 0 | 1 | 0 | 1 | 1 | 0 | 1 | 0 |
| td13 | 0 | 0 | 1 | 1 | 1 | 0 | 0 | 1 | 1 | 0 | 0 | 1 |
| td14 | 1 | 0 | 1 | 1 | 0 | 1 | 1 | 0 | 0 | 1 | 1 | 0 |
| td15 | 0 | 1 | 1 | 1 | 1 | 0 | 0 | 1 | 0 | 1 | 1 | 0 |
| td16 | 1 | 1 | 1 | 1 | 0 | 1 | 1 | 0 | 1 | 0 | 0 | 1 |

| DURA-TION | DURA-TION | Va3 | Va2 | Va1 | VDD | Vs | Vb3 | Vb2 | Vb1 |
|---|---|---|---|---|---|---|---|---|---|
| tc1 | tb1 | 0 | 0 | 0 | 1 | 0 | 0 | 0 | 0 |
| | td2 | 0 | 0 | 0 | 1 | 1 | 0 | 0 | 0 |
| | td3 | 0 | 0 | 0 | 1 | 0 | 1 | 0 | 0 |
| | td4 | 0 | 0 | 0 | 1 | 1 | 1 | 0 | 0 |
| | td5 | 0 | 0 | 0 | 1 | 0 | 0 | 1 | 0 |
| | td6 | 0 | 0 | 0 | 1 | 1 | 0 | 1 | 0 |
| | td7 | 0 | 0 | 0 | 1 | 0 | 1 | 1 | 0 |
| | td8 | 0 | 0 | 0 | 1 | 1 | 1 | 1 | 0 |
| | td9 | 0 | 0 | 0 | 1 | 0 | 0 | 0 | 1 |
| | td10 | 0 | 0 | 0 | 1 | 1 | 0 | 0 | 1 |
| | td11 | 0 | 0 | 0 | 1 | 0 | 1 | 0 | 1 |
| | td12 | 0 | 0 | 0 | 1 | 1 | 1 | 0 | 1 |
| | td13 | 0 | 0 | 0 | 1 | 0 | 0 | 1 | 1 |
| | td14 | 0 | 0 | 0 | 1 | 1 | 0 | 1 | 1 |
| | td15 | 0 | 0 | 0 | 1 | 0 | 1 | 1 | 1 |
| | td16 | 0 | 0 | 0 | 1 | 1 | 1 | 1 | 1 |
| tc2 | td1 | 1 | 0 | 0 | 1 | 0 | 0 | 0 | 0 |
| | td2 | 1 | 0 | 0 | 1 | 1 | 0 | 0 | 0 |
| | td3 | 1 | 0 | 0 | 1 | 0 | 1 | 0 | 0 |
| | td4 | 1 | 0 | 0 | 1 | 1 | 1 | 0 | 0 |
| | td5 | 1 | 0 | 0 | 1 | 0 | 0 | 1 | 0 |
| | td6 | 1 | 0 | 0 | 1 | 1 | 0 | 1 | 0 |
| | td7 | 1 | 0 | 0 | 1 | 0 | 1 | 1 | 0 |
| | td8 | 1 | 0 | 0 | 1 | 1 | 1 | 1 | 0 |
| | td9 | 1 | 0 | 0 | 1 | 0 | 0 | 0 | 1 |
| | td10 | 1 | 0 | 0 | 1 | 1 | 0 | 0 | 1 |
| | td11 | 1 | 0 | 0 | 1 | 0 | 1 | 0 | 1 |
| | td12 | 1 | 0 | 0 | 1 | 1 | 1 | 0 | 1 |
| | td13 | 1 | 0 | 0 | 1 | 0 | 0 | 1 | 1 |
| | td14 | 1 | 0 | 0 | 1 | 1 | 0 | 1 | 1 |
| | td15 | 1 | 0 | 0 | 1 | 0 | 1 | 1 | 1 |
| | td16 | 1 | 0 | 0 | 1 | 1 | 1 | 1 | 1 |
| ⋮ | ⋮ | ⋮ | ⋮ | ⋮ | ⋮ | ⋮ | ⋮ | ⋮ | ⋮ |
| tc8 | td16 | 1 | 1 | 1 | 1 | 1 | 1 | 1 | 1 |

DETECTION DEVICE

CROSS-REFERENCE TO RELATED APPLICATION

This application is a continuation of PCT international application Ser. No. PCT/JP2019/004113 filed on Feb. 5, 2019, incorporated herein by reference, and which claims the benefit of priority from Japanese Patent Application No. 2018-040560, filed on Mar. 7, 2018, incorporated herein by reference.

BACKGROUND

1. Technical Field

The present disclosure relates to a detection device.

2. Description of the Related Art

In a recently known detection device, a plurality of sensors containing organic material are provided on a flexible substrate (refer to Japanese Laid-open Patent Publication (Translation of PCT Application) No. 2008-525962, for example). With such a sensor, a signal output from the detection electrode changes with, for example, the light quantity of light incident on the organic material or a predetermined physical quantity such as temperature.

In a sensor containing organic material, change in an output signal in response to input light, heat, or the like is small in some cases. In such a case, the area of each sensor needs to be increased, which makes it difficult to achieve high definition. In addition, it is difficult to separate output signals from a plurality of sensors in some cases when change in each output signal is small.

The present disclosure is intended to provide a detection device that can achieve improved detection performance.

SUMMARY

A detection device according to one embodiment of the present disclosure includes a substrate, an organic material layer provided above the substrate at a position overlapping at least a detection region, a plurality of detection electrodes provided between the substrate and the organic material layer in a direction orthogonal to the substrate, a first switching element provided to each of the detection electrodes, a plurality of gate lines coupled with the first switching elements and extending in a first direction; a plurality of signal lines coupled with the first switching elements and extending in a second direction intersecting the first direction, and a drive circuit configured to supply gate drive signals having potentials determined for the respective gate lines based on a predetermined code to the respective first switching elements through the gate lines.

BRIEF DESCRIPTION OF THE DRAWINGS

FIG. 13 is a table illustrating exemplary detection operation by the gate line drive circuit and the signal line selection circuit in first to third durations.

FIG. 14 is a table indicating exemplary detection operation by the gate line drive circuit and the signal line selection circuit in fourth to seventh durations.

FIG. 19 is a table indicating the relation between a first control signal and a first partial selection signal.

FIG. 23 is a diagram illustrating an exemplary pattern code generated by the third code generation circuit when the inverted control signal has a high-level voltage.

FIG. 24 is a diagram illustrating an exemplary pattern code generated by the third code generation circuit when the inverted control signal has a low-level voltage.

FIG. 25 is a table indicating the relation among a first control signal, a second control signal, and an inverted control signal.

DETAILED DESCRIPTION

Modes (embodiments) for carrying out the present invention will be described below in detail with reference to the accompanying drawings. The present invention is not limited by the contents of the following description of the embodiments. Components described below include those easily thought of by the skilled person in the art and those identical in effect. Moreover, configurations described below may be combined as appropriate. The disclosure is merely exemplary, and any modification that can be easily thought of by the skilled person in the art as appropriate without departing from the gist of the invention is included in the scope of the present invention. For further clarity of description, each drawing schematically illustrates the width, thickness, shape, and the like of each component as compared to those in the actual configuration in some cases, but the illustration is merely exemplary and does not limit interpretation of the present invention. In the present specification and the drawings, any element similar to that described with reference to a drawing already described is denoted by an identical reference sign, and detailed description thereof is omitted as appropriate in some cases.

First Embodiment

Figure 1:
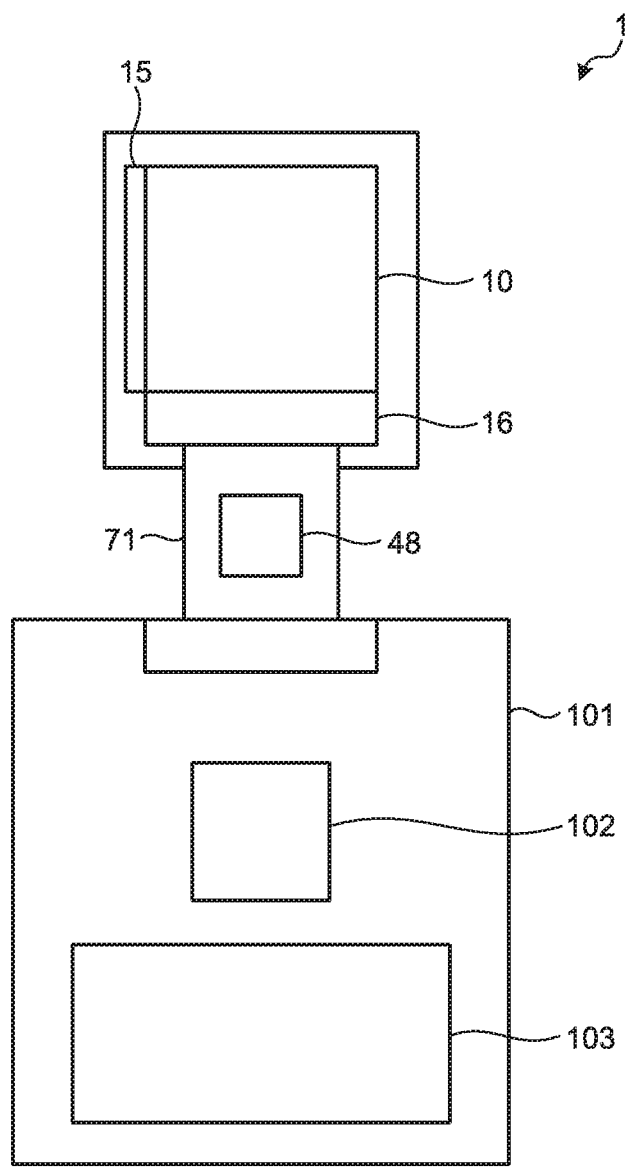
FIG. 1 is a plan view illustrating a detection device according to a first embodiment.
Figure 2:
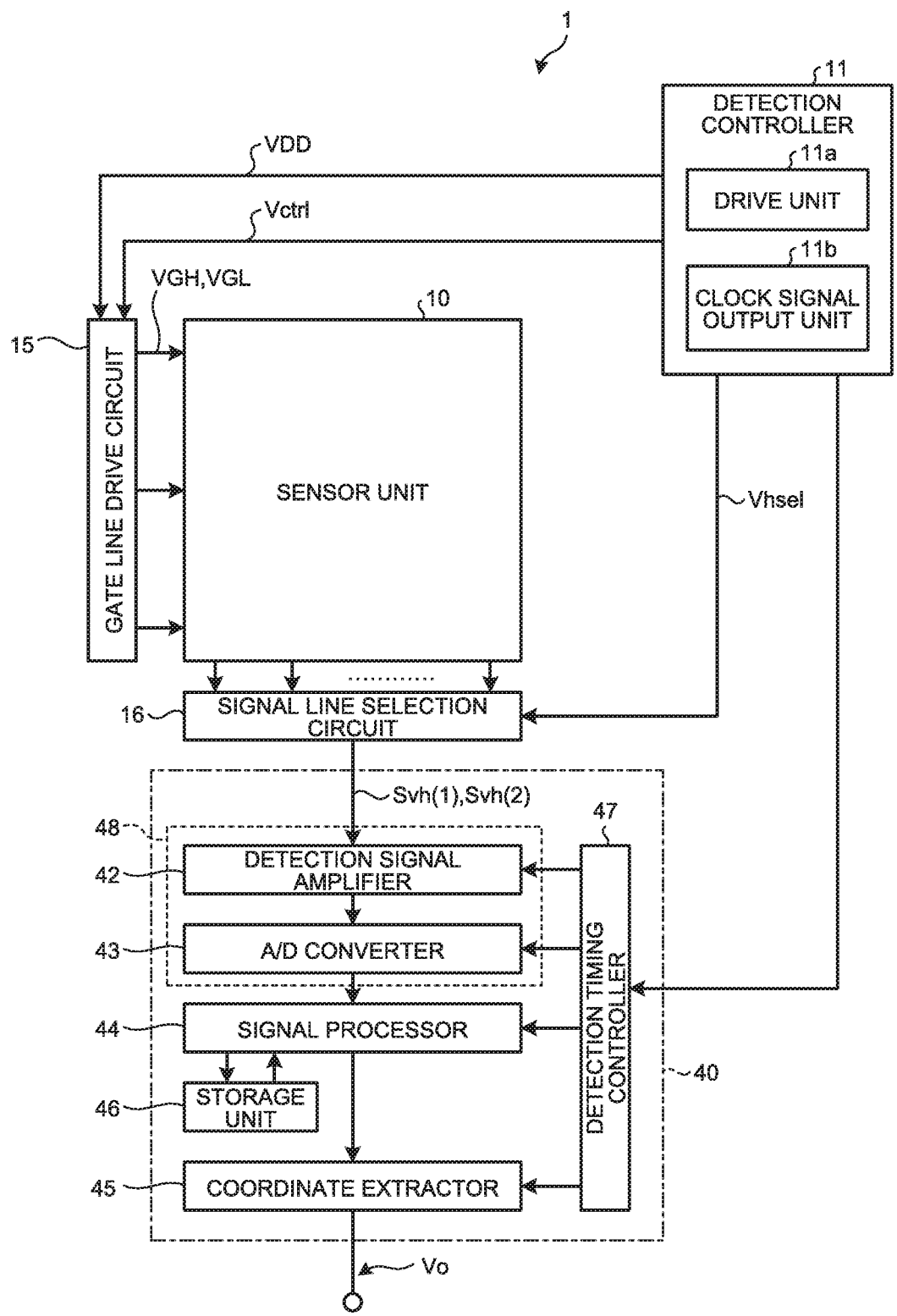
FIG. 2 is a block diagram illustrating an exemplary configuration of the detection device according to the first embodiment.

FIG. 1 is a plan view illustrating a detection device according to a first embodiment. FIG. 2 is a block diagram illustrating an exemplary configuration of the detection device according to the first embodiment. As illustrated in FIGS. 1 and 2, this detection device 1 includes a sensor unit 10, a gate line drive circuit 15, and a signal line selection circuit 16.

As illustrated in FIG. 1, the sensor unit 10 is electrically coupled with a control substrate 101 through a flexible print substrate 71. The flexible print substrate 71 is provided with an analog front-end circuit (hereinafter referred to as an analog front end (AFE)) 48. The control substrate 101 is provided with a control circuit 102 and a power circuit 103. The control circuit 102 is, for example, a field programmable gate array (FPGA). The control circuit 102 controls detection operation by supplying control signals to the sensor unit 10, the gate line drive circuit 15, and the signal line selection circuit 16. The power circuit 103 supplies a voltage signal such as a power voltage VDD to the sensor unit 10 and the gate line drive circuit 15.

As illustrated in FIG. 2, the detection device 1 further includes a detection controller 11 and a detector 40. Some or all functions of the detection controller 11 are included in the control circuit 102. Some or all functions of the detector 40 other than the AFE 48 are included in the control circuit 102.

Figure 5:
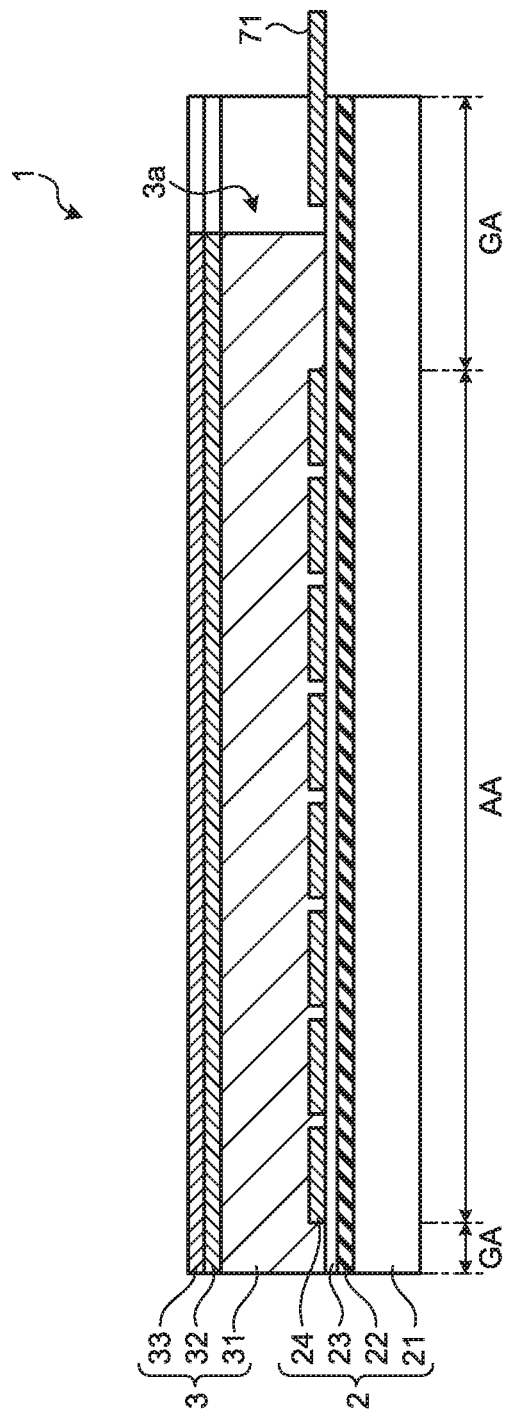
FIG. 5 is a cross-sectional view taken along Line V-V in FIGS. 3 and 4.

The sensor unit 10 is an optical sensor including an organic material layer 31 (refer to FIG. 5). Characteristics (for example, a voltage-current characteristic and a resistance value) of the organic material layer 31 included in the sensor unit 10 change in accordance with incident light. The sensor unit 10 outputs a signal in accordance with the light quantity of incident light to the signal line selection circuit 16. The sensor unit 10 performs detection by code division selection drive (hereinafter referred to as a code division multiplexing (CDM) drive) in accordance with a first gate drive signal VGH and a second gate drive signal VGL supplied from the gate line drive circuit 15. Specifically, a plurality of detection electrodes 24 (refer to FIG. 5) are simultaneously selected through operation of the gate line drive circuit 15.

The detection controller 11 is a circuit configured to control operation of the gate line drive circuit 15, the signal line selection circuit 16, and the detector 40 by supplying control signals to these components. The detection controller 11 includes a drive unit 11a and a clock signal output unit 11b. The drive unit 11a supplies the power voltage VDD to the gate line drive circuit 15. The detection controller 11 supplies various kinds of control signals Vctrl to the gate line drive circuit 15 based on a clock signal from the clock signal output unit 11b.

The gate line drive circuit 15 is a circuit configured to simultaneously select a plurality of gate lines GCL (refer to FIG. 7) based on the various kinds of control signals Vctrl. The gate line drive circuit 15 supplies the first gate drive signal VGH or the second gate drive signal VGL to the selected gate lines GCL. Accordingly, the gate line drive circuit 15 selects the detection electrodes 24 coupled with the gate lines GCL. The sensor unit 10 can achieve CDM drive by differentiating the state of selection of the detection electrodes 24 through the gate line drive circuit 15.

Figure 7:
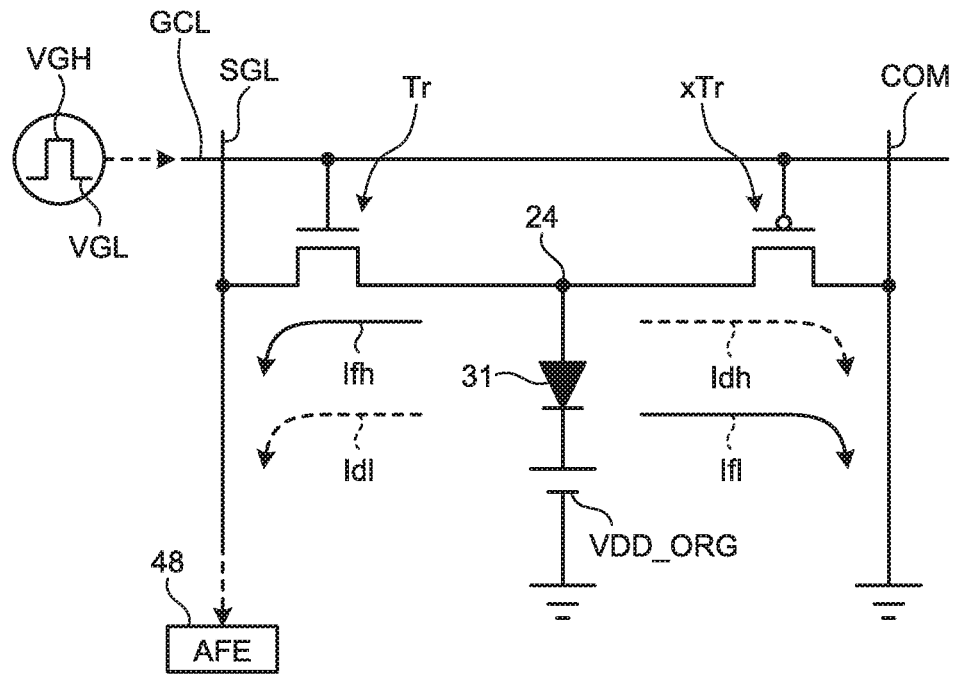
FIG. 7 is a circuit diagram illustrating a drive circuit of one detection electrode.

The signal line selection circuit 16 is a switch circuit configured to simultaneously select a plurality of signal lines SGL (refer to FIG. 7). The signal line selection circuit 16 performs CDM drive based on a signal line selection signal Vhsel supplied from the detection controller 11. Accordingly, the signal line selection circuit 16 selects the detection electrodes 24 coupled with the signal lines SGL. The signal line selection circuit 16 outputs a first output signal Svh(1) and a second output signal Svh(2) to the detector 40. The first output signal Svh(1) and the second output signal Svh(2) are each an integrated signal of detection signals from the selected detection electrodes 24.

The detector 40 is a circuit configured to detect a predetermined physical quantity based on the control signals supplied from the detection controller 11, the first output signal Svh(1), and the second output signal Svh(2) in CDM drive. The detector 40 includes the AFE 48, a signal processor 44, a coordinate extractor 45, a storage unit 46, and a detection timing controller 47. The detection timing controller 47 controls the AFE 48, the signal processor 44, and the coordinate extractor 45 to operate in synchronization based on the control signals supplied from the detection controller 11. In the following description, the first output signal Svh(1) and the second output signal Svh(2) are simply referred to as output signals Svh when not needed to be distinguished from each other.

The AFE 48 is a signal processing circuit having at least functions of a detection signal amplifier 42 and an A/D converter 43. The detection signal amplifier 42 amplifies the output signal Svh. The A/D converter 43 converts an analog signal output from the detection signal amplifier 42 into a digital signal.

The signal processor 44 is a logic circuit configured to detect, based on an output signal from the AFE 48, a predetermined physical quantity input to the sensor unit 10. The signal processor 44 receives the first output signal Svh(1) and the second output signal Svh(2) through the signal line selection circuit 16 and calculates a third output signal Svh(3). The signal processor 44 receives the calculated third output signal Svh(3) and performs decoding processing based on a predetermined code. The signal processor 44 may perform processing to extract a signal (absolute value |ΔV|) of the difference between decoding signals. The signal processor 44 can detect the quantity of light incident on the sensor unit 10 by comparing the absolute value |ΔV| with a predetermined threshold voltage.

The storage unit 46 temporarily stores the calculated third output signal Svh(3). The storage unit 46 may be, for example, a random access memory (RAM) or a register circuit.

The coordinate extractor 45 calculates sensor coordinates based on the signal of the difference between decoding signals and outputs the obtained sensor coordinates as a sensor output Vo. The coordinate extractor 45 may output the decoding signals as the sensor output Vo without calculating the sensor coordinates.

Figure 3:
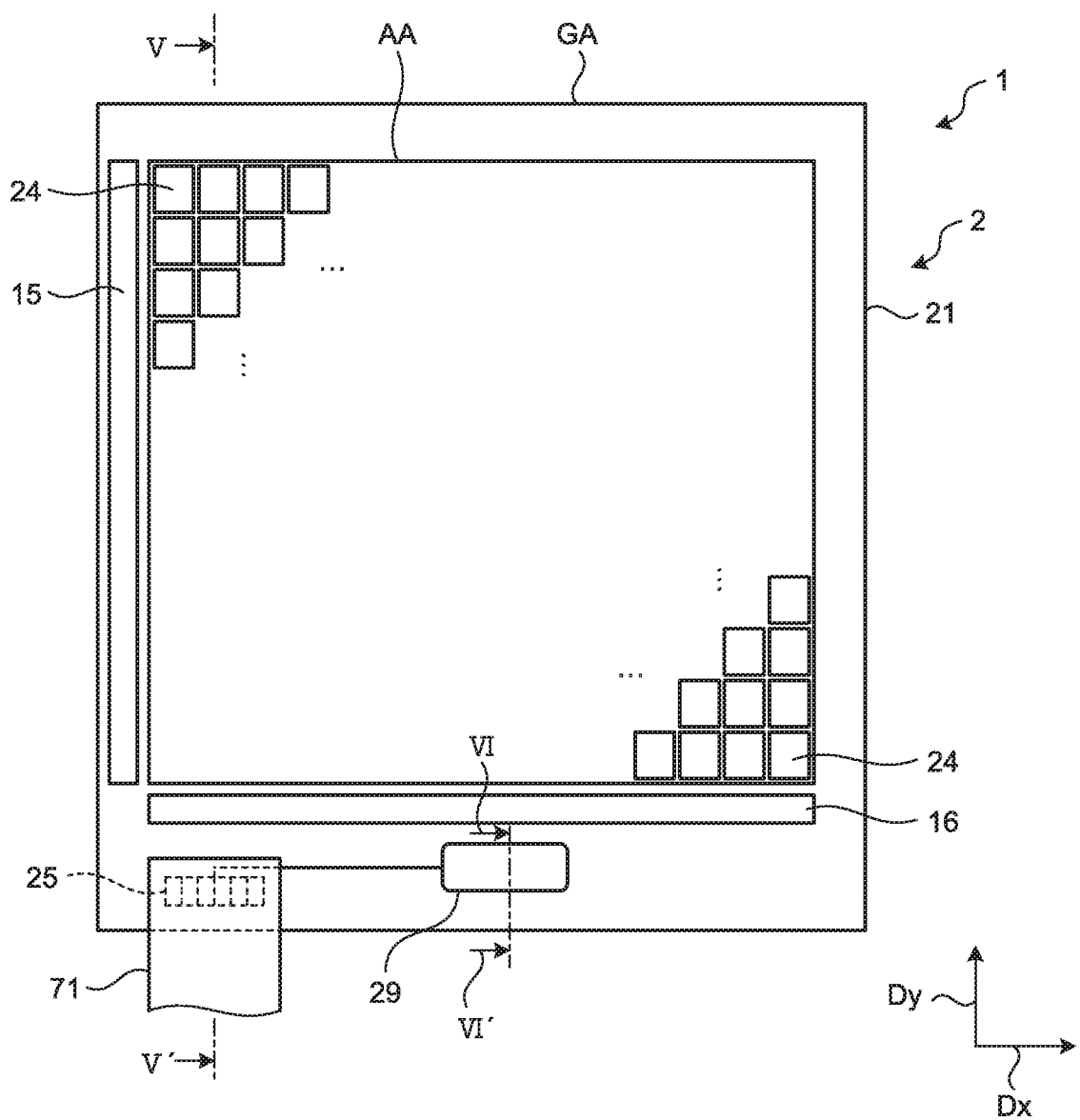
FIG. 3 is a plan view schematically illustrating a backplane included in the detection device.
Figure 4:
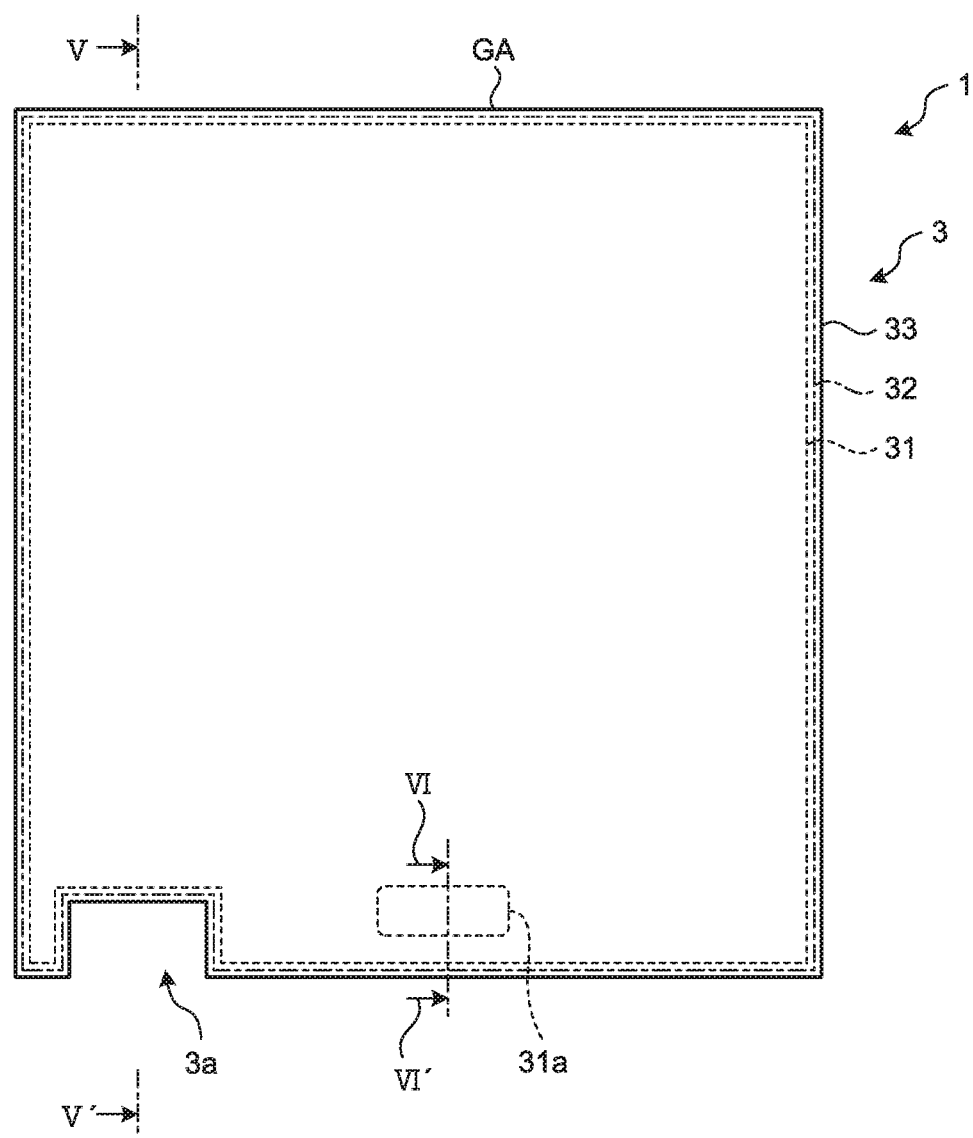
FIG. 4 is a plan view schematically illustrating an organic sensor layer included in the detection device.
Figure 6:
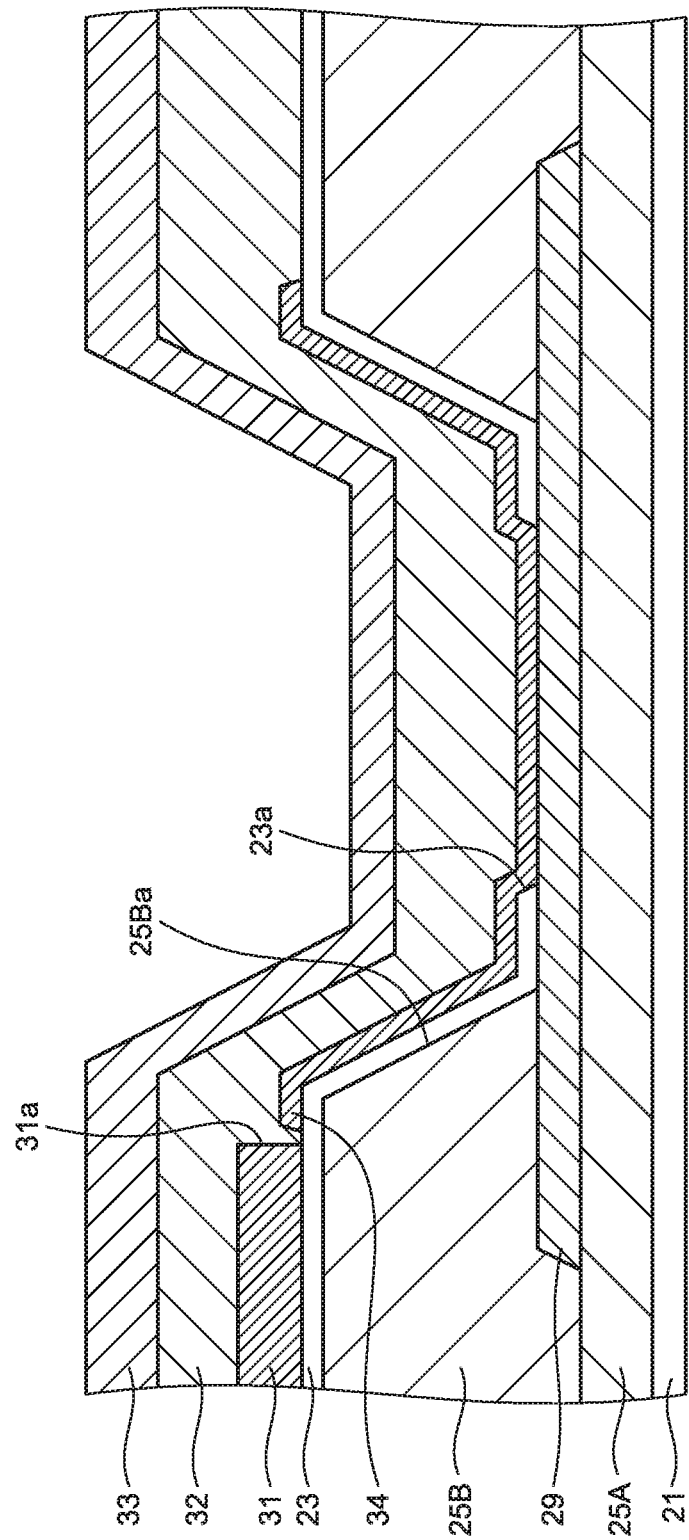
FIG. 6 is a cross-sectional view taken along Line VI-VI' in FIGS. 3 and 4.

Subsequently, a detailed configuration of the detection device 1 will be described below. FIG. 3 is a plan view schematically illustrating a backplane included in the detection device. FIG. 4 is a plan view schematically illustrating an organic sensor layer included in the detection device. FIG. 5 is a cross-sectional view taken along Line V-V' in FIGS. 3 and 4. FIG. 6 is a cross-sectional view taken along Line VI-VI' in FIGS. 3 and 4.

As illustrated in FIG. 5, the detection device 1 includes a backplane 2 and an organic sensor layer 3. The organic sensor layer 3 is disposed opposite to the backplane 2 in a direction orthogonal to the surface of the backplane 2. The backplane 2 is a drive circuit substrate configured to drive a sensor in each predetermined detection region.

The backplane 2 includes a substrate 21, a TFT layer 22, an insulating layer 23, and the detection electrodes 24. The substrate 21 is a translucent glass substrate through which visible light can transmit. Alternatively, the substrate 21 may be a translucent resin substrate or resin film made of resin such as polyimide. The TFT layer 22 is provided on the substrate 21. The TFT layer 22 is provided with circuits such as the gate line drive circuit 15 and the signal line selection circuit 16. The TFT layer 22 is also provided with a first switching element Tr and a second switching element xTr (refer to FIG. 10) such as thin film transistors (TFTs), and various wires such as the gate lines GCL and the signal lines SGL (refer to FIG. 10).

The detection electrodes 24 are arrayed in a matrix having a row-column configuration above the substrate 21. The detection electrodes 24 are provided between the substrate 21 and the organic material layer 31 of the organic sensor layer 3. The detection electrodes 24 are made of, for example, a translucent conductive material such as indium tin oxide (ITO). The insulating layer 23 is provided between the array of the detection electrodes 24 and the TFT layer 22. The insulating layer 23 is an inorganic insulating layer. The insulating layer 23 is made of, for example, oxide such as oxide silicon ($SiO_2$) or nitride such as silicon nitride (SiN). The flexible print substrate 71 is coupled with a frame region GA of the substrate 21. The detection electrodes 24 are electrically coupled with the flexible print substrate 71 through the signal lines SGL and the signal line selection circuit 16.

In description of the detection device 1, an "up direction" is defined to be the direction from the substrate 21 toward the organic sensor layer 3 along the direction orthogonal to the surface of the substrate 21. A "down direction" is defined to be the direction from the organic sensor layer 3 toward the substrate 21. A "plan view" illustrates a view in the direction orthogonal to the surface of the substrate 21.

The organic sensor layer 3 includes the organic material layer 31, a drive electrode 32, and a protective layer 33. The organic material layer 31 is provided on the detection electrodes 24. The organic material layer 31 is made of organic material having characteristics (for example, a voltage-current characteristic and a resistance value) that change in accordance with incident light. The organic material layer 31 may be made of, for example, $C_{60}$ (fullerene), PCBM (phenyl-C61-butyric acid methyl ester), CuPc (copper phthalocyanine), $F_{16}$CuPc (fluorinated copper phthalocyanine), rubrene (5,6,11,12-tetraphenyltetracene), or PDI (perylene derivative), which are low-molecular organic materials. The organic material layer 31 can be formed through evaporation coating (dry process) by using these low-molecular organic materials. In this case, the organic material layer 31 may be, for example, a multilayer film of CuPc and $F_{16}$CuPc or a multilayer film of rubrene and $C_{60}$. The organic material layer 31 can be formed through application (wet process). In this case, the organic material layer 31 is made of a combination of an above-described low-molecular organic material and a polymer organic material. The polymer organic material is, for example, P3HT (poly (3-hexylthiophene)) or F8BT (F8-alt-benzothiadiazole). The organic material layer 31 may be a film of P3HT and PCBM in mixture or a film of F8BT and PDI in mixture.

The drive electrode 32 is provided opposite to the detection electrodes 24 through the organic material layer 31 in the direction orthogonal to the surface of the substrate 21. The organic material layer 31 is provided between the drive electrode 32 and the detection electrode 24. The drive electrode 32 contacts the upper surface of the organic material layer 31, and the detection electrode 24 contacts the lower surface of the organic material layer 31. The drive electrode 32 is made of, for example, a metallic material such as silver (Ag) or aluminum (Al). Alternatively, the drive electrode 32 may be made of an alloy material containing at least one of these metallic materials. The protective layer 33 is provided to cover the drive electrode 32. The protective layer 33 is a passivation film provided to protect the drive electrode 32 and the organic material layer 31.

As illustrated in FIG. 3, the detection electrodes 24 are provided in a matrix having a row-column configuration in a detection region AA of the substrate 21. In other words, the detection electrodes 24 are arrayed in a first direction Dx and a second direction Dy. The detection region AA is a region in which detection by the detection device 1 is performed. The frame region GA is a region outside the detection region AA.

Figure 10:
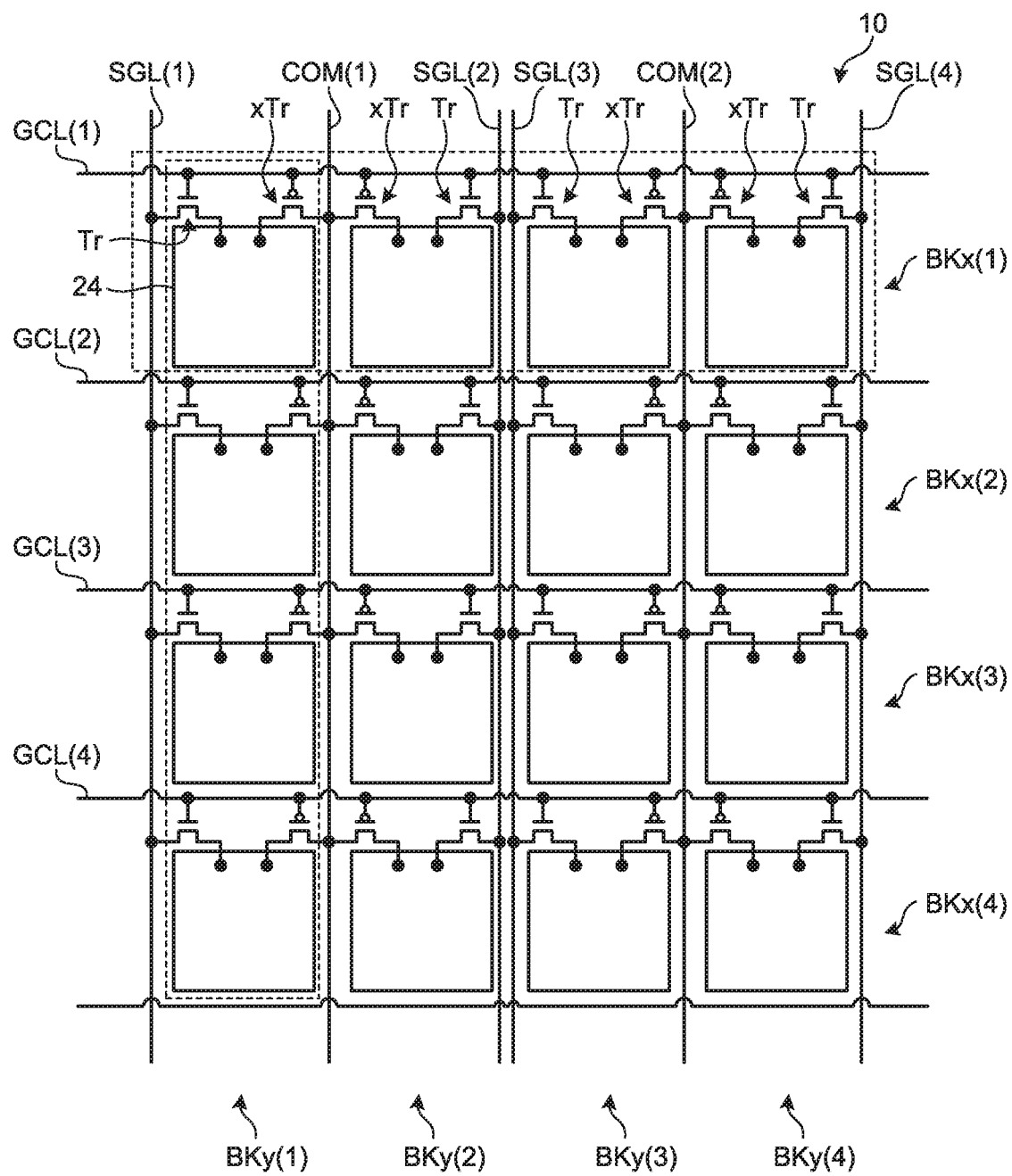
FIG. 10 is a circuit diagram illustrating an array of detection electrodes.

The first direction Dx is an in-plane direction parallel to the substrate 21, for example, a direction parallel to the gate lines GCL (refer to FIG. 10). The second direction Dy is another in-plane direction parallel to the substrate 21 and is orthogonal to the first direction Dx. The second direction Dy may intersect the first direction Dx instead of being orthogonal to the first direction Dx.

Various circuits such as the gate line drive circuit 15 and the signal line selection circuit 16 are provided in the frame region GA of the substrate 21. The gate line drive circuit 15 is provided to a side of the frame region GA extending in the second direction Dy. The signal line selection circuit 16 is provided to a side of the frame region GA extending in the first direction Dx. The signal line selection circuit 16 is provided between the detection region AA and the flexible print substrate 71.

In addition, a plurality of terminals 25 and a drive electrode coupling terminal 29 are provided in the frame region GA of the substrate 21. The flexible print substrate 71 is coupled with the terminals 25. The drive electrode coupling terminal 29 is a terminal for supplying a drive signal VDD_ORG (refer to FIG. 15) to the drive electrode 32. The drive electrode coupling terminal 29 is coupled with the flexible print substrate 71. Accordingly, the drive electrode coupling terminal 29 is supplied with the drive signal VDD_ORG from the control substrate 101 (refer to FIG. 1).

As illustrated in FIG. 4, the organic material layer 31, the drive electrode 32, and the protective layer 33 extend to the outer periphery of the frame region GA and overlap each other. In other words, the organic material layer 31 and the drive electrode 32 are provided in a region overlapping at least the detection region AA illustrated in FIG. 3. Accordingly, the organic material layer 31 and the drive electrode 32 are provided across the detection electrodes 24 and have parts overlapping the detection electrodes 24 and parts not overlapping the detection electrodes 24. The organic material layer 31 is formed through application by, for example, ink jet printing. In the present embodiment, the organic material layer 31 is made of a high resistance material, and the interval between adjacent detection electrodes 24 is sufficiently larger than the thickness of the organic material layer 31. With this configuration, current flows between each detection electrode 24 and the drive electrode 32 in the up-down direction but is prevented from flowing between adjacent detection electrodes 24. Accordingly, each detection electrode 24 functions as an individual sensor.

A recess 3a that is recessed inward is provided on the outer periphery of the organic material layer 31, the drive electrode 32, and the protective layer 33. The recess 3a is provided at a position overlapping the terminals 25. Accordingly, the terminals 25 are exposed from the organic material layer 31, the drive electrode 32, and the protective layer 33 and coupled with the flexible print substrate 71.

An opening 31a is provided to the organic material layer 31 at a position overlapping the drive electrode coupling terminal 29. As illustrated in FIG. 6, the drive electrode coupling terminal 29 is provided on the substrate 21 through an insulating layer 25A. The drive electrode coupling terminal 29 is provided in a layer in which the signal lines SGL are provided. A hard coat layer 25B and the insulating layer 23 are provided on the insulating layer 25A. The hard coat layer 25B and the insulating layer 23 are provided with openings 25Ba and 23a, respectively, at positions overlapping the drive electrode coupling terminal 29. The opening 31a of the organic material layer 31 is provided at a position overlapping the openings 25Ba and 23a.

A coupling electrode 34 is provided at a position overlapping the opening 31a of the organic material layer 31. Accordingly, the coupling electrode 34 contacts the drive electrode coupling terminal 29. The drive electrode 32 and the protective layer 33 are provided also at positions overlapping the opening 31a. With such a configuration, the drive electrode 32 is electrically coupled with the drive electrode coupling terminal 29 through the opening 31a. The drive electrode 32 is supplied with the drive signal VDD_ORG from the control substrate 101 (refer to FIG. 1) through the flexible print substrate 71 and the drive electrode coupling terminal 29.

Figure 8:
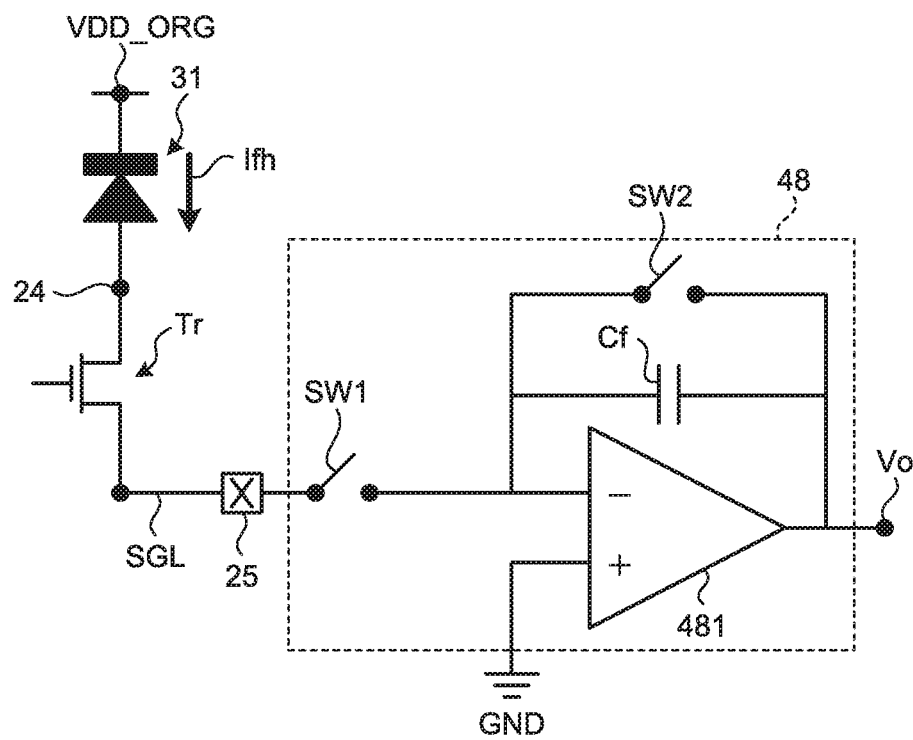
FIG. 8 is a circuit diagram illustrating an AFE.
Figure 9:
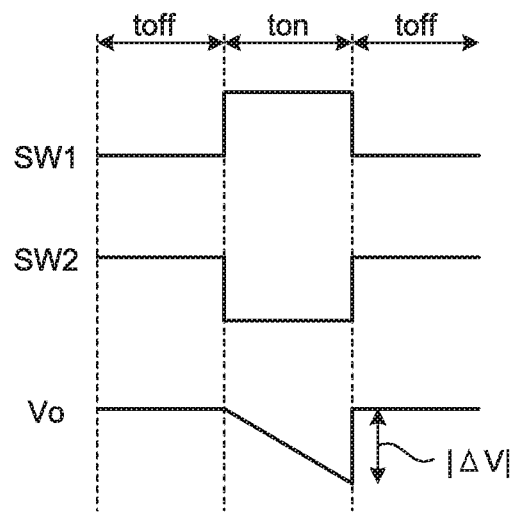
FIG. 9 is a timing waveform diagram illustrating exemplary operation of the AFE.

Subsequently, detection operation of the detection device 1 will be described below. FIG. 7 is a circuit diagram illustrating a drive circuit of one detection electrode. FIG. 8 is a circuit diagram illustrating the AFE. FIG. 9 is a timing waveform diagram illustrating exemplary operation of the AFE.

As illustrated in FIG. 7, the detection electrode 24, the first switching element Tr, the second switching element xTr, and wires such as a signal line SGL, a gate line GCL, and a reference signal line COM are formed in the backplane 2 (refer to FIG. 5). The first switching element Tr and the second switching element xTr are provided for each detection electrode 24. The signal line SGL is a wire through which a detection signal from the detection electrode 24 is output to the AFE 48 through the signal line selection circuit 16 (refer to FIG. 3). The gate line GCL is a wire through which the first gate drive signal VGH and the second gate drive signal VGL for driving the first switching element Tr and the second switching element xTr are supplied. The reference signal line COM is a wire through which a reference signal Vcom (refer to FIG. 15) is supplied to the detection electrode 24.

The first switching element Tr is achieved by a thin film transistor, and in this example, achieved by an n-channel metal-oxide-semiconductor (MOS) TFT. The second switching element xTr is achieved by a p-channel MOS TFT in this example. Accordingly, when supplied with the same first gate drive signal VGH, the first switching element Tr is turned on and the second switching element xTr is turned off. When supplied with the same second gate drive signal VGL, the first switching element Tr is turned off and the second switching element xTr is turned on. The first gate drive signal VGH is a voltage signal having a potential higher than that of the second gate drive signal VGL.

In each detection electrode 24, the source of the first switching element Tr is coupled with the signal line SGL, the gate thereof is coupled with the gate line GCL, and the drain thereof is coupled with the detection electrode 24. The drain of the second switching element xTr is coupled with the reference signal line COM, the gate thereof is coupled with the gate line GCL, and the source thereof is coupled with the detection electrode 24. As illustrated in FIG. 7, the organic material layer 31 is equivalent to a diode element. In the present embodiment, the detection electrode 24 is an anode and the drive electrode 32 is a cathode.

When the first gate drive signal VGH is supplied to the gate line GCL by the gate line drive circuit 15, the first switching element Tr is turned on. The first switching element Tr couples the detection electrode 24 and the signal line SGL. Accordingly, the detection electrode 24 is selected as a detection target. When the drive signal VDD_ORG is supplied to the drive electrode 32, predetermined current Ifh flows to the organic material layer 31. The current Ifh changes with characteristic change of the organic material layer 31 in accordance with incident light. The detection electrode 24 outputs, to the signal line SGL as the output signal Svh, the current Ifh from the organic material layer 31. Simultaneously, the second switching element xTr is turned off by the first gate drive signal VGH. As a result, flowing of the current Idh from the detection electrode 24 to the reference signal line COM is prevented. In this manner, in the sensor unit 10, a signal (the current Ifh) output from the detection electrode 24 changes in accordance with the light quantity of light incident on the organic material layer 31. Accordingly, the detection device 1 can detect light.

When the second gate drive signal VGL is supplied to the gate line GCL by the gate line drive circuit 15, the first switching element Tr is turned off. Accordingly, flowing of the current Idl from the detection electrode 24 to the signal line SGL is prevented and the detection electrode 24 becomes a non-detection target. Simultaneously, the second switching element xTr is turned on. The second switching element xTr couples the detection electrode 24 and the reference signal line COM. As a result, a current Ifl flows from the detection electrode 24 to the reference signal line COM. The reference signal Vcom is supplied from the control substrate 101 to the reference signal line COM. The reference signal Vcom is a voltage signal having a fixed potential. The reference signal Vcom may have, for example, ground potential. This reduces variation in the potential of the detection electrode 24 as a non-detection target.

A semiconductor layer of each of the first switching element Tr and the second switching element xTr is made of polycrystalline silicon or oxide semiconductor. The semiconductor layer is made of, for example, low-temperature polycrystalline silicon (LTPS). The first switching element Tr and the second switching element xTr made of low-temperature polycrystalline silicon can be manufactured at a process temperature of 600° C. or lower. Thus, circuits such as the gate line drive circuit 15 and the signal line selection circuit 16 can be simultaneously formed on a substrate on which the first switching element Tr and the second switching element xTr are provided. The detection device 1 includes the first switching element Tr and the second switching element xTr. Thus, when one of the first switching element Tr and the second switching element xTr is turned on, the other is turned off, thereby preventing leakage current.

As illustrated in FIG. 8, the AFE 48 includes an amplifier 481, a capacitor Cf, a first switch SW1, and a second switch SW2. In FIG. 8, the second switching element xTr and the reference signal line COM are omitted from illustration. The first switch SW1 is a switch configured to control a detection timing based on a control signal from the detection controller 11 (refer to FIG. 2). The second switch SW2 is a switch configured to reset the AFE 48 based on a control signal from the detection controller 11 (refer to FIG. 2).

As illustrated in FIG. 8, the current Ifh flows from the detection electrode 24 to the signal line SGL. The AFE 48 converts variation in the current Ifh into variation in voltage. Then, the AFE 48 integrates a voltage value thus obtained and outputs a result of the integration as the sensor output Vo. The signal processor 44 (refer to FIG. 2) can detect the quantity of light incident on the sensor unit 10 by comparing the amplitude ($|\Delta V|$) of the output signal Svh with the predetermined threshold voltage.

As illustrated in FIG. 9, in a non-detection duration toff, the first switch SW1 is turned off and the AFE 48 is cut off from the signal line SGL. In the non-detection duration toff, the second switch SW2 is turned on. Accordingly, the AFE 48 is reset and the output signal Svh has a potential equal to a ground potential GND.

In a detection duration ton, the first switch SW1 is turned on and the AFE 48 is coupled with the signal line SGL. In the detection duration ton, the second switch SW2 is turned off. Accordingly, electric charges move to the capacitor Cf and the amplitude ($|\Delta V|$) of the sensor output Vo increases. The detection device 1 can detect light by repeating the non-detection duration toff and the detection duration ton at a predetermined frequency.

Subsequently, a circuit configuration of the detection electrodes 24 will be described below. FIG. 10 is a circuit diagram illustrating an array of detection electrodes. To simplify description, FIG. 10 and the like illustrate an example in which the detection electrodes 24 are disposed in a matrix of four rows and four columns, but the matrix is not limited to this configuration. For example, a large number of detection electrodes 24 may be disposed in a matrix of 256 rows and 256 columns. FIG. 10 illustrates four gate lines GCL(1), GCL(2), GCL(3), and GCL(4), two reference signal lines COM(1) and COM(2), and four signal lines SGL (1), SGL(2), SGL(3), and SGL(4). In the following description, when not needed to be distinguished from each other, the gate lines GCL(1), GCL(2), GCL(3), and GCL(4) are simply referred to as gate lines GCL. Similarly, the reference signal lines are also simply referred to as a reference signal line COM, and the gate lines GCL(1), GCL(2), GCL(3), and GCL(4) are also simply referred to as a signal line SGL.

The gate lines GCL intersect the signal lines SGL. The gate lines GCL intersect the reference signal lines COM. The gate lines GCL, the signal lines SGL, and the reference signal lines COM provide partition as the matrix. Each detection electrode 24 is disposed in a region surrounded by gate lines GCL, a signal line SGL, and a reference signal line COM. This partitioned region functions as a sensor.

A first detection electrode block BKx is defined to be an array of detection electrodes 24 in the first direction Dx. First detection electrode blocks BKx(1), BKx(2), BKx(3), and BKx(4) are arrayed in the second direction Dy. A plurality of first and second switching elements Tr and xTr provided in the first detection electrode block BKx(1) are coupled with the gate line GCL(1), which is common to the switching elements. A plurality of first and second switching elements Tr and xTr provided in the first detection electrode block BKx(2) are coupled with the gate line GCL(2), which is common the switching elements. This configuration also applies to the first detection electrode block BKx(3) and the first detection electrode block BKx(4). The gate lines GCL (1), GCL(2), GCL(3), and GCL(4) are each coupled with the gate line drive circuit 15.

Each array of detection electrodes 24 in the first direction Dx is provided with a signal line SGL. A second detection electrode block BKy is defined to be an array of detection electrodes 24 in the second direction Dy along the signal line SGL. Second detection electrode blocks BKy(1), BKy(2), BKy(3), and BKy(4) are arrayed in the first direction Dx. A plurality of first switching elements Tr provided in the second detection electrode block BKy(1) are coupled with the signal line SGL(1) common to the switching elements. A plurality of first switching elements Tr provided in the second detection electrode block BKy(2) are coupled with the signal line SGL(2) common to the switching elements. This configuration also applies to the second detection electrode block BKy(3), BKy(4). Accordingly, each second detection electrode block BKy is provided with a signal line SGL. The signal lines SGL(1), SGL(2), SGL(3), and SGL(4) are each coupled with the signal line selection circuit 16. Each reference signal line COM is provided between detection electrodes 24 adjacent to each other in the first direction Dx. Detection electrodes 24 adjacent to each other through a reference signal line COM are coupled, through the second switching elements xTr provided thereto, with the reference signal line COM, which is common to the detection electrodes 24.

The gate line drive circuit 15 supplies the first gate drive signal VGH and the second gate drive signal VGL having potentials determined for each gate line GCL based on a predetermined code to the gate line GCL. In this manner, the gate line drive circuit 15 drives to select one or a plurality of the gate lines GCL based on the predetermined code. Through each selected gate line GCL, the gate line drive circuit 15 applies the first gate drive signal VGH to the gate of each first switching element Tr. Accordingly, one or a plurality of the first detection electrode blocks BKx are selected as detection targets and coupled with the signal line SGL. In addition, through each gate line GCL as a non-detection target, the gate line drive circuit 15 applies the second gate drive signal VGL to the gate of each second switching element xTr. Accordingly, one or a plurality of first detection electrode blocks BKx are selected as non-detection targets and each coupled with the corresponding reference signal line COM.

The signal line selection circuit 16 drives to select one or a plurality of the signal lines SGL based on a predetermined code. The signal line selection circuit 16 couples the selected signal lines SGL with one output signal line Lout. Accordingly, a plurality of second detection electrode blocks BKy are coupled with the AFE 48 through one output signal line Lout.

Figure 11:
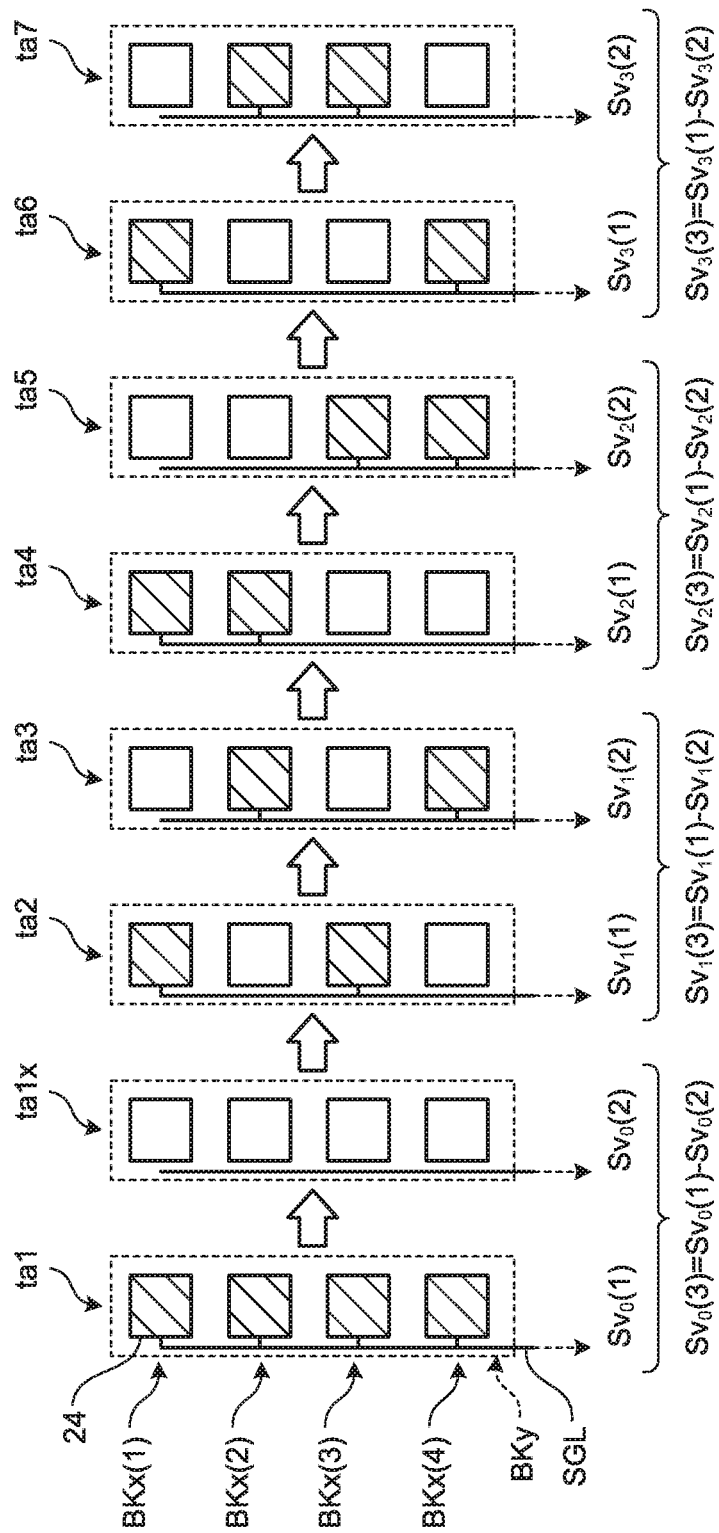
FIG. 11 is an explanatory diagram for describing exemplary operation of code division selection drive by a gate line drive circuit.

FIG. 11 is an explanatory diagram for describing exemplary operation of code division selection drive by the gate line drive circuit. To simplify description, FIG. 11 illustrates exemplary operation of CDM drive for a second detection electrode block BKy having four detection electrodes 24. In FIG. 11, each detection electrode 24 as a detection target is hatched. In FIG. 11, illustrations of the gate lines GCL, the gate line drive circuit 15, the first switching elements Tr, and the like are omitted.

Each detection electrode 24 of the second detection electrode block BKy can be coupled with a common signal line SGL through operation of the first switching element Tr. A signal value output from each detection electrode 24 is referred to as a signal value $Si_q$ (q=0, 1, 2, 3). The gate line drive circuit 15 selects one or a plurality of detection electrodes 24 among the detection electrodes 24 of the second detection electrode block BKy based on a predetermined code. A signal value as an integration of the signal values $Si_q$ from the selected detection electrodes 24 is output as an output signal $Sv_p$ (p=0, 1, 2, 3) through the signal line SGL. The output signal $Sv_p$ is expressed as Expression (1) below. Specifically, the output signal $Sv_p$ is expressed as the sum of the signal values $Si_q$ output from detection electrodes 24 as detection targets in one second detection electrode block BKy.

$$Sv_P = \sum_{q=0}^{Q-1} HSi_q \quad (1)$$

The signal value $Si_q$ is a signal value corresponding to each detection electrode 24 in each of the first detection electrode blocks BKx(1), BKx(2), BKx(3), and BKx(4). The signal value $Si_q$ is a signal value output in accordance with light incident on the organic material layer 31. The output signal $Sv_p$ is an output signal from the second detection electrode block BKy and is a value obtained through calculation of the signal values $Si_q$ of the detection electrodes 24 selected in the second detection electrode block BKy based on the predetermined code. The predetermined code is defined by, for example, a square matrix H in Expression (2) below. The predetermined code is a code based on a square matrix, for example, a Hadamard matrix, that includes an element of "1" or "−1" or an element of "1" or "0" and in which two optional different rows form an orthogonal matrix.

$$H = \begin{pmatrix} 1 & 1 & 1 & 1 \\ 1 & -1 & 1 & -1 \\ 1 & 1 & -1 & -1 \\ 1 & -1 & -1 & 1 \end{pmatrix} \quad (2)$$

The order of the square matrix H is four, which is the number of detection electrodes 24 included in the second detection electrode block BKy, in other words, the number of the four first detection electrode blocks BKx. The present embodiment describes the second detection electrode block BKy including four detection electrodes 24 but is not limited thereto, and the number of detection electrodes 24 included in the second detection electrode block BKy may be two, three, five or larger. In this case, the order of the square matrix H is changed in accordance with the number of detection electrodes 24.

In a first duration ta1 and a first duration ta1x illustrated in FIG. 11, the gate line drive circuit 15 supplies the first gate drive signal VGH or the second gate drive signal VGL to each gate line GCL in accordance with selection signals corresponding to the first row of the square matrix H. Accordingly, each detection electrode 24 as a detection target is selected. In a second duration ta2 and a third duration ta3, detection electrodes 24 are selected in accordance with selection signals corresponding to the second row of the square matrix H. In a fourth duration ta4 and a fifth duration ta5, detection electrodes 24 are selected in accordance with selection signals corresponding to the third row of the square matrix H. In the fourth duration ta4 and the fifth duration ta5, detection electrodes 24 are selected in accordance with selection signals corresponding to the fourth row of the square matrix H.

Specifically, in the first duration ta1, the gate line drive circuit 15 supplies the first gate drive signal VGH having a potential determined in accordance with Component "1" on the first row of the square matrix H to each gate line GCL. Each first switching element Tr is turned on by the first gate drive signal VGH, and the four detection electrodes 24 are coupled with a common signal line SGL. Accordingly, the four detection electrode 24 are selected as first detection targets. The detection electrodes 24 as the first detection targets output a first output signal $Sv_0(1)$ to the AFE 48 through the signal line SGL. The first output signal $Sv_0(1)$ is a signal as an integration of detection signals from the four detection electrodes 24.

Subsequently, in the first duration ta1x, since Component "−1" does not exist on the first row of the square matrix H, no detection electrode 24 is selected as a second detection target corresponding to Component "−1". The gate line drive circuit 15 supplies the second gate drive signal VGL to the gate lines GCL corresponding to the respective detection electrodes 24. Accordingly, the signal value of a second output signal $Sv_0(2)$ is zero. The signal processor 44 calculates a third output signal $Sv_0(3)=Sv_0(1)-Sv_0(1)$ from the difference between the first output signal $Sv_0(1)$ and the second output signal $Sv_0(2)$.

Subsequently, in the second duration ta2, the gate line drive circuit 15 supplies the first gate drive signal VGH having a potential determined in accordance with Component "1" on the second row of the square matrix H to each corresponding gate line GCL. Accordingly, two detection electrodes 24 belonging to the first detection electrode blocks BKx(1) and BKx(3) are selected as first detection targets. The detection electrodes 24 as the first detection targets output a first output signal $Sv_1(1)$ to the AFE 48 through the signal line SGL.

Subsequently, in the third duration ta3, the gate line drive circuit 15 supplies the first gate drive signal VGH having a potential determined in accordance with Component "−1" on the second row of the square matrix H to each corresponding gate line GCL. Accordingly, two detection electrodes 24 belonging to the first detection electrode blocks BKx(2) and BKx(4) are selected as second detection targets. The detection electrodes 24 as the second detection targets output a second output signal $Sv_1(2)$ to the AFE 48 through the signal line SGL. The signal processor 44 calculates a third output signal $Sv_1(3)=Sv_1(1)-Sv_1(2)$ from the difference between the first output signal $Sv_1(1)$ and the second output signal $Sv_1(2)$.

Similarly, in the fourth duration ta4, any first detection target corresponding to Component "1" on the third row of the square matrix H is selected by the gate line drive circuit 15. In the fifth duration ta5, any second detection target corresponding to Component "−1" on the third row of the square matrix H is selected by the gate line drive circuit 15. In a sixth duration tab, any first detection target corresponding to Component "1" on the fourth row of the square matrix H is selected by the gate line drive circuit 15. In a seventh duration ta7, any second detection target corresponding to Component "−1" on the fourth row of the square matrix H is selected by the gate line drive circuit 15.

Accordingly, the signal processor 44 calculates the four third output signals $Sv_0(3)$, $Sv_1(3)$, $Sv_2(3)$, and $Sv_3(3)$. Then, the signal processor 44 decodes the four third output signals $Sv_0(3)$, $Sv_1(3)$, $Sv_2(3)$, and $Sv_3(3)$ through multiplication with the square matrix H. In this manner, the detection device 1 can obtain a signal intensity four times higher without increasing the voltage value of the drive voltage VDD_ORG. In addition, the detection device 1 can increase the signal intensity without increasing the area of each detection electrode 24. Accordingly, the detection device 1 can perform high-definition light detection. Moreover, the third output signal $Sv_p(3)$ can be calculated based on the difference between the first output signal $Sv_p(1)$ and the second output signal $Sv_p(2)$. Thus, when noise is applied from the outside or when variation has occurred to characteristics of the organic material layer 31 due to influence of measurement environment, a noise component of a first output signal $Sh_p(1)$ and a noise component of a second output signal $Sh_p(2)$ are canceled. Accordingly, the detection device 1 can achieve improved detection reliability.

Figure 12:
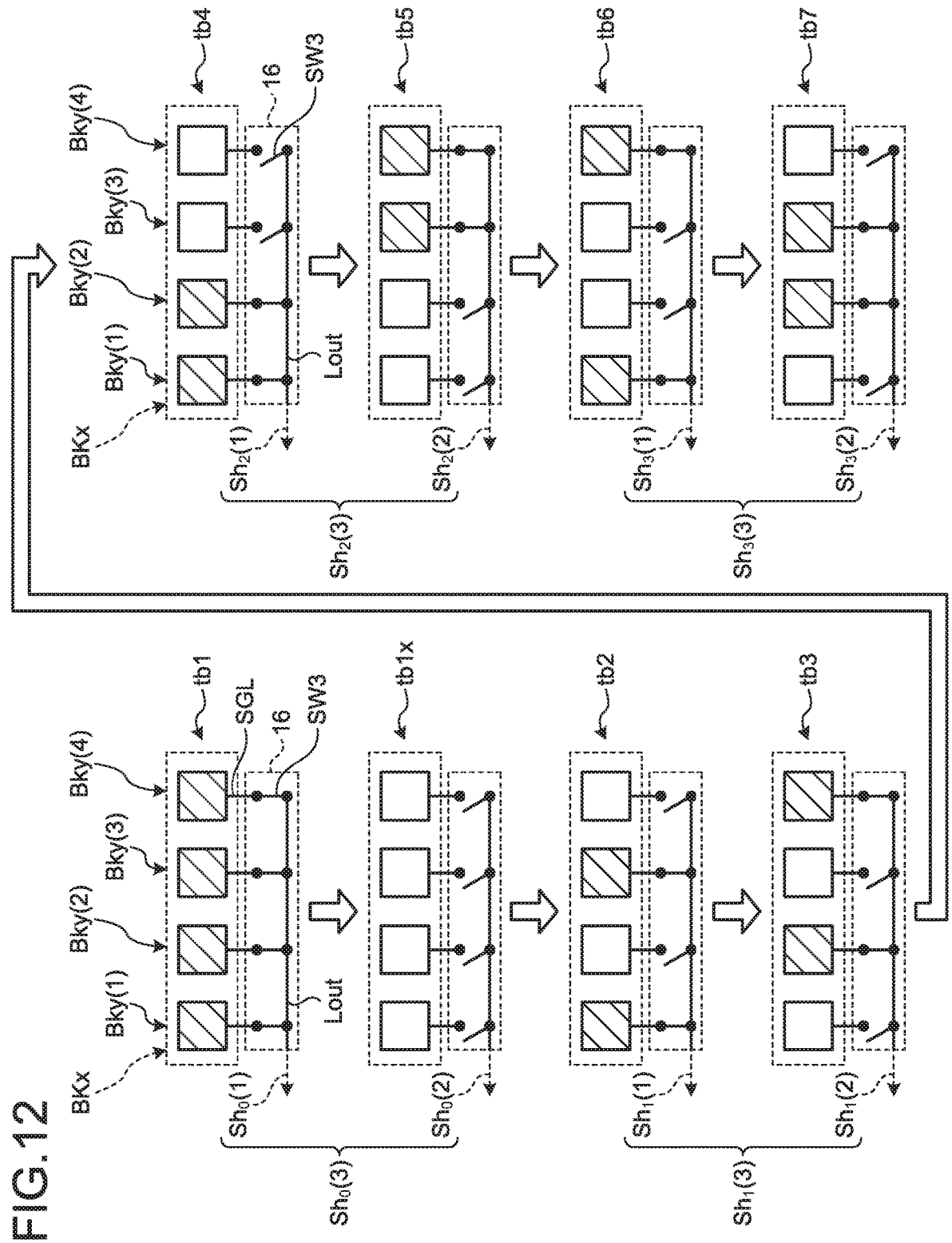
FIG. 12 is an explanatory diagram for describing exemplary operation of code division selection drive by a signal line selection circuit.

FIG. 12 is an explanatory diagram for describing exemplary operation of code division selection drive by the signal line selection circuit. To simplify description, FIG. 12 illustrates exemplary operation of CDM drive for a first detection electrode block BKx including four detection electrodes 24.

The signal line selection circuit 16 couples signal lines SGL with a common output signal line Lout based on a predetermined code. Accordingly, the signal line selection circuit 16 selects one or a plurality of detection electrodes 24 in the first detection electrode block BKx based on the predetermined code. A signal value output from each detection electrode 24 is referred to as a signal value $Si_q$. Similarly to Expression (1), a signal value as an integration of the signal values $Si_q$ of selected detection electrodes 24 is output as an output signal $Sh_p$ through the output signal line Lout. Specifically, the output signal $Sh_p$ is expressed as the sum of the signal values $Si_q$ output from detection electrodes 24 in one first detection electrode block BKx.

The predetermined code is defined by, for example, the square matrix H of Expression (2) described above. The predetermined code only needs to be, for example, a code based on a Hadamard matrix, and may be another square matrix.

As illustrated in FIG. 12, in a first partial duration tb1, the four detection electrodes 24 are selected as first detection targets in accordance with Component "1" on the first row of the square matrix H. Specifically, through operation of third switches SW3, the signal line selection circuit 16 couples four signal lines SGL corresponding to Component "1" on the first row of the square matrix H with the common output signal line Lout. Accordingly, the detection electrodes 24 as the first detection targets output a first output signal $Sh_0(1)$ to the AFE 48 through the common output signal line Lout. The first output signal $Sh_0(1)$ is a signal as an integration of detection signals from the four detection electrodes 24.

Subsequently, in a first partial duration tb1x, since Component "−1" does not exist on the first row of the square matrix H, the signal line selection circuit 16 cuts off the four signal lines SGL from the common output signal line Lout through operation of the third switches SW3. Thus, no detection electrode 24 is selected as second detection target corresponding to Component "−1". Accordingly, the signal value of a second output signal $Sh_0(2)$ is zero. The signal processor 44 calculates a third output signal $Sh_0(3)=Sh_0(1)-Sh_0(1)$ from the difference between the first output signal $Sh_0(1)$ and the second output signal $Sh_0(2)$.

Subsequently, in a second partial duration tb2, the signal line selection circuit 16 couples any signal line SGL corresponding to Component "1" on the second row of the square matrix H with the common output signal line Lout through operation of the third switches SW3. Accordingly, two detection electrodes 24 belonging to the second detection electrode blocks BKy(1) and BKy(3) are selected as first detection targets. The detection electrodes 24 as the first detection targets output a first output signal $Sh_1(1)$ to the AFE 48 through the output signal line Lout.

Subsequently, in a third partial duration tb3, the signal line selection circuit 16 couples any signal line SGL corresponding to Component "−1" on the second row of the square matrix H with the common output signal line Lout through operation of the third switches SW3. Accordingly, two detection electrodes 24 belonging to the second detection electrode blocks BKy(2) and BKy(4) are selected as second detection targets. The detection electrodes 24 as the second detection targets output a second output signal $Sh_1(2)$ to the AFE 48 through the output signal line Lout. The signal processor 44 calculates a third output signal $Sh_1(3)=Sh_1(1)-Sh_1(2)$ from the difference between the first output signal $Sh_1(1)$ and the second output signal $Sh_1(2)$.

Similarly, in a fourth partial duration tb4, any first detection target corresponding to Component "1" on the third row of the square matrix H is selected by the signal line selection circuit 16. In a fifth partial duration tb5, any second detection target corresponding to Component "−1" on the third row of the square matrix H is selected by the signal line selection circuit 16. In a sixth partial duration tb6, any first detection target corresponding to Component "1" on the fourth row of the square matrix H is selected by the signal line selection circuit 16. In a seventh partial duration tb7, any second detection target corresponding to Component "−1" on the fourth row of the square matrix H is selected by the signal line selection circuit 16.

Accordingly, the signal processor 44 calculates the four third output signals $Sh_0(3)$, $Sh_1(3)$, $Sh_2(3)$, and $Sh_3(3)$. Then, the signal processor 44 decodes the four third output signals $Sh_0(3)$, $Sh_1(3)$, $Sh_2(3)$, and $Sh_3(3)$ through multiplication with the square matrix H. In this manner, the detection device 1 can obtain a signal intensity additionally four times higher without increasing the voltage value of the drive voltage VDD_ORG.

The CDM drive by the gate line drive circuit 15 illustrated in FIG. 11 and the CDM drive by the signal line selection circuit 16 illustrated in FIG. 12 may be executed in combination as appropriate. FIG. 13 is a table indicating exemplary detection operation by the gate line drive circuit and the signal line selection circuit in the first to third durations. FIG. 14 is a table indicating exemplary detection operation by the gate line drive circuit and the signal line selection circuit in the fourth to seventh durations.

In FIG. 13, the first gate drive signal VGH and the second gate drive signal VGL supplied to the gate lines GCL(1), GCL(2), GCL(3), and GCL(4) are listed for each of the first duration ta1, the second duration ta2, and the third duration ta3. Additionally in FIG. 13, the AFE 48 coupled with the second detection electrode blocks BKy(1), BKy(2), BKy(3), and BKy(4), or a reference signal VR is listed for each of the first to seventh partial durations tb1 to tb7. Similarly in FIG. 14, these pieces of information are listed for each of the fourth to seventh durations ta4 to ta7.

As illustrated in FIGS. 13 and 14, the first to seventh partial durations tb1 to tb7 are provided for each of the first to seventh durations ta1 to ta7. The order of the durations may be changed as appropriate.

As illustrated in FIGS. 13 and 14, the gate line drive circuit 15 supplies the first gate drive signal VGH and the second gate drive signal VGL having potentials determined based on the predetermined code expressed as Expression (2) to the gate lines GCL. Specifically, in the first duration ta1, the gate line drive circuit 15 supplies the first gate drive signal VGH to all gate lines GCL(1), GCL(2), GCL(3), and GCL(4) in accordance with Component "1" on the first row of Expression (2). The first duration ta1x illustrated in FIG. 11, in which Component "−1" does not exist on the first row of the square matrix H, can be omitted. In the second duration ta2, the gate line drive circuit 15 supplies the first gate drive signal VGH to the gate line GCL(1) and GCL(3) in accordance with Component "1" on the second row of Expression (2). In the second duration ta2, the gate line drive circuit 15 also supplies the second gate drive signal VGL to the gate line GCL(2) and GCL(4) in accordance with Component "−1" on the second row of Expression (2).

Similarly, in the third to seventh durations ta3 to ta7, the gate line drive circuit 15 supplies the first gate drive signal VGH or the second gate drive signal VGL corresponding to each component of Expression (2) to the corresponding gate line GCL. Accordingly, different combinations of detection electrodes 24 as first and second detection targets are selected for the respective durations.

As illustrated in FIGS. 13 and 14, the signal line selection circuit 16 couples signal lines SGL corresponding to the predetermined code expressed as Expression (2) with one output signal line Lout. In this manner, the signal line selection circuit 16 selects second detection electrode blocks BKy. Specifically, in the first partial duration tb1, the signal line selection circuit 16 selects all second detection electrode blocks BKy(1), BKy(2), BKy(3), and BKy(4) in accordance with Component "1" on the first row of Expression (2). The second detection electrode blocks BKy(1), BKy(2), BKy(3), and BKy(4) are coupled with the AFE 48 through the output signal line Lout. In this case, each detection electrode 24 as a first detection target or a second detection target selected by the gate line drive circuit 15 in the second detection electrode blocks BKy(1), BKy(2), BKy(3), and BKy(4) is coupled with the output signal line Lout.

Accordingly, a first output signal $Svh_0(1)$ is output from the second detection electrode blocks BKy(1), BKy(2), BKy(3), and BKy(4) to the AFE 48. The first output signal $Svh_0(1)$ is a signal as an integration of signals from detection electrodes 24 as first detection targets in the second detection electrode blocks BKy(1), BKy(2), BKy(3), and BKy(4). A second output signal $Svh_0(0)$ is a signal as an integration of signals from detection electrodes 24 as second detection targets in the second detection electrode blocks BKy(1), BKy(2), BKy(3), and BKy(4). Since Component "−1" does not exist on the first row of Expression (2), the first partial duration tb1x illustrated in FIG. 12 may be omitted. The signal processor 44 acquires the first output signal $Svh_0(1)$ in the first partial duration tb1 as a third output signal $Svh_0(3)$.

In the second partial duration tb2, the signal line selection circuit 16 selects the second detection electrode blocks BKy(1) and BKy(3) in accordance with Component "1" on the second row of Expression (2). The second detection electrode blocks BKy(1) and BKy(3) are coupled with the AFE 48 through the output signal line Lout. Accordingly, a first output signal $Svh_1(1)$ is output from the second detection electrode blocks BKy(1) and BKy(3) to the AFE 48. In this case, each detection electrode 24 as a first detection target or a second detection target selected by the gate line drive circuit 15 in the second detection electrode blocks BKy(1) and BKy(3) is coupled with the output signal line Lout. The reference signal VR is supplied to the second detection electrode blocks BKy(2) and BKy(4), that are not selected.

In the third partial duration tb3, the signal line selection circuit 16 selects the second detection electrode blocks BKy(2) and BKy(4) in accordance with Component "−1" on the second row of Expression (2). The second detection electrode blocks BKy(2) and BKy(4) are coupled with the AFE 48 through the output signal line Lout. Accordingly, a second output signal $Svh_1(2)$ (refer to FIG. 12) is output from the second detection electrode blocks BKy(2) and BKy(4) to the AFE 48. In this case, each detection electrode 24 as a first detection target or a second detection target selected by the gate line drive circuit 15 in the second detection electrode blocks BKy(2) and BKy(4) is coupled with the output signal line Lout. The reference signal VR is supplied to the second detection electrode blocks BKy(1) and BKy(3), that are not selected. The signal processor 44 calculates a third output signal $Svh_1(3)$ from the difference between the first output signal $Svh_1(1)$ in the second partial duration tb2 and the second output signal $Svh_1(2)$ in the third partial duration tb3.

Similarly, the signal line selection circuit 16 selects second detection electrode blocks BKy based on the predetermined code of Expression (2) in the fourth to seventh partial durations tb4 to tb7. Accordingly, the signal processor 44 acquires the four third output signals $Svh_0(3)$, $Svh_1(3)$, $Svh_2(3)$, and $Svh_3(3)$ in the first to seventh partial durations tb1 to tb7. In addition, similarly to the example illustrated in FIG. 11, the signal processor 44 acquires the four third output signals $Svh_0(3)$, $Svh_1(3)$, $Svh_2(3)$, and $Svh_3(3)$ in the first to seventh durations ta1 to ta7. Accordingly, the signal processor 44 acquires 16 third output signals Svh(3) in total.

Then, the signal processor 44 calculates a decoding signal for each detection electrode 24 by decoding the third output signals Svh(3). In this manner, the detection device 1 can perform CDM drive through the gate line drive circuit 15 and the signal line selection circuit 16.

As illustrated in FIG. 3, the detection electrodes 24 and the signal line selection circuit 16 are provided to the substrate 21. Then, the detection electrodes 24 are coupled with one AFE 48 through the output signal line Lout. Thus, the number of AFEs 48 can be reduced when the number of detection electrodes 24 is increased. In addition, the number of wires coupling the substrate 21 and the AFE 48 can be reduced.

Figure 15:
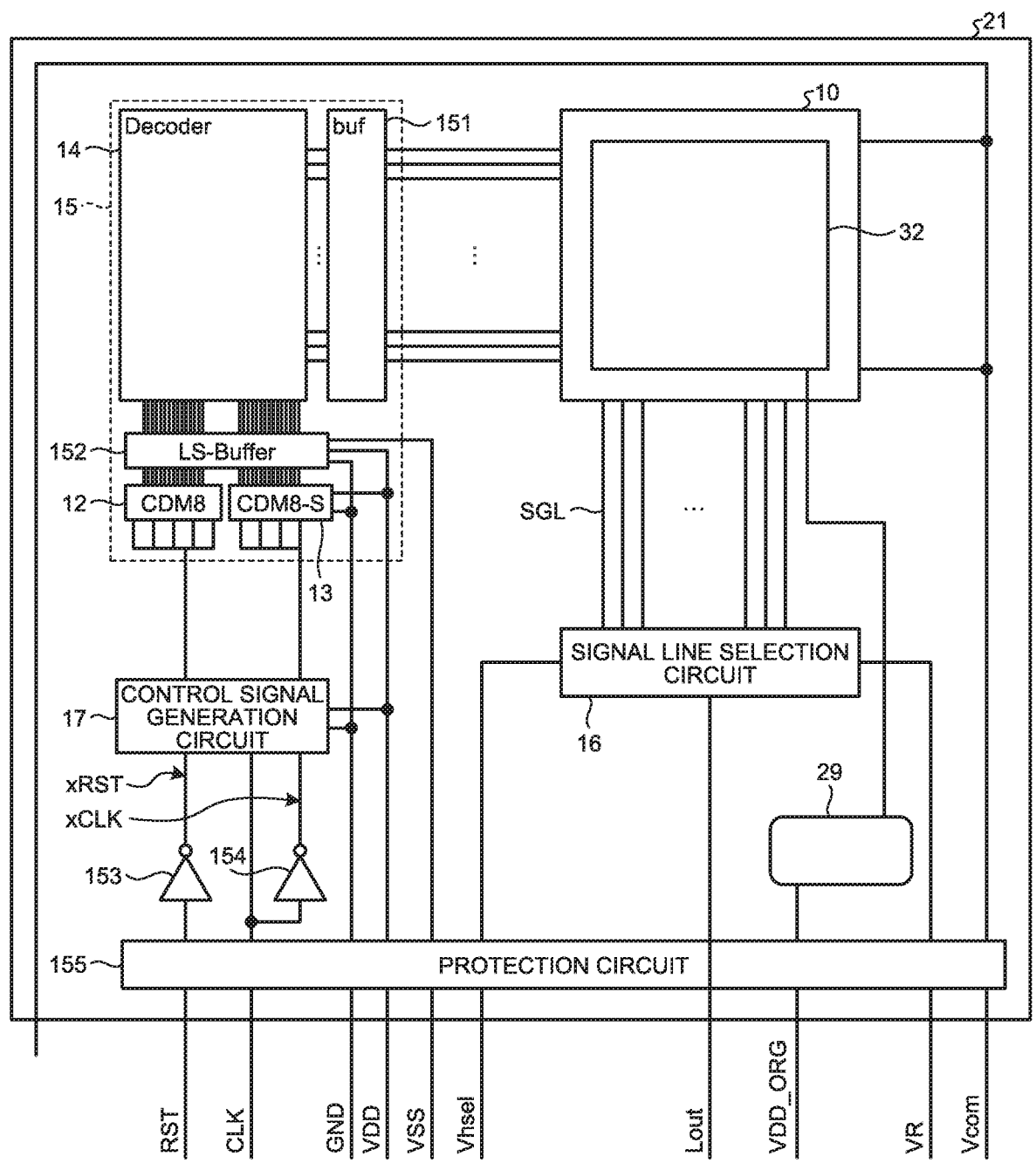
FIG. 15 is a block diagram illustrating an exemplary configuration of a sensor unit, the gate line drive circuit, and the signal line selection circuit.
Figure 16:
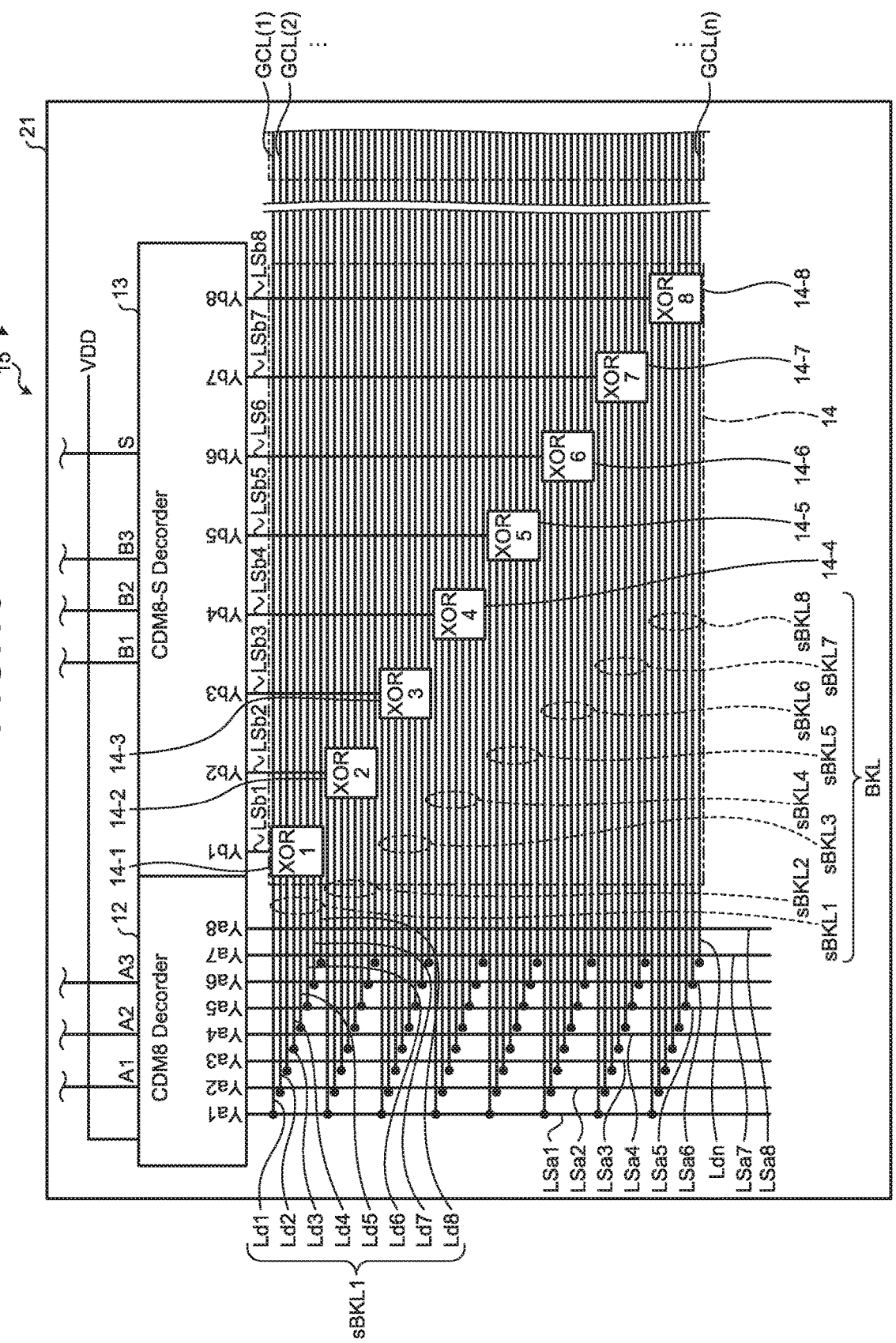
FIG. 16 is a block diagram of the gate line drive circuit.

Subsequently, a detailed configuration of the gate line drive circuit 15 will be described below. FIG. 15 is a block diagram illustrating an exemplary configuration of the sensor unit, the gate line drive circuit, and the signal line selection circuit. FIG. 16 is a block diagram of the gate line drive circuit.

As illustrated in FIG. 15, the substrate 21 is provided with the sensor unit 10, the gate line drive circuit 15, and the signal line selection circuit 16. In addition, the substrate 21 is provided with a control signal generation circuit 17, inverters 153 and 154, and a protection circuit 155.

The protection circuit 155 includes a protection resistance element and a protection diode. Various signals supplied from the control substrate 101 (refer to FIG. 1) are supplied to the control signal generation circuit 17, the gate line drive circuit 15, and the signal line selection circuit 16 through the protection circuit 155. The output signal line Lout of the signal line selection circuit 16 is coupled with the AFE 48 not through the protection diode of the protection circuit 155. Accordingly, decrease of the intensity of a signal output from the sensor unit 10 can be reduced.

The inverter 153 receives a reset signal RST from the control substrate 101 and outputs an inverted reset signal xRST to the control signal generation circuit 17. The inverted reset signal xRST is a voltage signal obtained by inverting the reset signal RST. The inverter 154 receives a clock signal CLK from the control substrate 101 and outputs an inverted clock signal xCLK to the control signal generation circuit 17. The inverted clock signal xCLK is a voltage signal obtained by inverting the clock signal CLK.

The control signal generation circuit 17 generates various kinds of control signals based on the reset signal RST, the clock signal CLK, the ground potential GND, and the power voltage VDD supplied from the external control substrate 101. The control signal generation circuit 17 supplies the various kinds of control signals to the gate line drive circuit 15.

Figure 17:
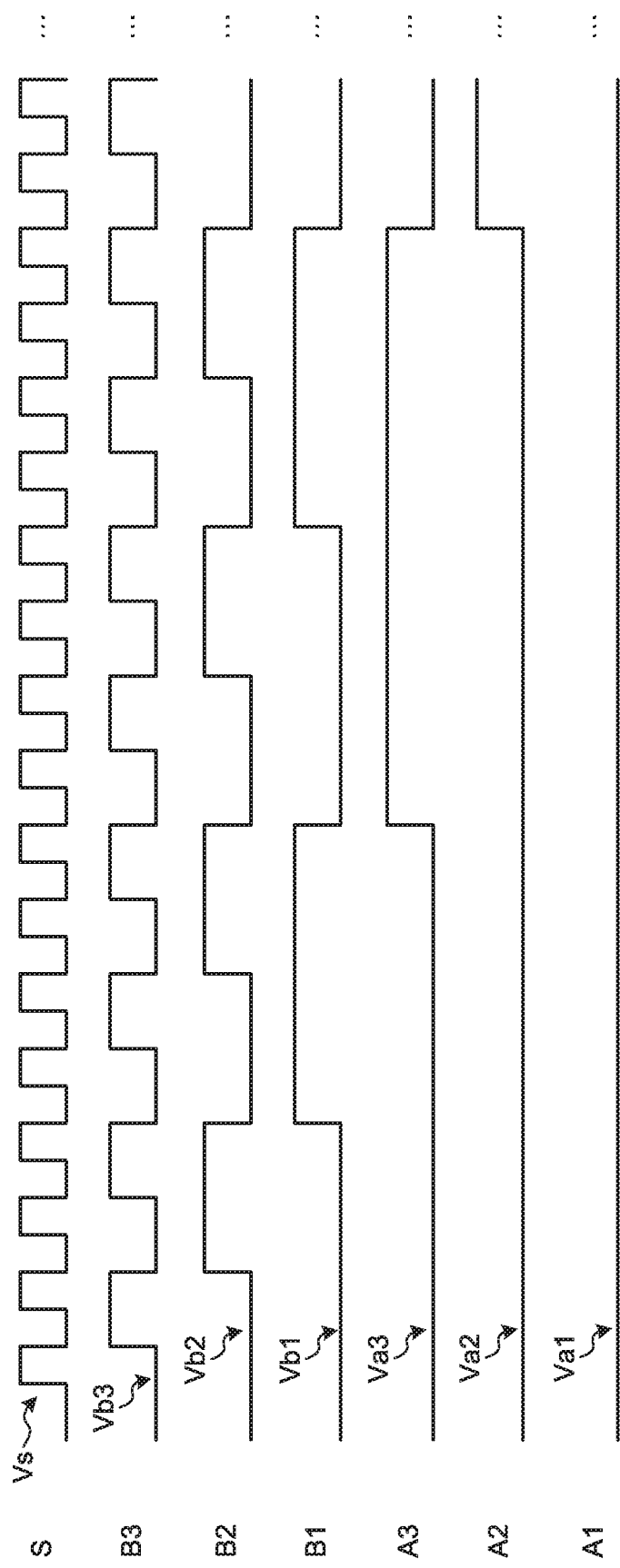
FIG. 17 is a timing waveform diagram illustrating various kinds of control signals output from a control signal generation circuit.

FIG. 17 is a timing waveform diagram illustrating the various kinds of control signals output from the control signal generation circuit. As illustrated in FIG. 17, the control signal generation circuit 17 outputs an inverted control signal Vs, first control signals Va1, Va2, and Va3, and second control signals Vb1, Vb2, and Vb3. The inverted control signal Vs is supplied to an inverted input terminal S of a second code generation circuit 13. The first control signals Va1, Va2, and Va3 are supplied to first input terminals A1, A2, and A3, respectively, of a first code generation circuit 12. The second control signals Vb1, Vb2, and Vb3 are supplied to second input terminals B1, B2, and B3, respectively, of the second code generation circuit 13.

As illustrated in FIG. 17, the frequency of the second control signal Vb3 is ½ of the frequency of the inverted control signal Vs. The frequency of the second control signal Vb2 is ½ of the frequency of the second control signal Vb3. Similarly, the second control signal Vb1 and the first control signals Va3, Va2, and Va1 are output from the control signal generation circuit 17.

As illustrated in FIGS. 15 and 16, the gate line drive circuit 15 includes the first code generation circuit 12, the second code generation circuit 13, a third code generation circuit 14, a buffer circuit 151, and a level shifter 152. Specifically, the first code generation circuit 12, the second code generation circuit 13, the third code generation circuit 14, the buffer circuit 151, and the level shifter 152 are provided in the frame region GA of the substrate 21. In FIG. 16, the buffer circuit 151 and the level shifter 152 are omitted.

The first code generation circuit 12, the second code generation circuit 13, and the third code generation circuit 14 are a decoder circuit. The first code generation circuit 12 generates a first partial selection signal Vd (refer to FIGS. 18 and 19) based on the first control signals Va1, Va2, and Va3 and supplies the first partial selection signal Vd to the third code generation circuit 14. The second code generation circuit 13 generates a second partial selection signal Vf (refer to FIGS. 20 and 21) based on the second control signals Vb1, Vb2, and Vb3 and supplies the second partial selection signal Vf to the third code generation circuit 14. The third code generation circuit 14 is, for example, an exclusive disjunction (XOR) circuit. The third code generation circuit 14 generates a first selection signal Vc based on the first partial selection signal Vd and the second partial selection signal Vf and supplies a signal based on the first selection signal Vc to a gate line GCL.

As illustrated in FIG. 16, the first code generation circuit 12 includes the first input terminals A1, A2, and A3, a terminal to which the power voltage VDD is input, and a plurality of output terminals Ya1, Ya2, . . . , Ya8. In the present embodiment, the number of the output terminals Ya1, Ya2, . . . , Ya8 of the first code generation circuit 12 is eight. The first control signals Va1, Va2, and Va3 from the control signal generation circuit 17 are input to the first input terminals A1, A2, and A3. The first code generation circuit 12 is a circuit configured to generate the first partial selection signal Vd based on the first control signals Va1, Va2, and Va3. The first code generation circuit 12 outputs the first partial selection signal Vd to first selection signal lines LSa1, LSa2, . . . , LSa8 through the output terminals Ya1, Ya2, . . . , Ya8. The first partial selection signal Vd is a signal having a phase determined for each gate line GCL.

The second code generation circuit 13 includes the second input terminals B1, B2, and B3, the inverted input terminal S, and a plurality of output terminals Yb1, Yb2, . . . , Yb8. In the present embodiment, the number of the output terminals Yb1, Yb2, . . . , Yb8 of the second code generation circuit 13 is eight. The second control signals Vb1, Vb2, and Vb3 from the control signal generation circuit 17 are input to the second input terminals B1, B2, and B3. The inverted control signal Vs from the control signal generation circuit 17 is input to the second code generation circuit 13. The second code generation circuit 13 is a circuit configured to generate the second partial selection signal Vf based on the second control signals Vb1, Vb2, and Vb3 and the inverted control signal Vs. The inverted control signal Vs is a signal for inverting Components "1" and "−1" of the predetermined code. The second code generation circuit 13 outputs the second partial selection signal Vf to second selection signal lines LSb1, LSb2, . . . , LSb8 through the output terminals Yb1, Yb2, . . . , Yb8. The second partial selection signal Vf is a signal having a phase determined for each drive signal supply line block BKL.

As illustrated in FIG. 15, the level shifter 152 is provided between the third code generation circuit 14 and each of the first code generation circuit 12 and the second code generation circuit 13. The level shifter 152 is a circuit configured to change the voltage (amplitude) of an input signal and output the signal thus changed. Specifically, the level shifter 152 receives the first partial selection signal Vd from the first code generation circuit 12 and temporarily holds the first partial selection signal Vd. In addition, the level shifter 152 receives the second partial selection signal Vf from the second code generation circuit 13 and temporarily holds the second partial selection signal Vf. The level shifter 152 changes the voltage level of the first selection signal Vc based on the power voltages VDD and VSS supplied from the control substrate 101. The level shifter 152 increases the amplitudes of the first partial selection signal Vd and the second partial selection signal Vf and outputs the first partial selection signal Vd and the second partial selection signal Vf to the third code generation circuit 14. The level shifter 152 may be provided on the output side of the third code generation circuit 14.

As illustrated in FIG. 16, the gate lines GCL(1), GCL(2), GCL(n) are arrayed. Each gate line GCL is provided for a first detection electrode block BKx (refer to FIG. 10). The number of gate lines GCL is 64 (n=64). Drive signal supply lines Ld1, Ld2, . . . , Ldn (n=64) are coupled with the respective gate lines GCL. Drive signal supply line part blocks sBKL1, sBKL2, . . . , sBKL7, and sBKL8 each include eight drive signal supply lines Ld.

The first selection signal lines LSa1, LSa2, . . . , LSa8 of each drive signal supply line part block sBKL are coupled with one drive signal supply line Ld. Accordingly, the first selection signal lines LSa1, LSa2, LSa8 are each coupled in parallel with the drive signal supply line part blocks sBKL1, sBKL2, . . . , sBKL7, and sBKL8. The first selection signal lines LSa1, LSa2, . . . , LSa8 are coupled with the drive signal supply lines Ld different from one another. In other words, the drive signal supply lines Ld included in one drive signal supply line part block sBKL are coupled with the first selection signal lines LSa1, LSa2, . . . , LSa8, respectively. For example, the drive signal supply lines Ld1, Ld2, . . . , Ld8 included in the drive signal supply line part block sBKL1 are coupled with the first selection signal lines LSa1, LSa2, . . . , LSa8, respectively. This is same for the drive signal supply line part blocks sBKL2, . . . , sBKL7, and sBKL8.

Third code generation circuits 14-1, 14-2, . . . , 14-7, and 14-8 are provided for the drive signal supply line part blocks sBKL1, sBKL2, . . . , sBKL7, and sBKL8, respectively. The second selection signal lines LSb1, LSb2, . . . , LSb8 are coupled with the third code generation circuit 14-1, 14-2, . . . , 14-8, respectively. In other words, the second selection signal lines LSb1, LSb2, . . . , LSb8 are coupled with the drive signal supply line part blocks sBKL1, sBKL2, . . . , sBKL8, respectively. Each third code generation circuit 14 is coupled with the plurality of first selection signal lines LSa and coupled with one second selection signal line LSb. In the present embodiment, the plurality of first selection signal lines LSa and the plurality of second selection signal lines LSb intersect the drive signal supply lines Ld in plan view.

The third code generation circuits 14 generate the first selection signal Vc based on the first partial selection signal Vd and the second partial selection signal Vf and supply the first selection signal Vc to the buffer circuit 151 (refer to FIG. 15).

As illustrated in FIG. 15, the buffer circuit 151 temporarily holds the first selection signal Vc supplied from the third code generation circuit 14. Then, the buffer circuit 151 supplies the first gate drive signal VGH and the second gate drive signal VGL in accordance with the first selection signal Vc to selected gate lines GCL simultaneously in effect.

Figure 18:
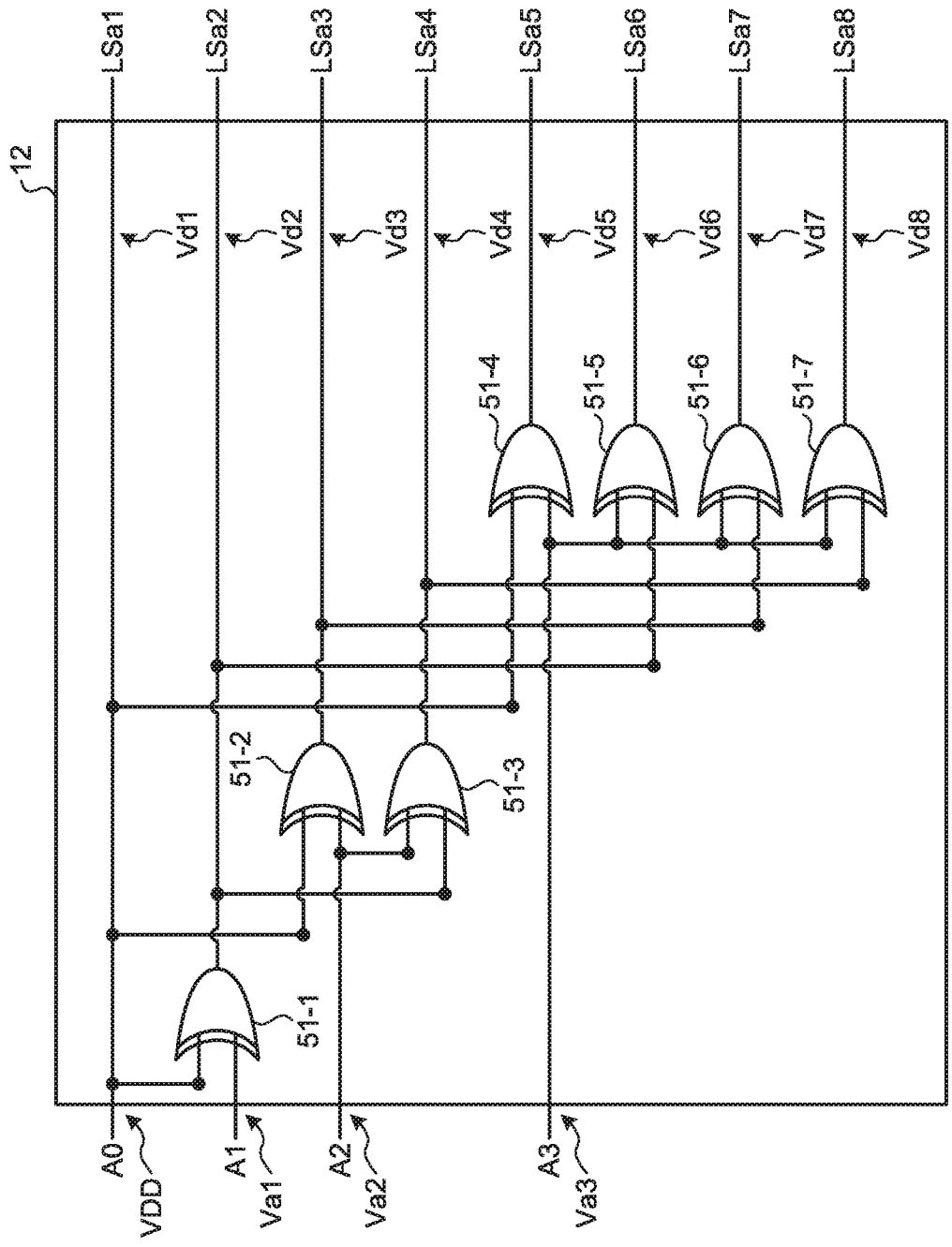
FIG. 18 is a circuit diagram illustrating an exemplary first code generation circuit.

Subsequently, operation of the first code generation circuit 12, the second code generation circuit 13, and the third code generation circuit 14 will be described below. FIG. 18 is a circuit diagram illustrating an exemplary first code generation circuit. FIG. 19 is a table indicating the relation between a first control signal and a first partial selection signal. As illustrated in FIG. 18, the first code generation circuit 12 includes a plurality of exclusive disjunction circuits 51-1, 51-2, . . . , 51-7. The exclusive disjunction circuits 51-1, 51-2, . . . , 51-7 each receive any one of the first control signals Va1, Va2, and Va3, and the power voltage VDD or an output signal from another exclusive disjunction circuit 51. The exclusive disjunction circuits 51-1, 51-2, . . . , 51-7 output the value of exclusive disjunction of input signals to the first selection signal lines LSa2, . . . , LSa8 as first partial selection signals Vd2, Vd3, . . . , Vd8, respectively. A signal same as the power voltage VDD is output to the first selection signal line LSa1 as a first partial selection signal Vd1.

The first code generation circuit 12 generates the first partial selection signals Vd1, Vd2, . . . , Vd8 corresponding to the first control signals Va1, Va2, and Va3 and the power voltage VDD with reference to a truth value table illustrated in FIG. 19. In FIG. 19, "1" is allocated to each high-level voltage signal, and "0" is allocated to each low-level voltage signal. Accordingly, the first code generation circuit 12 outputs the first partial selection signals Vd1, Vd2, . . . , Vd8 having phases determined based on a predetermined code to the drive signal supply line part blocks sBKL. For example, the predetermined code is defined by a square matrix of Expression (3) below. The order of the square matrix is eight, which is the number of the output terminals Ya1, Ya2, . . . , Ya8 of the first code generation circuit 12.

$$\begin{pmatrix} 1 & 1 & 1 & 1 & 1 & 1 & 1 & 1 \\ 1 & 1 & 1 & 1 & -1 & -1 & -1 & -1 \\ 1 & 1 & -1 & -1 & 1 & 1 & -1 & -1 \\ 1 & 1 & -1 & -1 & -1 & -1 & 1 & 1 \\ 1 & -1 & 1 & -1 & 1 & -1 & 1 & -1 \\ 1 & -1 & 1 & -1 & -1 & 1 & -1 & 1 \\ 1 & -1 & -1 & 1 & 1 & -1 & -1 & 1 \\ 1 & -1 & -1 & 1 & -1 & 1 & 1 & -1 \end{pmatrix} \quad (3)$$

The first code generation circuit 12 outputs the first partial selection signals Vd1, Vd2, . . . , Vd8 in each of durations tc1, tc2, . . . , tc8. The pattern of on-off combination of the first partial selection signals Vd1, Vd2, . . . , Vd8 is different among the durations tc1, tc2, . . . , tc8. The number of patterns of on-off combination of the first partial selection signals Vd1, Vd2, . . . , Vd8 is eight, which is the number of the output terminals Ya1, Ya2, . . . , Ya8.

Figure 20:
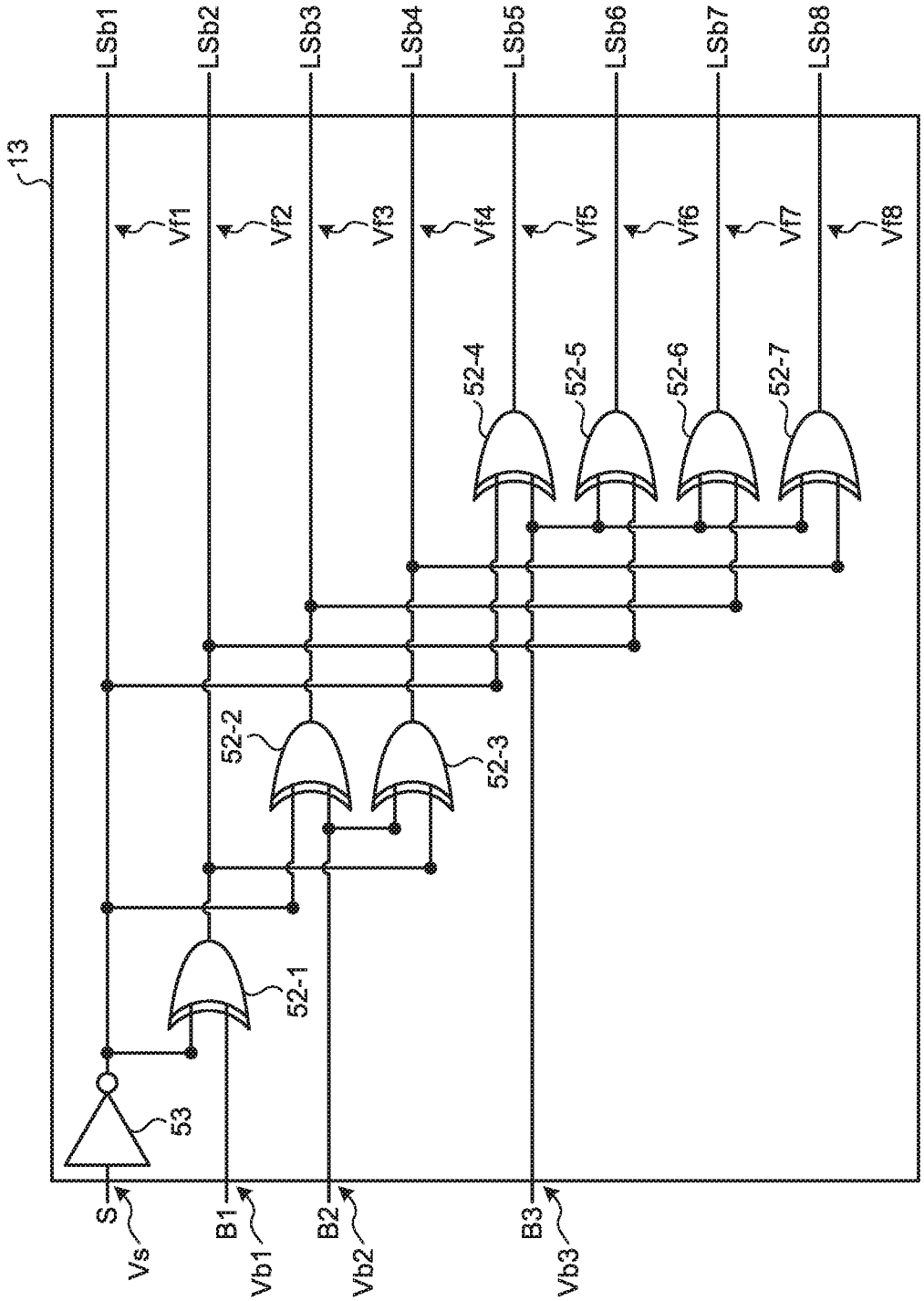
FIG. 20 is a circuit diagram illustrating an exemplary second code generation circuit.
Figures 21, 22:
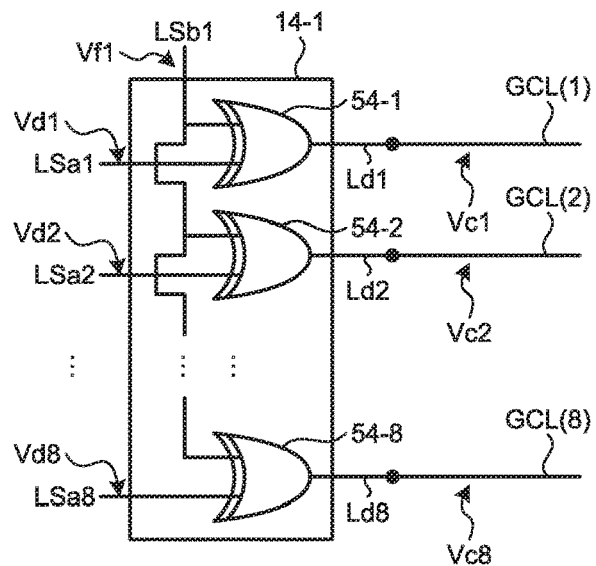
FIG. 21 is a table indicating the relation among a second control signal, an inverted control signal, and a second partial selection signal.
FIG. 22 is a circuit diagram illustrating an exemplary third code generation circuit.

FIG. 20 is a circuit diagram illustrating an exemplary second code generation circuit. FIG. 21 is a table indicating the relation among a second control signal, an inverted control signal, and a second partial selection signal. As illustrated in FIG. 20, the second code generation circuit 13 includes a plurality of exclusive disjunction circuits 52-1, 52-2, . . . , 52-7 and an inverter 53. The inverter 53 is a circuit configured to generate a second partial selection signal Vf1 as a voltage signal obtained by inverting the inverted control signal Vs. The inverter 53 outputs the second partial selection signal Vf1 to the second selection signal line LSb1. Specifically, the inverter 53 outputs a low-level voltage signal when the inverted control signal Vs has high-level voltage, or outputs a high-level voltage signal when the inverted control signal Vs has low-level voltage.

The exclusive disjunction circuits 52-1, 52-2, . . . , 52-7 each receive any one of the second control signals Vb1, Vb2, and Vb3, and an output signal from the inverter 53 or an output signal from another exclusive disjunction circuit 52. The inverted control signal Vs and the second control signals Vb1, Vb2, and Vb3 are output signals from the control signal generation circuit 17 illustrated in FIG. 15. The exclusive disjunction circuits 52-1, 52-2, . . . , 52-7 output the value of exclusive disjunction of input signals to second selection signal lines LSb2, LSb3, . . . , LSb8 as second partial selection signals Vf2, Vf3, . . . , Vf8, respectively. The inverter 53 is not essential, and the second code generation circuit 13 may output the inverted control signal Vs as the second partial selection signal Vf1.

The second code generation circuit 13 generates the second partial selection signal Vf corresponding to the second control signals Vb1, Vb2, and Vb3 and the inverted control signal Vs with reference to a truth value table illustrated in FIG. 21. Accordingly, the second code generation circuit 13 outputs the second partial selection signals Vf1, Vf2, . . . , Vf8 having phases determined based on a predetermined code to the drive signal supply line part blocks sBKL in each of durations td1, td2, . . . , td16. For example, the predetermined code is defined by the square matrix of Expression (2). When the inverted control signal Vs is off ("0"), the second partial selection signals Vf1, Vf2, . . . , Vf8 corresponding to Component "1" of the square matrix are generated. When the inverted control signal Vs is on ("1"), the second partial selection signals Vf1, Vf2, . . . , Vf8 corresponding to Component "−1" of the square matrix are generated.

The second code generation circuit 13 outputs the second partial selection signals Vf1, Vf2, . . . , Vf8 through the output terminals Yb1, Yb2, . . . , Yb8 in each of the durations td1, td2, . . . , td16. The pattern of on-off combination of the second partial selection signals Vf1, Vf2, . . . , Vf8 is different among the durations td1, td2, . . . , td16.

The second code generation circuit 13, to which the inverted control signal Vs is input, includes the pattern of inverted on-off combination of the second partial selection signals Vf1, Vf2, . . . , Vf8. Specifically, the inverted control signal Vs is off in the durations td1, td3, td5, td7, td9, td11, td13, and td15, and the inverted control signal Vs is on in the durations td2, td4, td6, td8, td10, td12, td14, td16. For example, the pattern of on-off combination of the second partial selection signals Vf1, Vf2, . . . , Vf8 is inverted between the durations td1 and td2. Accordingly, the number of patterns of on-off combination of the second partial selection signals Vf1, Vf2, . . . , Vf8 is 16, which is twice the number of the output terminals Yb1, Yb2, . . . , Yb8.

Figure 23:
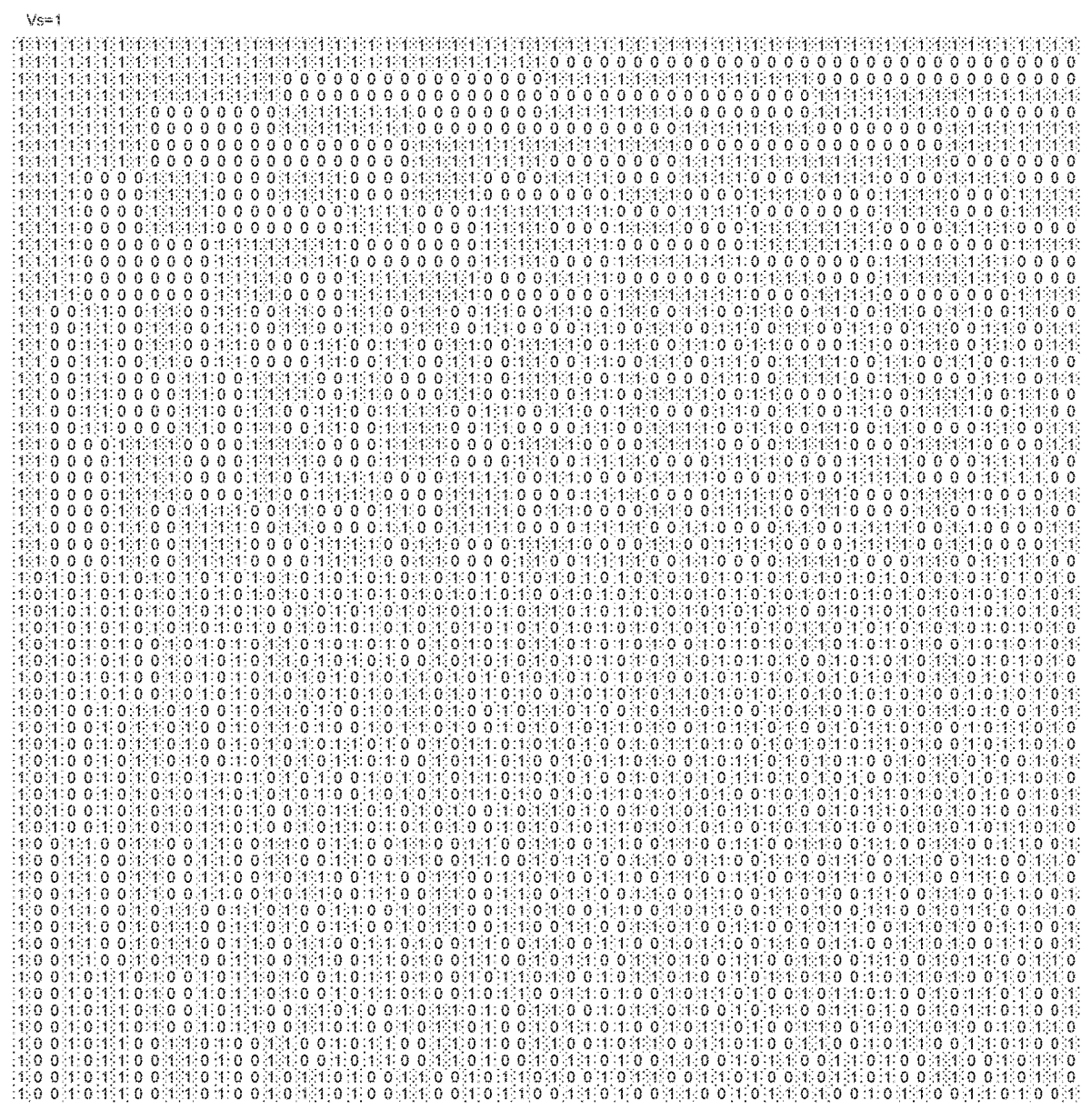
Figure 24:
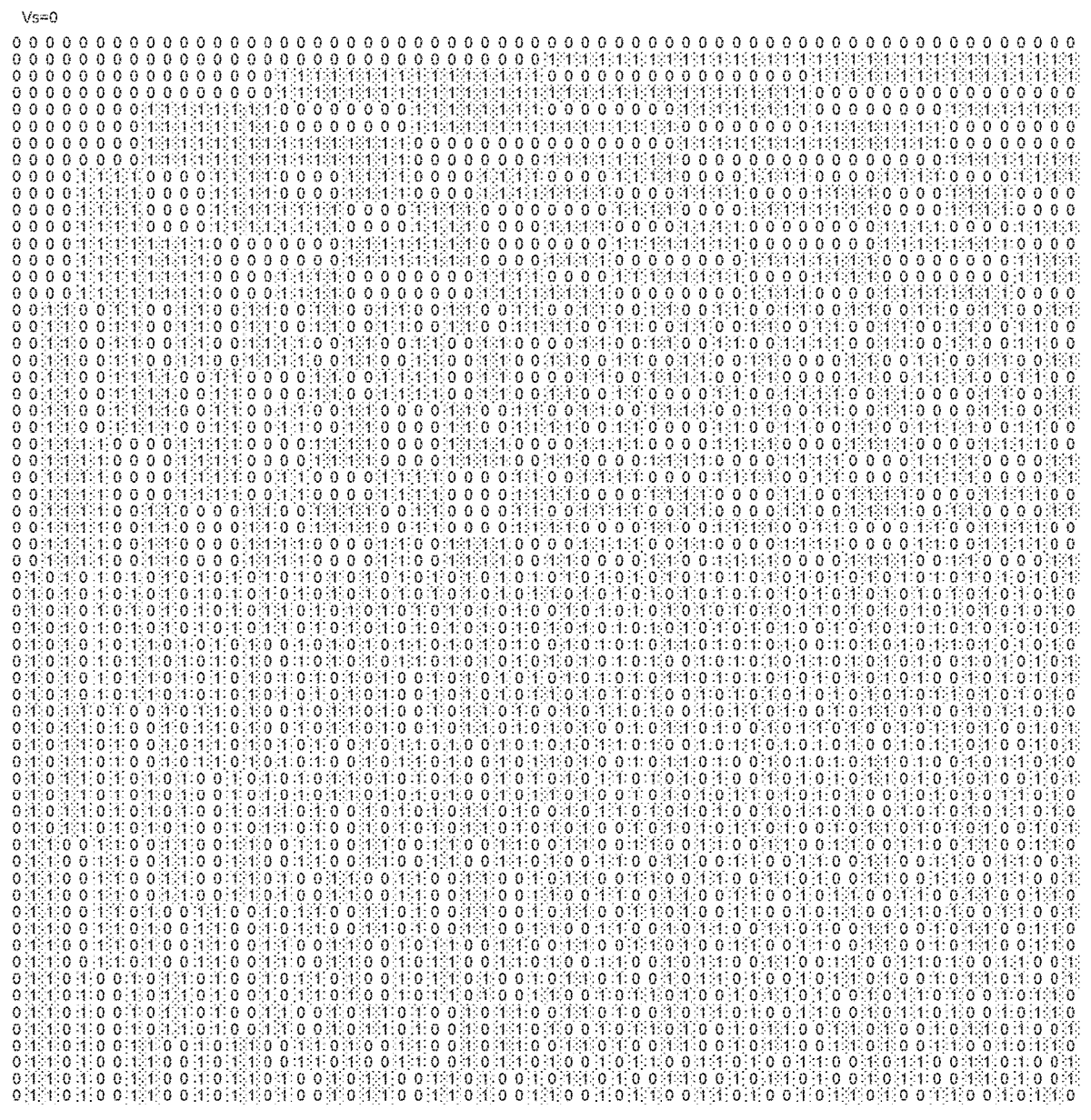

FIG. 22 is a circuit diagram illustrating an exemplary third code generation circuit. FIG. 23 is a diagram illustrating an exemplary pattern code generated by the third code generation circuit when the inverted control signal has high-level voltage. FIG. 24 is a diagram illustrating an exemplary pattern code generated by the third code generation circuit when the inverted control signal has low-level voltage. FIG. 25 is a table indicating the relation among a first control signal, a second control signal, and an inverted control signal.

FIG. 22 illustrates the third code generation circuit 14-1 provided to the drive signal supply line part block sBKL1 among the plurality of drive signal supply line part blocks sBKL. As illustrated in FIG. 22, the third code generation circuit 14-1 includes a plurality of exclusive disjunction circuits 54 (exclusive disjunction circuits 54-1, 54-2, . . . , 54-8). The exclusive disjunction circuits 54-1, 54-2, . . . , 54-8 receive the first partial selection signals Vd1, Vd2, Vd8, respectively, from the first code generation circuit 12. The exclusive disjunction circuits 54-1, 54-2, . . . , 54-8 also receive the second partial selection signal Vf1 from the second code generation circuit 13. The exclusive disjunction circuits 54-1, 54-2, . . . , 54-8 each calculate exclusive disjunction of a corresponding one of the first partial selection signals Vd1, Vd2, Vd8 and the second partial selection signal Vf1. The values calculated by the exclusive disjunction circuits 54-1, 54-2, . . . , 54-8 are supplied as first selection signals Vc to the gate lines GCL(1), GCL(2), . . . , GCL(8) through the drive signal supply lines Ld1, Ld2, . . . , Ld8.

Similarly, the third code generation circuits 14-2, 14-3, . . . , 14-8 illustrated in FIG. 16 calculate exclusive disjunction of each of the first partial selection signals Vd1, Vd2, . . . , Vd8 and a corresponding one of the second partial selection signals Vf2, Vf3, . . . , Vf8 input to the circuit.

As illustrated in FIG. 19, the number of patterns of combination of the first partial selection signals Vd is eight. In addition, as illustrated in FIG. 21, the number of patterns of combination of the second partial selection signals Vf is eight for each case in which the inverted control signal Vs is "0" or "1", and thus is 16 in total. Accordingly, as illustrated in FIG. 23, the order of a pattern code (predetermined code) of the first partial selection signals Vd generated by the third code generation circuit 14 is 8×8=64 when the inverted control signal Vs is "1". Similarly, as illustrated in FIG. 24, the order of a pattern code of the first partial selection signals Vd generated by the third code generation circuit 14 is 8×8=64 when the inverted control signal Vs is "0". Components "0" and "1" in the pattern code illustrated in FIG. 23 are inverted in the pattern code illustrated in FIG. 24.

The first code generation circuit 12, the second code generation circuit 13, and the third code generation circuit 14 generate first selection signals Vc in accordance with the pattern codes illustrated in FIGS. 23 and 24 with reference to a truth value table illustrated in FIG. 25. The gate line drive circuit 15 generates a high-level voltage signal as a first selection signal Vc corresponding to Component "1" of the pattern code. The gate line drive circuit 15 generates a low-level voltage signal as a first selection signal Vc corresponding to Component "0" of the pattern code. Accordingly, the first gate drive signal VGH is supplied to a gate line GCL corresponding to Component "1" of the pattern code, and the second gate drive signal VGL is supplied to a gate line GCL corresponding to Component "0" of the pattern code.

As illustrated in FIG. 25, a duration in which the inverted control signal Vs is "1" and a duration in which the inverted control signal Vs is "0" are alternately executed. Accordingly, the interval between detection times of the first output signal Svh(1) and the second output signal Svh(2) is short. With this configuration, when a noise component is applied from the outside, the noise component is canceled by calculating the difference between the first output signal Svh(1) and the second output signal Svh(2). Thus, the detection device 1 can achieve improved detection accuracy.

The order of combinations of the first partial selection signals Vd and the second partial selection signals Vf is not limited to that illustrated in FIG. 25. For example, a plurality of durations in which the inverted control signal Vs is "1" may be continuously executed and then a plurality of durations in which the inverted control signal Vs is "0" may be continuously executed.

As described above, the detection device 1 of the present embodiment includes the substrate 21, the organic material layer 31 provided above the substrate 21 and configured to detect a predetermined physical quantity, the detection electrodes 24 provided between the substrate 21 and the organic material layer 31 in a direction orthogonal to the substrate 21, the first switching element Tr provided to each detection electrode 24, the gate lines GCL coupled with the first switching elements Tr and extending in the first direction Dx, the signal lines SGL coupled with the first switching elements Tr and extending in the second direction Dy intersecting the first direction Dx, and a drive circuit (the gate line drive circuit 15). The gate line drive circuit 15 supplies gate drive signals (the first gate drive signal VGH and the second gate drive signal VGL) having potentials determined based on a predetermined code to the respective first switching elements Tr through the respective gate lines GCL.

Accordingly, CDM drive of the first detection electrode blocks BKx (refer to FIG. 10) is performed by the gate line drive circuit 15. This leads to increased detection accuracy when the value of current flowing from the organic material layer 31 to the detection electrodes 24 in accordance with incident light is small. In addition, according to the present embodiment, it is possible to reduce signal delay and increase the detection accuracy as compared to a case in which the first selection signals Vc are supplied to all gate lines GCL by, for example, a shift register.

In the present embodiment, the gate line drive circuit 15 and the control signal generation circuit 17 are provided to the substrate 21. This leads to reduction of the number of terminals coupling the substrate 21 and the control substrate 101. Accordingly, the detection device 1 can have the gate line drive circuit 15 of a reduced circuit size, which leads to reduction of manufacturing cost.

In the present embodiment, the third code generation circuit 14 may calculate exclusive negative disjunction (Xnor) of the first partial selection signal Vd and the second partial selection signal Vf. Alternatively, the third code generation circuit 14 may perform calculation equivalent to logic calculation of exclusive negative disjunction or another negative disjunction. Similarly, the configurations of the first code generation circuit 12 and the second code generation circuit 13 may be changed as appropriate.

Figure 26:
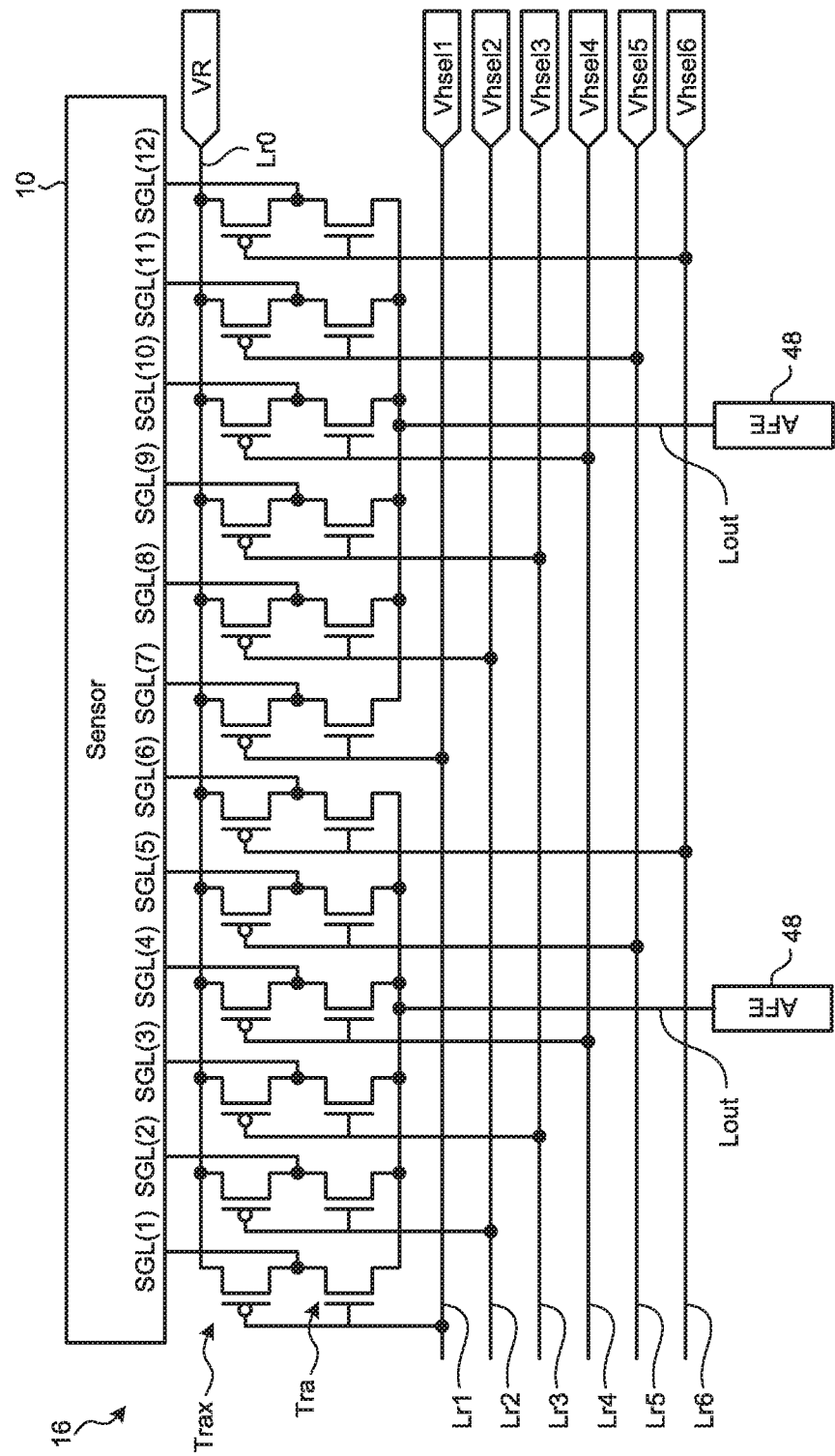
FIG. 26 is a circuit diagram illustrating the signal line selection circuit.

Subsequently, the signal line selection circuit 16 will be described below. FIG. 26 is a circuit diagram illustrating the signal line selection circuit. FIG. 26 illustrates 12 signal lines SGL(1) to SGL(12). The signal line selection circuit 16 includes a third switching element Tra, a fourth switching element Trax, a reference signal supply line Lr0, third selection signal lines Lr1, Lr2, . . . , Lr6, and an output signal line Lout.

One output signal line Lout is provided for the signal lines SGL(1) to SGL(6). One output signal line Lout is provided for the signal lines SGL(7) to SGL(12). Each output signal line Lout is coupled with the AFE 48. The signal line selection circuit 16 couples any selected signal line SGL among the signal lines SGL with the AFE 48 based on a signal line selection signal Vhsel. Accordingly, the signal line selection circuit 16 selects detection electrodes 24 (second detection electrode block BKy) as detection targets.

The signal line selection signal Vhsel is output from, for example, a code generation circuit (not illustrated) same as the second code generation circuit 13 illustrated in FIG. 20. The code generation circuit configured to generate the signal line selection signal Vhsel may be included in the signal line selection circuit 16. In this case, the code generation circuit is provided to the substrate 21, to which the signal line selection circuit 16 is provided. The signal line selection circuit 16 may include no code generation circuit. In this case, the external control substrate 101 may include a code generation circuit and output the signal line selection signal Vhsel.

The signal line selection signal Vhsel is a voltage signal having a phase determined for each signal line SGL based on a predetermined code. The predetermined code is defined by the square matrix of Expression (3). In the example illustrated in FIG. 26, six signal line selection signals Vhsel1, Vhsel2, . . . , Vhsel6 are supplied to the third selection signal lines Lr1, Lr2, . . . , Lr6, respectively. The signal line selection signals Vhsel1, Vhsel2, . . . , Vhsel6 are generated based on, for example, six optional components among eight components included in each row of Expression (3). The signal line selection signals Vhsel1, Vhsel2, . . . , Vhsel6 are supplied to the third switching elements Tra and the fourth switching elements Trax through the third selection signal lines Lr1, Lr2, . . . , Lr6.

Each signal line SGL is coupled with the corresponding third switching element Tra and the corresponding fourth switching element Trax. The third switching element Tra and the fourth switching element Trax are oppositely turned on and off when supplied with the same signal line selection signal Vhsel. Specifically, when the third switching element Tra is on, the fourth switching element Trax is off. When the third switching element Tra is off, the fourth switching element Trax is on.

The state of coupling between the signal line SGL and the corresponding output signal line Lout is switched through operation of the third switching element Tra and the fourth switching element Trax. The signal line SGL is coupled with the output signal line Lout when the third switching element Tra is on, and the signal line SGL is coupled with the reference signal supply line Lr0 when the fourth switching element Trax is on.

The third switching element Tra is turned on when supplied with the signal line selection signal Vhsel as a high-level voltage signal corresponding to Component "1" of Expression (3). The fourth switching element Trax is turned on when supplied with the signal line selection signal Vhsel as a low-level voltage signal corresponding to Component "−1" of Expression (3). Accordingly, similarly to the exemplary operation of CDM drive illustrated in FIG. 12, a second detection electrode block BKy coupled with the signal line SGL is selected based on the predetermined code.

Specifically, when signal lines SGL corresponding to Component "1" of Expression (3) are selected, the selected signal lines SGL are coupled with an output signal line Lout common to the signal lines. A first output signal Sh(1) of a second detection electrode block BKy coupled with each selected signal line SGL is output to the AFE 48 through the output signal line Lout. Any non-selected signal line SGL is coupled with the reference signal supply line Lr0 and supplied with the reference signal VR. This configuration can reduce capacitive coupling between a selected detection electrode 24 and a non-selected detection electrode 24. Thus, it is possible to reduce detection error and detection sensitivity decrease.

When signal lines SGL corresponding to Component "−1" of Expression (3) are selected, the selected signal lines SGL are coupled with the output signal line Lout. A second output signal Sh(2) of a second detection electrode block BKy coupled with each selected signal line SGL is output through the output signal line Lout. Any non-selected signal line SGL is coupled with the reference signal supply line Lr0 and supplied with the reference signal VR. The signal processor 44 calculates a third output signal Sh(3) as the difference between the first output signal Sh(1) and the second output signal Sh(2). The signal processor 44 can calculate a decoding signal for each second detection electrode block BKy by decoding the third output signal Sh(3).

Figure 27:
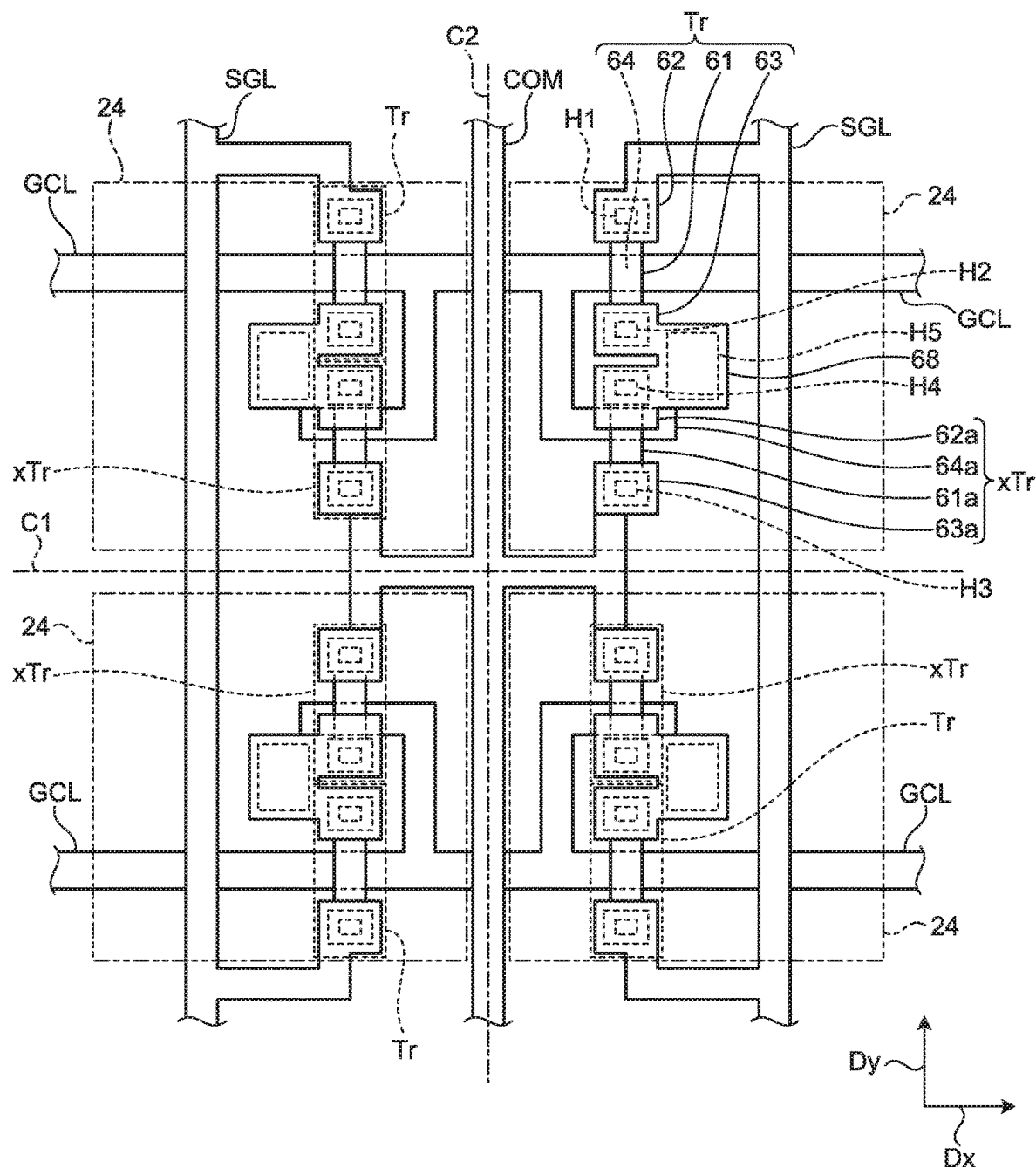
FIG. 27 is a plan view illustrating the relation among a detection electrode, a first switching element, and a second switching element.
Figure 28:
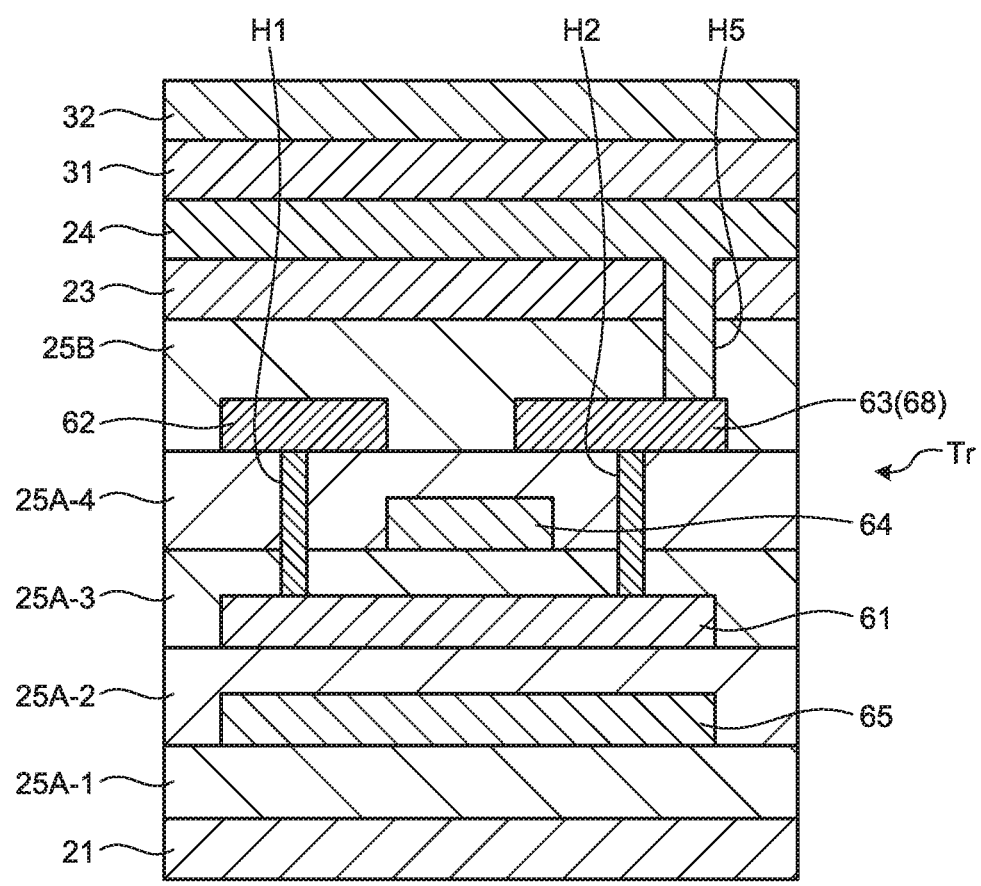
FIG. 28 is a cross-sectional view illustrating a schematic section configuration of the first switching element.

Subsequently, exemplary configurations of each first switching element Tr and each second switching element xTr will be described below. FIG. 27 is a plan view illustrating the relation among a detection electrode, a first switching element, and a second switching element. FIG. 28 is a cross-sectional view illustrating a schematic section configuration of the first switching element. In FIG. 27, each detection electrode 24 is illustrated with dashed and double-dotted lines to simplify the drawing.

As illustrated in FIG. 27, the first switching element Tr includes a semiconductor layer 61, a source electrode 62, a drain electrode 63, and a gate electrode 64. The semiconductor layer 61 is made of, for example, low-temperature polycrystalline silicon. The semiconductor layer 61 extends in the second direction Dy and intersects a gate line GCL in plan view. Part of the gate line GCL, which overlaps the semiconductor layer 61 functions as the gate electrode 64. A channel region is formed at part of the semiconductor layer 61, which overlaps the gate line GCL. One end of the semiconductor layer 61 is coupled with the source electrode 62 through a contact hole H1. The other end of the semiconductor layer 61 is coupled with the drain electrode 63 through a contact hole H2.

The source electrode 62 is electrically coupled with a signal line SGL. The drain electrode 63 is electrically coupled with a coupling unit 68. The coupling unit 68 is coupled with a detection electrode 24 through a contact hole H5. The gate electrode 64 is electrically coupled with the gate line GCL. With such a configuration, the first switching element Tr can switch coupling and cutoff between the detection electrode 24 and the signal line SGL.

The second switching element xTr includes a semiconductor layer 61a, a source electrode 62a, a drain electrode 63a, and a gate electrode 64a. The semiconductor layer 61a extends in the second direction Dy and intersects the gate electrode 64a in plan view. A channel region is formed at part of the semiconductor layer 61a, which overlaps the gate electrode 64a. One end of the semiconductor layer 61a is coupled with the source electrode 62a through a contact hole H4. The other end of the semiconductor layer 61a is coupled with the drain electrode 63a through a contact hole H3.

The source electrode 62a is electrically coupled with the coupling unit 68. Accordingly, the source electrode 62a of the second switching element xTr and the drain electrode 63 of the first switching element Tr are coupled with the detection electrode 24 through the coupling unit 68 common thereto. The drain electrode 63a is electrically coupled with the reference signal line COM. The gate electrode 64a is coupled with the gate line GCL. In other words, the gate line GCL has functions of the gate electrode 64 of the first switching element Tr and the gate electrode 64a of the second switching element xTr. With such a configuration, the second switching element xTr can switch coupling and cutoff between the detection electrode 24 and the reference signal line COM.

The first switching elements Tr provided to respective detection electrodes 24 adjacent to each other in the second direction Dy have line symmetric configurations with Reference Line C1 as the axis of symmetry. Similarly, the second switching elements xTr have line symmetric configurations with Reference Line C1 as the axis of symmetry. The Reference Line C1 is a virtual line extending in the first direction Dx between the detection electrodes 24 adjacent to each other in the second direction Dy. The gate lines GCL overlap the detection electrodes 24. The gate lines GCL are disposed at line symmetric positions with Reference Line C1 as the axis of symmetry. The first switching elements Tr corresponding to the respective detection electrodes 24 are provided side by side in the second direction Dy between gate lines GCL adjacent to each other in the second direction Dy. In the present embodiment, the relative position of each gate line GCL with respect to the corresponding detection electrode 24 in the second direction Dy is different between the detection electrodes 24 adjacent to each other in the second direction Dy.

The first switching elements Tr provided to respective detection electrodes 24 adjacent to each other in the first direction Dx have line symmetric configurations with Reference Line C2 as the axis of symmetry. Similarly, the second switching elements xTr have line symmetric configurations with Reference Line C2 as the axis of symmetry. Reference Line C2 is a virtual line extending in the second direction Dy between the detection electrodes 24 adjacent to each other in the first direction Dx. Reference Line C2 is a line overlapping the reference signal line COM. The second switching elements xTr provided to respective detection electrodes 24 adjacent to each other in the first direction Dx are coupled with the reference signal line COM common thereto. With this configuration, the number of reference signal lines COM is halved as compared to a case in which the reference signal line COM is provided to each detection electrode 24 and the corresponding second switching element xTr arrayed in the first direction Dx. Accordingly, the detection device 1 can have the detection region AA of an increased opening area, which leads to improved detection performance. The opening area is the area of a region in which light transmission is not shielded by various wires such as signal lines SGL, the first and second switching elements Tr and xTr, and the like.

The signal lines SGL overlap the detection electrodes 24. The signal lines SGL are disposed at line symmetric positions with Reference Line C2 as the axis of symmetry. The first switching elements Tr corresponding to the respective detection electrodes 24 are provided side by side in the first direction Dx between signal lines SGL adjacent to each other in the first direction Dx. The second switching elements xTr corresponding to the respective detection electrodes 24 are provided side by side in the first direction Dx between the signal lines SGL adjacent to each other in the first direction Dx. In the present embodiment, the relative position of each signal line SGL with respect to the corresponding detection electrode 24 in the first direction Dx is different between the detection electrodes 24 adjacent to each other in the first direction Dx.

As illustrated in FIG. 28, a light-shielding layer 65, the semiconductor layer 61, the gate electrode 64, the source electrode 62, the drain electrode 63, and the detection electrode 24 are provided in the stated order on one surface of the substrate 21. Each first switching element Tr has what is called a top gate structure. In other words, the semiconductor layer 61 is provided between the substrate 21 and the gate electrode 64 in the direction orthogonal to the substrate 21.

The light-shielding layer 65 is provided on the one surface (upper surface) of the substrate 21 through a first insulating layer 25A-1. The light-shielding layer 65 overlaps at least a channel region of the semiconductor layer 61. The light-shielding layer 65 is made of metallic material such as molybdenum (Mo), tungsten (W), aluminum (Al), titanium (Ti), or silver (Ag). With this configuration, the light-shielding layer 65 can shield light incident on the semiconductor layer 61 from the other surface (lower surface) of the substrate 21. Accordingly, the first switching element Tr can reduce leakage current. The detection device 1 can excellently detect light incident from the other surface of the substrate 21.

A second insulating layer 25A-2 covers the light-shielding layer 65 and is provided on the first insulating layer 25A-1. The semiconductor layer 61 is provided on the second insulating layer 25A-2. A third insulating layer 25A-3 is provided on the semiconductor layer 61. The gate electrode 64 is provided on the third insulating layer 25A-3. The gate electrode 64 is provided in a layer in which the gate line GCL (refer to FIG. 27) is provided. A fourth insulating layer 25A-4 as a gate insulating layer is provided on the gate electrode 64.

The source electrode 62 and the drain electrode 63 are provided on the fourth insulating layer 25A-4. The source electrode 62 and the drain electrode 63 are provided in a layer in which the signal line SGL (refer to FIG. 27) is provided. The source electrode 62 is coupled with the semiconductor layer 61 through the contact hole H1 provided to the third insulating layer 25A-3 and the fourth insulating layer 25A-4. Similarly, the drain electrode 63 is coupled with the semiconductor layer 61 through the contact hole H2 provided to the third insulating layer 25A-3 and the fourth insulating layer 25A-4.

The detection electrode 24 is provided above the source electrode 62 and the drain electrode 63 through the hard coat layer 25B and the insulating layer 23. The organic material layer 31 and the drive electrode 32 are provided on the detection electrode 24. In FIG. 28, the protective layer 33 (refer to FIG. 5) is omitted from illustration. With such a laminated structure, the first switching element Tr can switch coupling and cutoff between the detection electrode 24 and the signal line SGL. The second switching element xTr has a laminated structure same as that of the first switching element Tr. The semiconductor layer 61a, the source electrode 62a, the drain electrode 63a, and the gate electrode 64a of the second switching element xTr are provided in layers in which the semiconductor layer 61, the source electrode 62, the drain electrode 63, and the gate electrode 64 of the first switching element Tr are provided, respectively.

Second Embodiment

Figure 29:
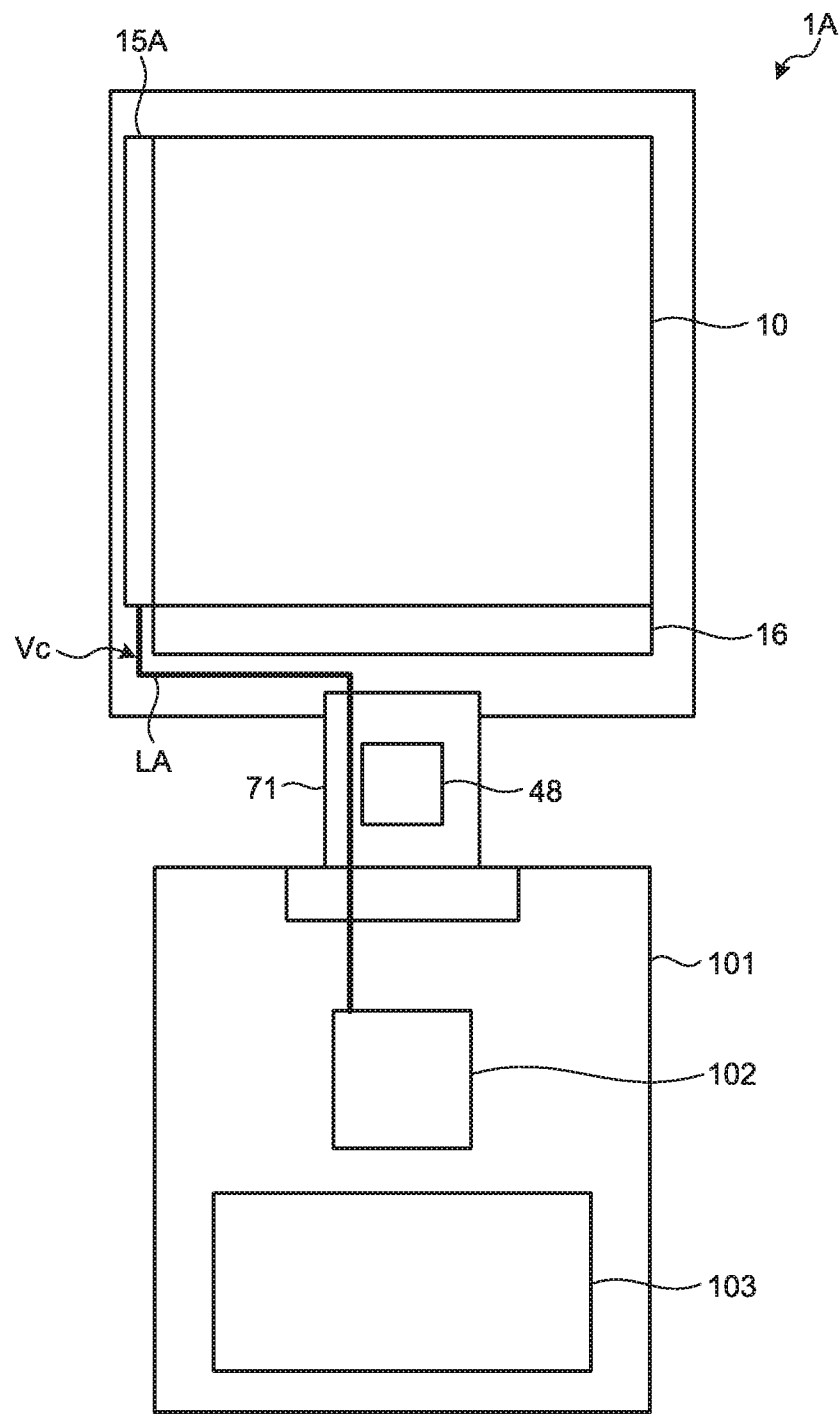
FIG. 29 is a plan view illustrating a detection device according to a second embodiment.
Figure 30:
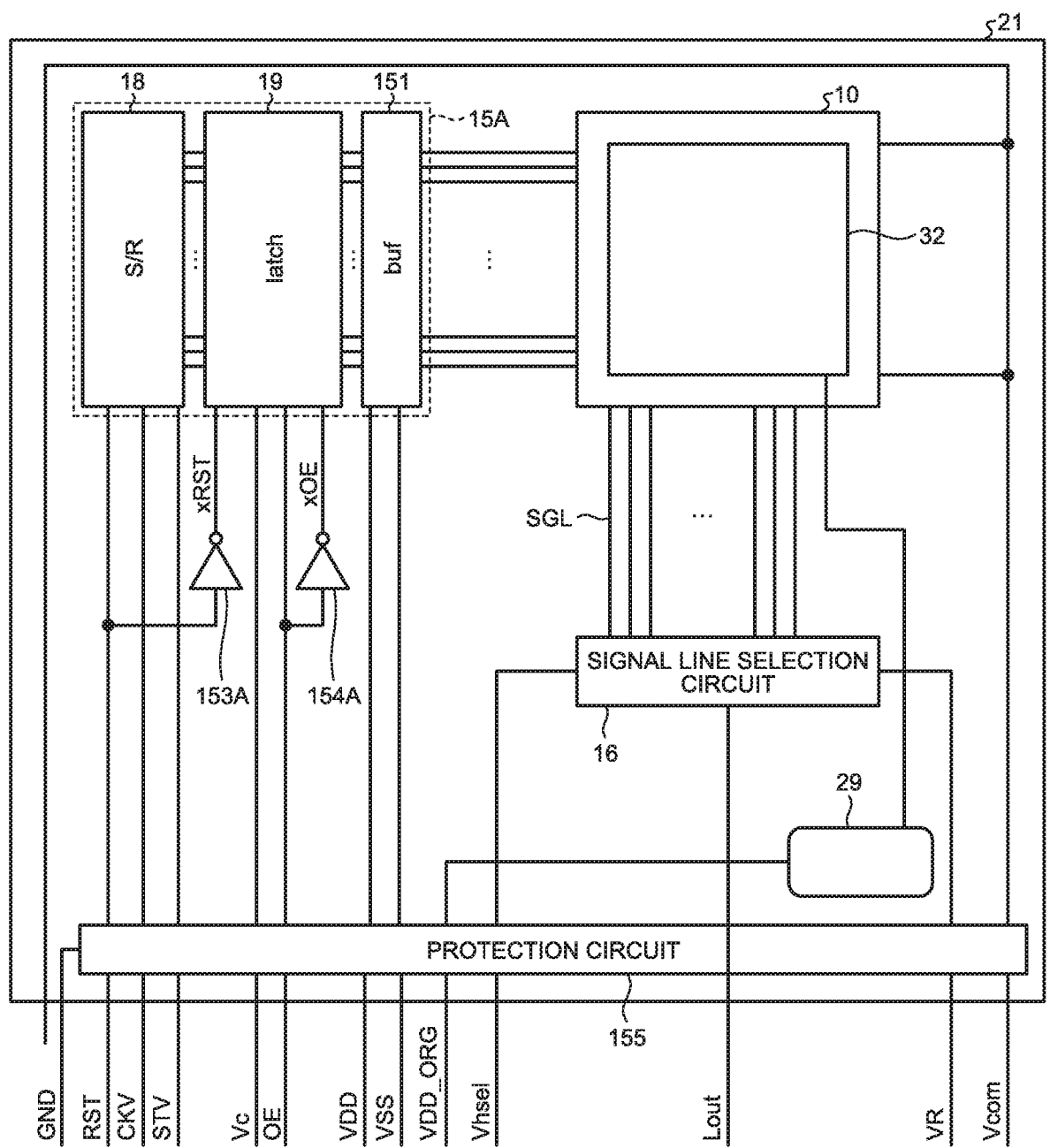
FIG. 30 is a block diagram illustrating an exemplary configuration of the sensor unit, a gate line drive circuit, and the signal line selection circuit according to the second embodiment.
Figure 31:
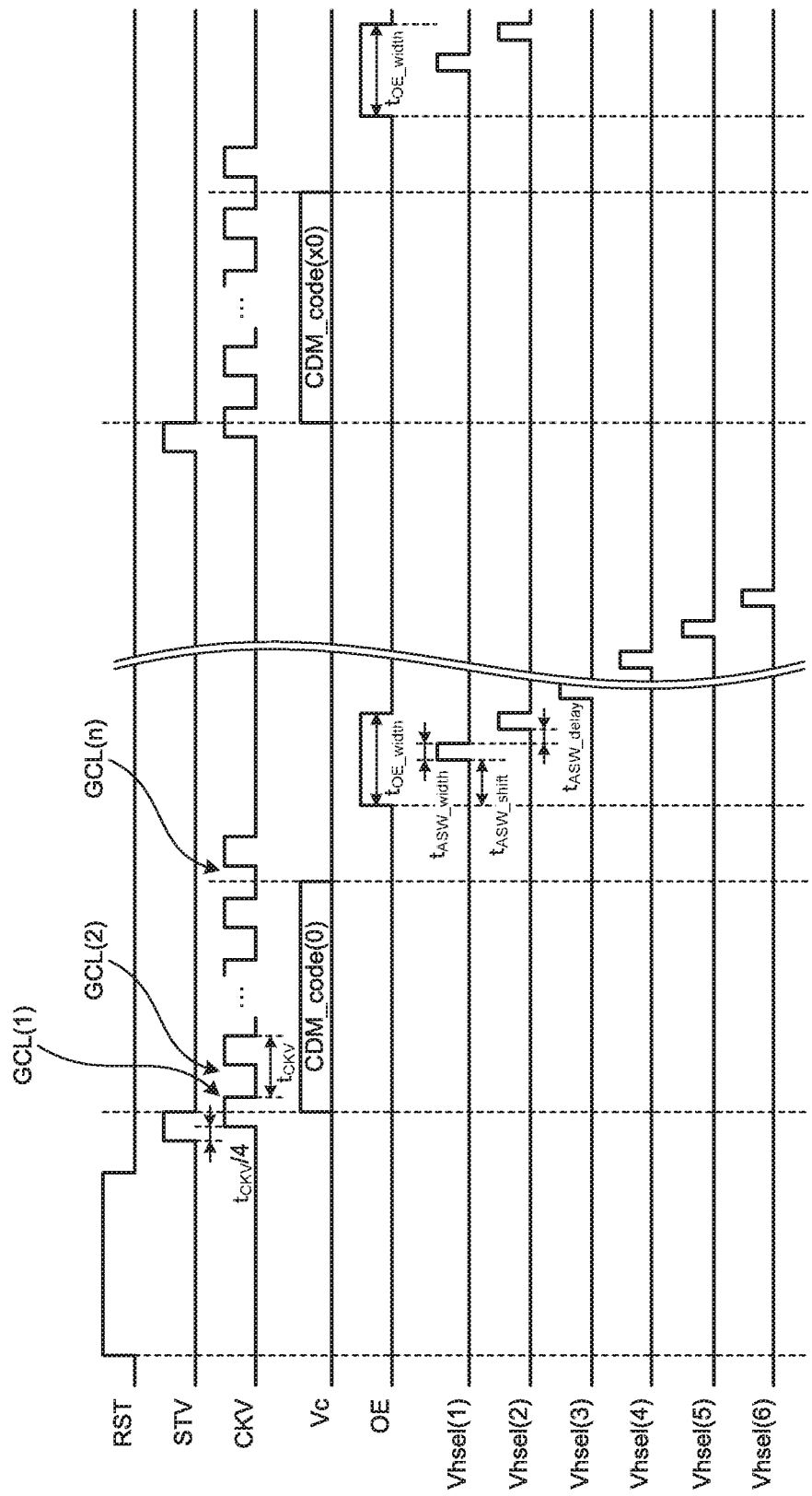
FIG. 31 is a timing waveform diagram illustrating exemplary operation of the detection device according to the second embodiment.

FIG. 29 is a plan view illustrating a detection device according to a second embodiment. FIG. 30 is a block diagram illustrating an exemplary configuration of the sensor unit, a gate line drive circuit, and the signal line selection circuit according to the second embodiment. FIG. 31 is a timing waveform diagram illustrating exemplary operation of the detection device according to the second embodiment.

In a detection device 1A of the present embodiment, a gate line drive circuit 15A does not include the first code generation circuit 12, the second code generation circuit 13, and the third code generation circuit 14. In the present embodiment, the control substrate 101 is provided with a code generation circuit. For example, the control circuit 102 has functions of the code generation circuit and generates each first selection signal Vc having a phase determined based on a predetermined code. The control circuit 102 supplies the first selection signal Vc to the gate line drive circuit 15A through a wire LA.

As illustrated in FIG. 30, the gate line drive circuit 15A includes a shift register 18, a latch circuit 19, and the buffer circuit 151. The shift register 18 operates based on a reset signal RST, a clock signal CKV, and a start signal STV supplied from the control substrate 101. The shift register 18 includes a shift signal output circuit corresponding to each gate line GCL. The shift register 18 sequentially outputs shift signals for the respective gate lines GCL to the latch circuit 19.

As illustrated in FIG. 31, the shift register 18 resets the shift signal output circuits when the reset signal RST is turned on (high-level voltage). Then, the shift register 18 starts operation based on the start signal STV. The shift signal output circuits sequentially output shift signals to the latch circuit 19 based on the clock signal CKV. Pulses of the clock signal CKV correspond to the gate lines GCL(1), GCL(2), GCL(n). A period $t_{CKV}$ of the clock signal CKV may be changed as appropriate in accordance with a time needed for detection. The clock signal CKV is supplied at a timing when, for example, a ¼ duration ($t_{CKV}/4$) of the period $t_{CKV}$ has elapsed since the rise timing of the start signal STV.

As illustrated in FIG. 30, the latch circuit 19 operates based on the shift signals from the shift register 18, the inverted reset signal xRST, the first selection signals Vc, a control signal OE, and an inverted control signal xOE. The inverted reset signal xRST is a signal obtained by inverting the reset signal RST through an inverter 153A. The inverted control signal xOE is a signal obtained by inverting the control signal OE through an inverter 154A. The control signal OE is a signal for controlling signal output from the latch circuit 19 to the buffer circuit 151.

As illustrated in FIG. 31, the latch circuit 19 sequentially holds the first selection signals Vc in accordance with the shift signals from the shift register 18. Each first selection signal Vc is a signal having a potential determined for the corresponding gate line GCL in accordance with, for example, the pattern code (predetermined code) illustrated in FIG. 23.

When the control signal OE is turned on, the latch circuit 19 outputs each first selection signal Vc to the buffer circuit 151. The buffer circuit 151 changes the voltage level of the first selection signal Vc based on the power voltages VDD and VSS. Accordingly, the buffer circuit 151 outputs the first gate drive signal VGH or the second gate drive signal VGL corresponding to the first selection signal Vc to the sensor unit 10.

In addition, when the control signal OE is turned on, the control substrate 101 sequentially supplies signal line selection signals Vhsel(1), Vhsel(2), . . . , Vhsel(6) to the signal line selection circuit 16. The signal line selection signals Vhsel(1), Vhsel(2), . . . , Vhsel(6) are signals corresponding to rows of the square matrix of Expression (3). Accordingly, similarly to the first embodiment, the signal line selection circuit 16 performs CDM drive.

As illustrated in FIG. 31, in a duration $t_{ASW\_width}$ in which each signal line selection signal Vhsel is on, a selected signal line SGL is coupled with the AFE 48. In a duration in which the signal line selection signal Vhsel is off (low-level voltage), the signal line SGL is cut off from the AFE 48. A duration $t_{ASW\_shift}$ is a duration until the signal line selection signal Vhsel is turned on after the rise timing of the control signal OE. A duration $t_{ASW\_delay}$ is a duration from the fall timing of the signal line selection signal Vhsel to the rise timing of the next signal line selection signal Vhsel. The duration $t_{ASW\_width}$, the duration $t_{ASW\_delay}$, and the like may be changed as appropriate in accordance with a time needed for detection.

After all signal line selection signals Vhsel(1), Vhsel(2) . . . Vhsel(6) are supplied to the signal line selection circuit 16, the gate line drive circuit 15A supplies the first gate drive signal VGH and the second gate drive signal VGL to the sensor unit 10 based on the next first selection signal Vc. In this case, the first selection signal Vc is a signal having a potential determined for each gate line GCL in accordance with, for example, the pattern code (predetermined code) illustrated in FIG. 24.

The timing waveform diagram illustrated in FIG. 31 is merely exemplary. For example, the shift register 18 and the latch circuit 19 may perform operation to hold the next first selection signal Vc in a duration in which a plurality of signal line selection signals Vhsel are supplied to the signal line selection circuit 16 after the control signal OE is turned off.

Third Embodiment

Figure 32:
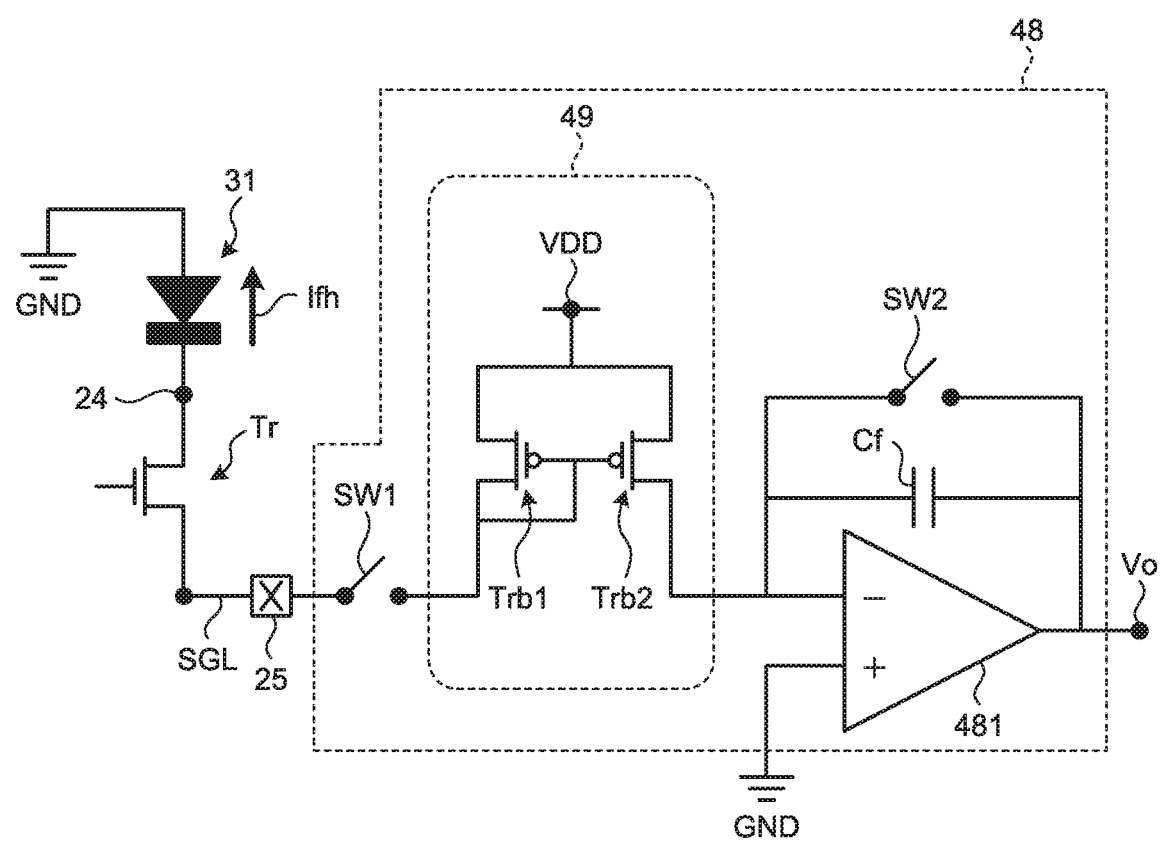
FIG. 32 is a circuit diagram illustrating the AFE and an inverting circuit according to a third embodiment.

FIG. 32 is a circuit diagram illustrating the AFE and an inverting circuit according to a third embodiment. In the present embodiment, each detection electrode 24, the drive electrode 32, the configurations of each first switching element Tr, each second switching element xTr, the gate line drive circuit 15, the signal line selection circuit 16, and the like are same as those in the first embodiment described above, and thus detailed description thereof will be omitted. In the present embodiment, the detection electrode 24 is a cathode and the drive electrode 32 (refer to FIG. 5) is an anode. In other words, the orientation in which the current Ifh flows is opposite to that in the first embodiment. Thus, an inverting circuit 49 is provided between a signal line SGL and the amplifier 481. The inverting circuit 49 is disposed in the AFE 48 in FIG. 32 but may be provided on the substrate 21 side.

The inverting circuit 49 is a circuit configured to invert the current Ifh flowing through the signal line SGL and output the inverted current Ifh to the amplifier 481. The inverting circuit 49 is what is called a current mirror circuit. The inverting circuit 49 includes a fifth switching element Trb1 and a sixth switching element Trb2. The fifth switching element Trb1 and the sixth switching element Trb2 are each achieved by, for example, a p-channel MOS TFT.

The gate of the fifth switching element Trb1 and the gate of the sixth switching element Trb2 are electrically coupled with the common signal line SGL through the first switch SW1. The source of the fifth switching element Trb1 is electrically coupled with the signal line SGL through the first switch SW1. The drain of the fifth switching element Trb1 and the drain of the sixth switching element Trb2 are supplied with the common power voltage VDD. The source of the sixth switching element Trb2 is coupled with the input of the amplifier 481 of the AFE 48.

With such a configuration, the direction of the current Ifh is inverted by the inverting circuit 49, and current having a magnitude same as that of the current Ifh flows to the amplifier 481 of the AFE 48. The AFE 48 performs operation same as that in the first embodiment. Accordingly, when the detection electrode 24 is a cathode and the drive electrode 32 is an anode, as well, the AFE 48 can detect the current Ifh output from the detection electrode 24 in accordance with incident light.

Fourth Embodiment

Figure 33:
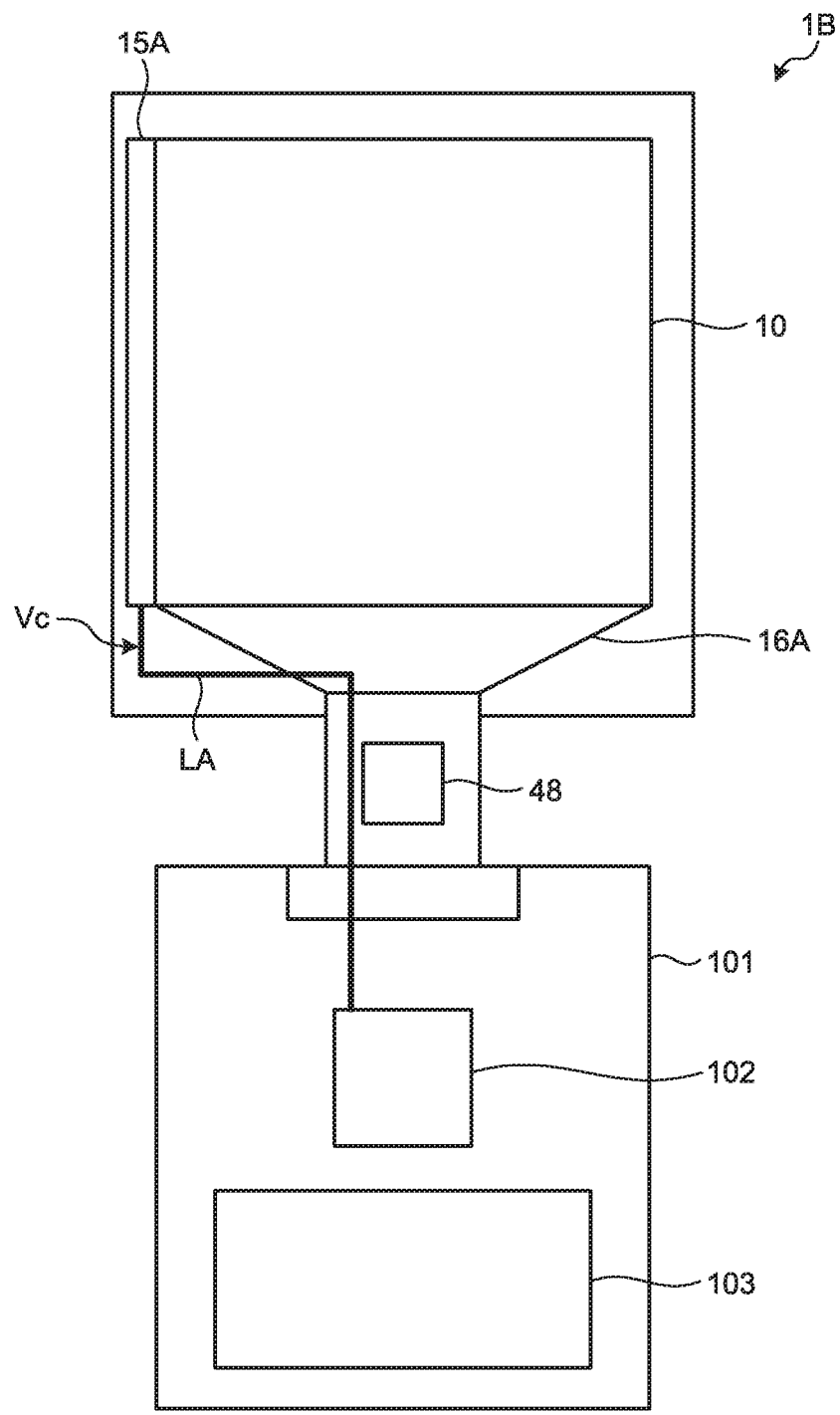
FIG. 33 is a plan view illustrating a detection device according to a fourth embodiment.
Figure 34:
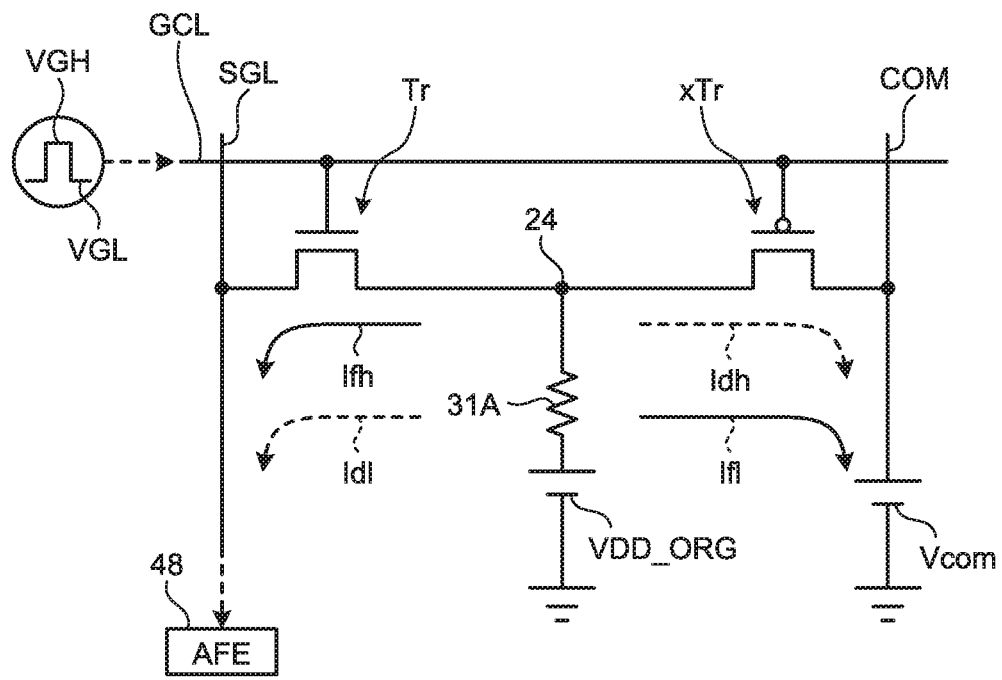
FIG. 34 is a circuit diagram illustrating a drive circuit in one detection region.

FIG. 33 is a plan view illustrating a detection device according to a fourth embodiment. FIG. 34 is a circuit diagram illustrating a drive circuit of one detection region. As illustrated in FIG. 33, this detection device 1B includes the sensor unit 10, the gate line drive circuit 15A, and a reset circuit 16A. The sensor unit 10 of the present embodiment is a temperature sensor configured to detect temperature. Similarly to the second embodiment, the gate line drive circuit 15A supplies the first gate drive signal VGH and the second gate drive signal VGL to gate lines GCL based on first selection signals Vc supplied from the control circuit 102. The reset circuit 16A is a circuit configured to reset each signal line SGL and an input unit of the AFE 48. In the present embodiment, the signal line selection circuit 16 is not provided. The detection device 1B only performs CDM drive by the gate line drive circuit 15A. In the present embodiment, the configurations of each detection electrode 24, the drive electrode 32, each first switching element Tr, each second switching element xTr, and the like are same as those in the first embodiment described above, and thus detailed description thereof will be omitted.

As illustrated in FIG. 34, in the detection device 1B of the present embodiment, the sensor unit 10 is a temperature sensor including an organic material layer 31A. Characteristics (for example, a resistance value) of the organic material layer 31A change in accordance with temperature. In FIG. 34, the organic material layer 31A is equivalent to a resistance element. Accordingly, the sensor unit 10 outputs a detection signal in accordance with temperature to the AFE 48. The organic material layer 31A may be made of, for example, material same as that in the first embodiment.

As illustrated in FIG. 34, the circuit configuration of the detection electrode 24, the first switching element Tr, the second switching element xTr, the signal line SGL, the gate line GCL, the reference signal line COM, and the like is same as that in the first embodiment. When the gate line drive circuit 15A supplies the first gate drive signal VGH to the gate line GCL, the first switching element Tr is turned on. Accordingly, the detection electrode 24 is selected as a detection target. The current Ifh flows in accordance with temperature from the detection electrode 24 to the signal line SGL. The second switching element xTr is turned off. Accordingly, the current Idh flowing from the detection electrode 24 to the reference signal line COM is stopped. In this manner, in the sensor unit 10, a signal (the current Ifh) output from the detection electrode 24 changes with the temperature of the organic material layer 31A. Accordingly, the detection device 1B can detect the temperature.

When the gate line drive circuit 15A supplies the second gate drive signal VGL to the gate line GCL, the first switching element Tr is turned off. Accordingly, the current Idl flowing from the detection electrode 24 to the signal line SGL is stopped, and the detection electrode 24 becomes a non-detection target. Simultaneously, the second switching element xTr is turned on. Accordingly, the current Ifl flows from the detection electrode 24 to the reference signal line COM. The reference signal line COM is supplied with the reference signal Vcom from the control substrate 101. Accordingly, variation in the potential of the detection electrode 24 as a non-detection target is reduced.

Figure 35:
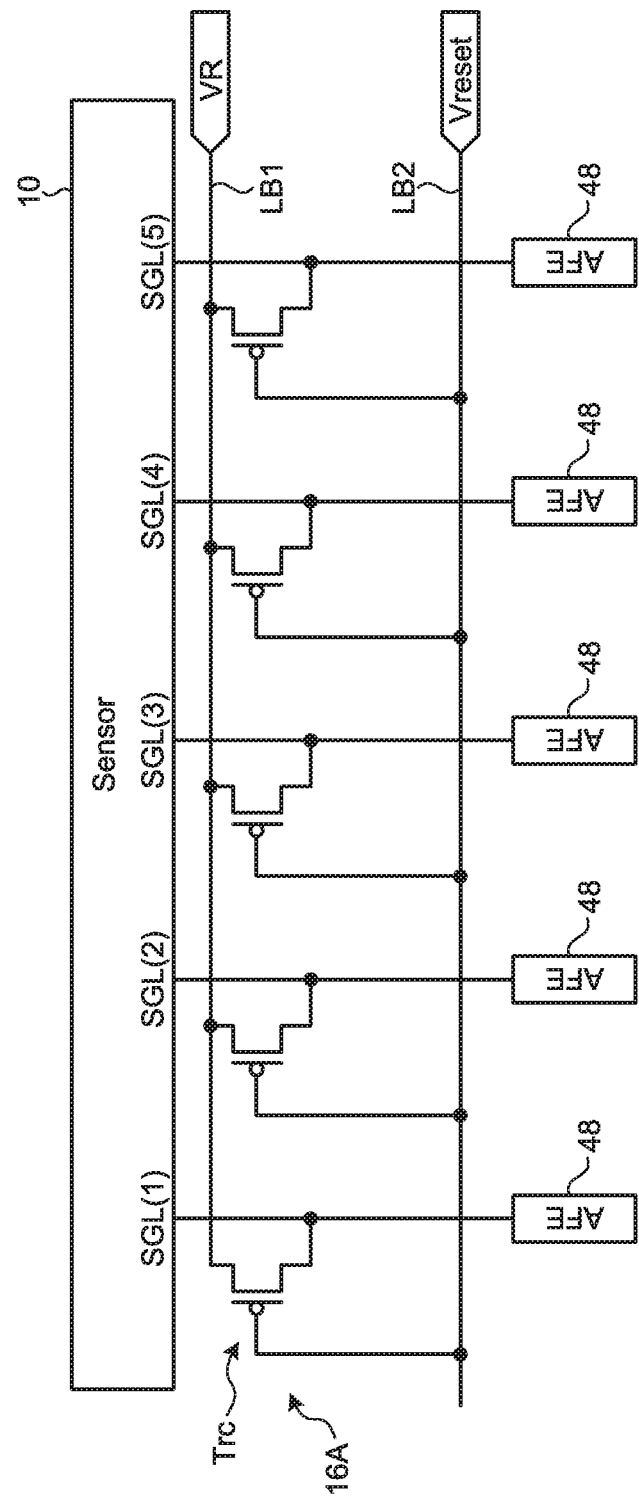
FIG. 35 is a circuit diagram illustrating a reset circuit.

FIG. 35 is a circuit diagram illustrating the reset circuit. As illustrated in FIG. 35, the reset circuit 16A includes a plurality of seventh switching elements Trc, a reference signal supply line LB1, and a reset signal supply line LB2. In the present embodiment, each signal line SGL is coupled with the corresponding AFE 48. Accordingly, CDM drive of the signal line SGL is not performed, and an output signal from the detection electrode 24 is output to the AFE 48 through the signal line SGL.

The seventh switching elements Trc are provided to the respective signal lines SGL. The seventh switching elements Trc are each achieved by, for example, a p-channel MOS TFT. The gates of the seventh switching elements Trc are coupled with the common reset signal supply line LB2. The sources of the seventh switching elements Trc are coupled with the common reference signal supply line LB1. The drains of the seventh switching elements Trc are coupled with the respective signal lines SGL.

When a reset signal Vreset has high-level voltage, the reference signal supply line LB1 is cut off from each signal line SGL. Accordingly, a detection signal from each detection electrode 24 is output to the AFE 48 through the corresponding signal line SGL. When the reset signal Vreset has low-level voltage, the reference signal supply line LB1 is coupled with each signal line SGL. In the present embodiment, all signal lines SGL are simultaneously coupled with the reference signal supply line LB1. Accordingly, the reference signal VR is supplied to each signal line SGL and the input unit of the corresponding AFE 48. Accordingly, each signal line SGL and the input unit of the corresponding AFE 48 are reset.

The reset signal Vreset having high-level voltage is supplied to the reset signal supply line LB2 at a timing after the control signal OE illustrated in FIG. 31 is supplied. In other words, a detection duration is a duration in which the reset signal Vreset having high-level voltage is supplied after the first selection signals Vc are sequentially held by the latch circuit 19.

Fifth Embodiment

Figure 36:
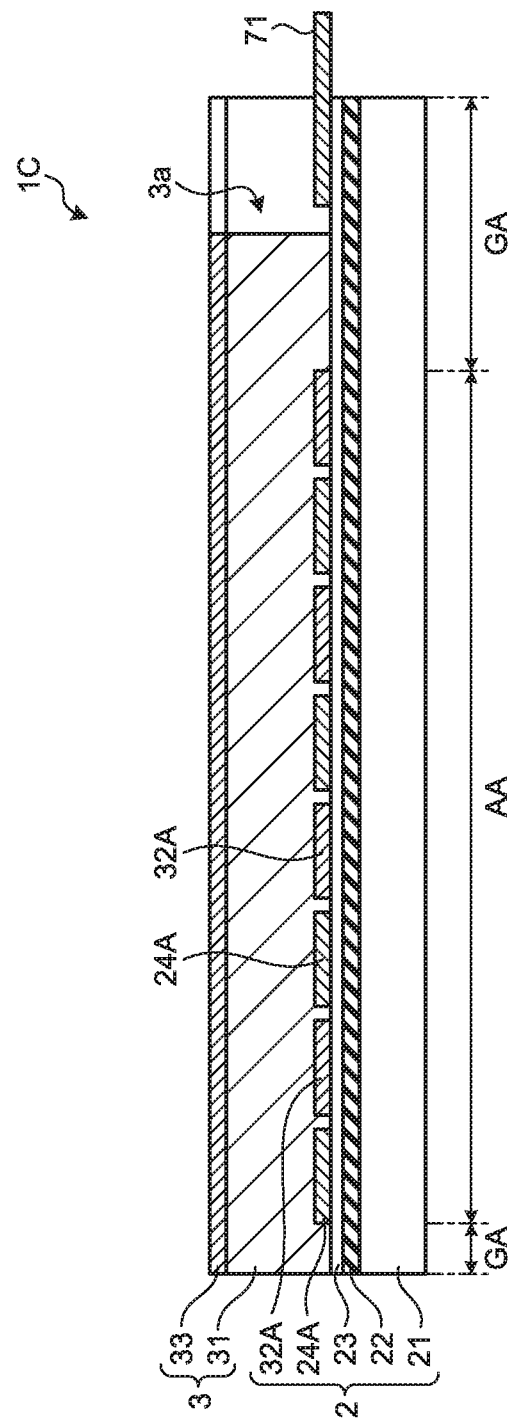
FIG. 36 is a cross-sectional view illustrating a schematic section configuration of a detection device according to a fifth embodiment.
Figure 37:
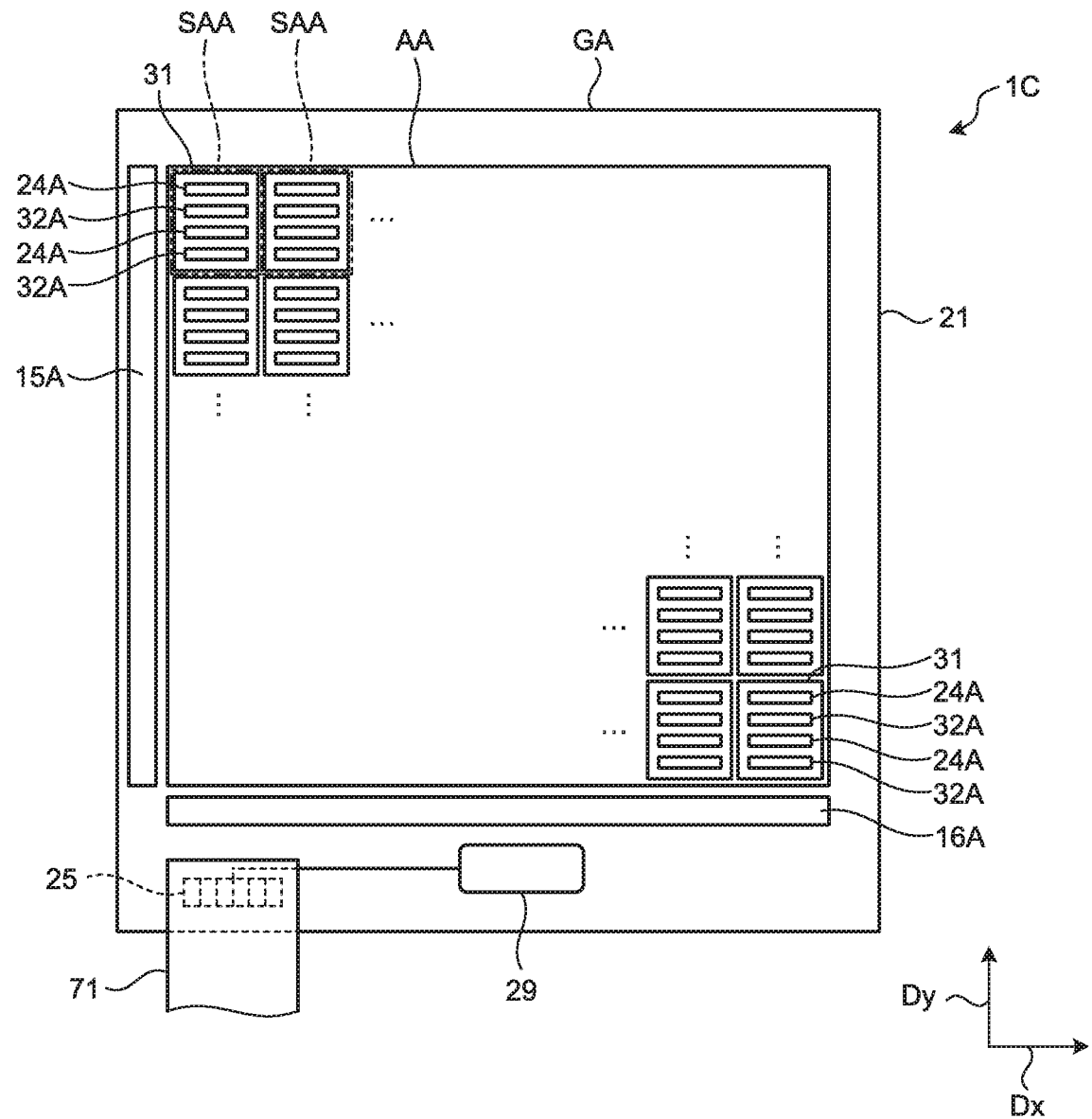
FIG. 37 is a plan view schematically illustrating the detection device according to the fifth embodiment.
Figure 38:
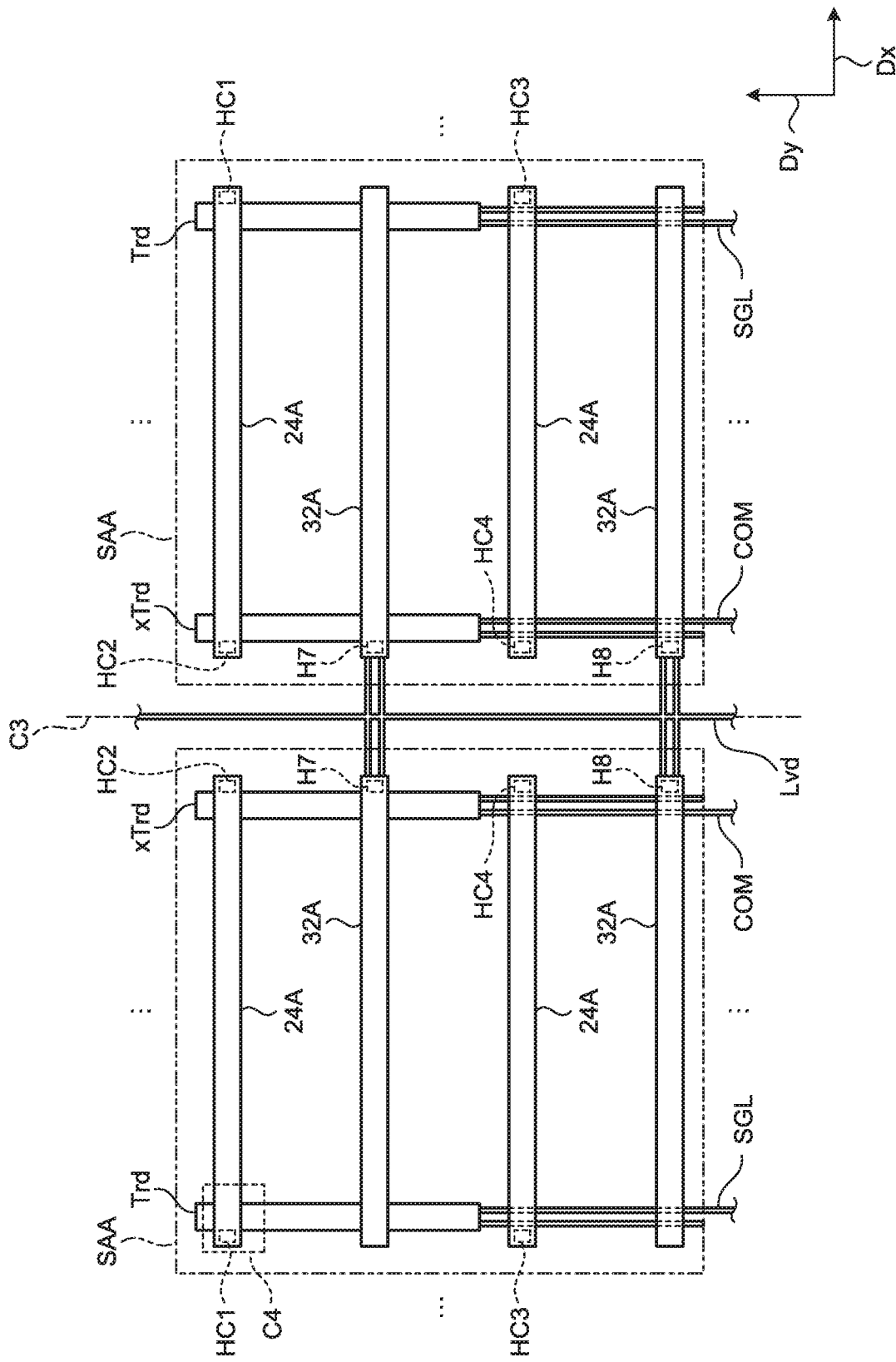
FIG. 38 is a plan view illustrating the relation among a detection electrode, a drive electrode, an eighth switching element, and a ninth switching element.
Figure 39:
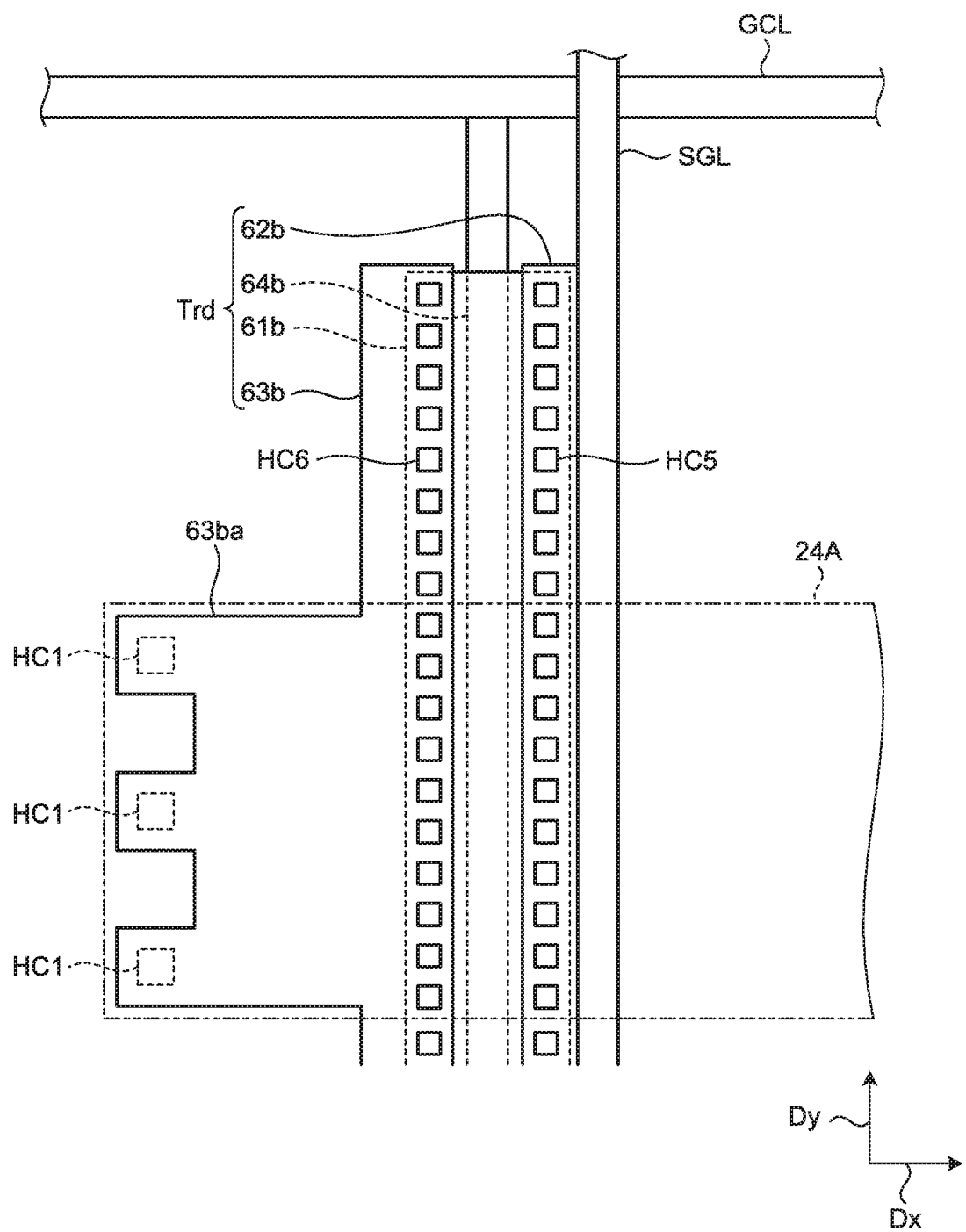
FIG. 39 is an enlarged plan view illustrating Region C4 in FIG. 38.

FIG. 36 is a cross-sectional view illustrating a schematic section configuration of a detection device according to a fifth embodiment. FIG. 37 is a plan view schematically illustrating the detection device according to the fifth embodiment. FIG. 38 is a plan view illustrating the relation among a detection electrode, a drive electrode, an eighth switching element, and a ninth switching element. FIG. 39 is an enlarged plan view illustrating Region C4 in FIG. 38.

A detection device 1C of the present embodiment is a temperature sensor as in the fourth embodiment. As illustrated in FIG. 36, the backplane 2 includes the substrate 21, the TFT layer 22, the insulating layer 23, a detection electrode 24A, and a drive electrode 32A. The TFT layer 22 includes circuits such as the gate line drive circuit 15A and the reset circuit 16A (refer to FIGS. 34 and 35). The TFT layer 22 also includes an eighth switching element Trd and a ninth switching element xTrd (refer to FIG. 38), and various wires such as a gate line GCL and a signal line SGL (refer to FIG. 7). In the present embodiment, the detection electrode 24A and the drive electrode 32A are provided on the same insulating layer 23. In other words, the drive electrode 32A is provided beside the detection electrode 24A in an identical layer. The detection electrode 24A and the drive electrode 32A are made of a translucent conductive material such as ITO. The drive electrode 32A is not limited thereto but may be made of a metallic material such as silver (Ag) or aluminum (Al).

The organic sensor layer 3 includes the organic material layer 31 and the protective layer 33. The organic material layer 31 is provided on a plurality of detection electrodes 24A and a plurality of drive electrodes 32A. The organic material layer 31 has a resistance component between each detection electrode 24A and the corresponding drive electrode 32A adjacent to each other.

As illustrated in FIG. 37, a plurality of partial detection regions SAA are disposed in a matrix having a row-column configuration in the entire detection region AA. Each partial detection region SAA includes the organic material layer 31, a plurality of detection electrodes 24A, and a plurality of drive electrodes 32A. The organic material layers 31 are separated for each partial detection regions SAA and provided in a matrix having a row-column configuration. The organic material layers 31 are patterned by, for example, photolithography.

The detection electrodes 24A and the drive electrodes 32A are alternately arrayed in the second direction Dy. The detection electrodes 24A are arrayed in the first direction Dx and the drive electrodes 32A are arrayed in the first direction Dx. Each partial detection regions SAA includes two detection electrodes 24A and two drive electrodes 32A. In other words, two detection electrodes 24A and two drive electrodes 32A are provided to overlap each organic material layer 31. FIG. 37 is merely exemplary, and three or more detection electrodes 24A and three or more drive electrodes 32A may be provided in each partial detection region SAA.

FIG. 38 illustrates two partial detection regions SAA adjacent to each other in the first direction Dx. In FIG. 38, the organic material layer 31 is omitted from illustration to simplify the drawing. As illustrated in FIG. 38, the two partial detection regions SAA have line symmetric configurations with Reference Line C3 as the axis of symmetry. Reference Line C3 is a virtual line extending in the second direction Dy between the partial detection regions SAA adjacent to each other in the first direction Dx. The following description will be made on the partial detection region SAA on the left side of Reference Line C3.

As illustrated in FIG. 38, the two detection electrodes 24A, the two drive electrodes 32A, the eighth switching element Trd, and the ninth switching element xTrd are provided in the partial detection region SAA. The detection electrodes 24A and the drive electrodes 32A are each shaped in a rectangle having longitudinal sides in the first direction Dx. The detection electrodes 24A and the drive electrodes 32A are alternately provided in the second direction Dy. The organic material layer 31 forms a resistance component between each detection electrode 24A and the corresponding drive electrode 32A adjacent to each other in the second direction Dy.

One end of each of the two detection electrodes 24A is coupled with the common eighth switching element Trd through contact holes HC1 and HC3. One end of each of the two detection electrodes 24A is coupled with a common signal line SGL through operation of the eighth switching element Trd. The other end of each of the two detection electrodes 24A is coupled with the common ninth switching element xTrd through contact holes HC2 and HC4. The other end of each of the two detection electrodes 24A is coupled with a common reference signal line COM through operation of the ninth switching element xTrd. Similarly, a plurality of detection electrodes 24A belonging to the other partial detection regions SAA arrayed in the second direction Dy are each coupled with a common signal line SGL and a common reference signal line COM.

The eighth switching element Trd is achieved by an n-channel MOS TFT in this example. The ninth switching element xTrd is achieved by a p-channel MOS TFT in this example.

FIG. 39 illustrates a coupling part between the one end of each detection electrode 24A and the eighth switching element Trd. The eighth switching element Trd includes a semiconductor layer 61b, a source electrode 62b, a drain electrode 63b, and a gate electrode 64b.

The gate electrode 64b is coupled with a gate line GCL and extends in the second direction Dy. In the present embodiment, the gate line GCL is provided for each of the partial detection regions SAA arrayed in the second direction Dy. The gate electrode 64b is provided beside a signal line SGL. The semiconductor layer 61b overlaps the gate electrode 64b. The width of the semiconductor layer 61b in the first direction Dx is larger than the width of the gate electrode 64b in the first direction Dx. One end (left end) of the semiconductor layer 61b is coupled with the drain electrode 63b through a plurality of contact holes HC6. The other end (right end) of the semiconductor layer 61b is coupled with the source electrode 62b through a plurality of contact holes HC5.

The drain electrode 63b and the source electrode 62b each extend in the second direction Dy. The width of the drain electrode 63b in the second direction Dy and the width of the source electrode 62b in the second direction Dy are each larger than the width of the second direction Dy in the detection electrode 24A. The contact holes HC6 and the contact holes HC5 are arrayed in the extending directions of the drain electrode 63b and the source electrode 62b, respectively.

A coupling unit 63ba of the drain electrode 63b is coupled with the detection electrode 24A through the contact holes HC1. The source electrode 62b is coupled with the signal line SGL. In other words, part of the signal line SGL functions as the source electrode 62b. The drain electrode 63b is coupled with a plurality of detection electrodes 24A belonging to the same partial detection region SAA (refer to FIG. 38).

The eighth switching element Trd is coupled with an interlayer through the contact hole HC1, the contact holes HC5, and the contact holes HC6. This configuration reduces coupling resistance of the eighth switching element Trd. Accordingly, the detection device 1C can achieve improved detection performance. The ninth switching element xTrd has the same configuration, and thus detailed description thereof will be omitted.

As illustrated in FIG. 38, the other end (right end) of each of the two drive electrodes 32A is coupled with a common drive signal supply line Lvd through a contact hole HC7 or HC8, respectively. One end (left end) of each of the two drive electrodes 32A is not coupled with any other wire or the like. The drive signal supply line Lvd extends in the second direction Dy between partial detection regions SAA adjacent to each other in the first direction Dx. The drive signal supply line Lvd is a wire through which the drive signal VDD_ORG (refer to FIG. 34) is supplied to the drive electrodes 32A. In the partial detection regions SAA adjacent to each other through the drive signal supply line Lvd, a plurality of (for example, four or more) drive electrodes 32A are coupled with the common drive signal supply line Lvd.

In the present embodiment as well, CDM drive by the gate line drive circuit 15A is performed. The gate line drive circuit 15A supplies the first gate drive signal VGH and the second gate drive signal VGL having potentials determined based on a predetermined code to gate lines GCL. Accordingly, detection electrodes 24A belonging to a plurality of partial detection regions SAA selected as detection targets are coupled with signal lines SGL. Detection electrodes 24A belonging to a plurality of partial detection regions SAA as non-detection targets are coupled with reference signal lines COM. The signal processor 44 can calculate a decoding signal for each partial detection region SAA by decoding a plurality of output signals.

Preferable embodiments of the present invention are described above, but the present invention is not limited to such embodiments. Contents disclosed in the embodiments are merely exemplary, and various kinds of modifications are possible without departing from the gist of the present invention. Any modification performed as appropriate without departing from the gist of the present invention belongs to the technical scope of the present invention.

For example, in the detection device 1B of the fourth embodiment and the detection device 1C of the fifth embodiment, the gate line drive circuit 15A includes no code generation circuit, but is not limited thereto. Similarly to the first embodiment, the detection devices 1B and 1C may include the gate line drive circuit 15 including a code generation circuit. In addition, similarly to the first embodiment, the detection devices 1B and 1C may include the signal line selection circuit 16.

What is claimed is:

1. A detection device comprising:
a substrate;
an organic material layer provided above the substrate at a position overlapping at least a detection region;
a plurality of detection electrodes provided between the substrate and the organic material layer in a direction orthogonal to the substrate;
a first switching element provided to each of the detection electrodes;
a plurality of gate lines coupled with the first switching elements and extending in a first direction;
a plurality of signal lines coupled with the first switching elements and extending in a second direction intersecting the first direction;
a drive circuit configured to supply gate drive signals having potentials determined for the respective gate lines based on a predetermined code to the respective first switching elements through the gate lines;
an analog front-end circuit configured to receive signals output from the detection electrodes; and
a signal line selection circuit provided to the substrate, wherein
the signal line selection circuit couples one of the signal lines that is a det4ection target with the analog front-end circuit based on another predetermined code.

2. The detection device according to claim 1, wherein a first detection electrode block including an array of the detection electrodes in the first direction is coupled with the drive circuit through one of the gate lines that is common to the array.

3. The detection device according to claim 1, further comprising a code generation circuit configured to generate selection signals having phases determined for the respective gate lines based on the predetermined code, wherein the drive circuit generates the gate drive signals based on the selection signals.

4. The detection device according to claim 3, wherein
the substrate includes a detection region in which the detection electrodes are provided and a frame region outside the detection region, and
the drive circuit includes the code generation circuit and is provided in the frame region of the substrate.

5. The detection device according to claim 3, further comprising a control substrate different from the substrate, wherein the code generation circuit is provided to the control substrate.

6. The detection device according to claim 1, wherein a second detection electrode block including an array of the detection electrodes in the second direction is coupled with the signal line selection circuit through one of the signal lines that is common to the array.

7. The detection device according to claim 1, further comprising a plurality of drive electrodes provided in a layer in which the detection electrodes are provided.

8. The detection device according to claim 7, each of the detection electrodes is an anode and each drive electrode is a cathode.

9. The detection device according to claim 1, further comprising a drive electrode provided opposite to the detection electrodes through the organic material layer.

10. The detection device according to claim 9, further comprising a coupling terminal provided in a frame region of the substrate, wherein
the organic material layer is provided with an opening at a position overlapping the coupling terminal, and
the drive electrode is coupled with the coupling terminal through the opening.

11. The detection device according to claim 1, wherein signals output from the detection electrodes change with the light quantity of light incident on the organic material layer.

12. The detection device according to claim 1, wherein signals output from the detection electrodes change with the temperature of the organic material layer.

13. A detection device comprising:
a substrate;
an organic material layer provided above the substrate at a position overlapping at least a detection region;
a plurality of detection electrodes provided between the substrate and the organic material layer in a direction orthogonal to the substrate;
a first switching element provided to each of the detection electrodes;
a plurality of gate lines coupled with the first switching elements and extending in a first direction;
a plurality of signal lines coupled with the first switching elements and extending in a second direction intersecting the first direction; and
a drive circuit configured to supply gate drive signals having potentials determined for the respective gate lines based on a predetermined code to the respective first switching elements through the gate lines,
wherein
each of the detection electrodes includes the first switching element and a second switching element different from the first switching element,
the first switching element and the second switching element are supplied with the same gate drive signal from the drive circuit through one of the gate lines that is common to the switching elements,
the first switching element couples one of the detection electrodes that is a detection target with a corresponding one of the signal lines,
the second switching element couples one of the detection electrodes that is a non-detection target with a reference signal line, and
a reference signal having a fixed potential is supplied to the detection electrode as the non-detection target through the reference signal line.

14. The detection device according to claim 13, wherein
the reference signal line is provided between two of the detection electrodes adjacent to each other in the first direction, and
the two detection electrodes adjacent to each other in the first direction are coupled with the reference signal line, which is common to the detection electrodes, through the second switching elements provided to the respective detection electrodes.

15. A detection device comprising:
a substrate;
an organic material layer provided above the substrate at a position overlapping at least a detection region;
a plurality of detection electrodes provided between the substrate and the organic material layer in a direction orthogonal to the substrate;
a first switching element provided to each of the detection electrodes;
a plurality of gate lines coupled with the first switching elements and extending in a first direction;
a plurality of signal lines coupled with the first switching elements and extending in a second direction intersecting the first direction;
a drive circuit configured to supply gate drive signals having potentials determined for the respective gate lines based on a predetermined code to the respective first switching elements through the gate lines; and
a plurality of drive electrodes provided in a layer in which the detection electrodes are provided,
wherein
each of the detection electrodes is a cathode and each drive electrode is an anode, and
each of the signal lines is coupled with an inverting circuit configured to invert and output current flowing through the signal lines.

* * * * *